(12) United States Patent  
Lippmann et al.

(10) Patent No.: US 7,937,678 B2
(45) Date of Patent: May 3, 2011

(54) SYSTEM AND METHOD FOR INTEGRATED CIRCUIT PLANAR NETLIST INTERPRETATION

(75) Inventors: Bernhard Lippmann, Landshut (DE); Andreas Junghanns, Falkensee (DE)

(73) Assignee: Infineon Technologies AG, Neubiberg (DE)

( * ) Notice: Subject to any disclaimer, the term of this patent is extended or adjusted under 35 U.S.C. 154(b) by 414 days.

(21) Appl. No.: 12/137,298

(22) Filed: Jun. 11, 2008

(65) Prior Publication Data

US 2009/0313596 A1 Dec. 17, 2009

(51) Int. Cl.
*G06F 9/45* (2006.01)
(52) U.S. Cl. ........................................................ 716/103
(58) Field of Classification Search .................... 716/103
See application file for complete search history.

(56) References Cited

U.S. PATENT DOCUMENTS

| | | | |
|---|---|---|---|
| 5,086,477 A | 2/1992 | Yu et al. | |
| 5,751,596 A | 5/1998 | Ginetti et al. | |
| 6,288,393 B1 | 9/2001 | Phaneuf et al. | |
| 6,289,116 B1 | 9/2001 | Chamberlain et al. | |
| 6,536,018 B1 | 3/2003 | Chisholm et al. | |
| 6,549,222 B1 | 4/2003 | Skoll | |
| 6,671,424 B1 | 12/2003 | Skoll et al. | |
| 6,684,379 B2 | 1/2004 | Skoll et al. | |
| 6,738,957 B2 | 5/2004 | Gont et al. | |
| 6,907,583 B2 | 6/2005 | Abt et al. | |
| 6,961,916 B2 * | 11/2005 | Sarrafzadeh et al. | 716/123 |
| 7,013,028 B2 | 3/2006 | Gont et al. | |
| 7,020,853 B2 | 3/2006 | Skoll et al. | |
| 7,503,021 B2 * | 3/2009 | Boucher et al. | 716/136 |
| 7,526,745 B2 * | 4/2009 | Vergara-Escobar | 716/102 |
| 2001/0001881 A1 * | 5/2001 | Mohan et al. | 716/1 |
| 2002/0138816 A1 * | 9/2002 | Sarrafzadeh et al. | 716/11 |
| 2005/0278667 A1 * | 12/2005 | Boucher et al. | 716/4 |
| 2008/0282206 A1 * | 11/2008 | Anderson et al. | 716/1 |
| 2008/0282208 A1 * | 11/2008 | Anderson et al. | 716/4 |
| 2009/0158235 A1 * | 6/2009 | Ghica | 716/18 |

OTHER PUBLICATIONS

Lester, A., "Abstraction Fonctionnelle des Circuits Nomériques VLSI Avec une méthode formelle basée sur une extraction de réseau de portes," http://www=ftp.lip6.fr/lip6./reports/2000/lip6.2000.003.pdf., Dec. 21, 1999, pp. 1-175.
Avery, L.R., et al., "Reverse Engineering Complex Application-Specific Integrated Circuits (ASICs)," Mar. 27, 2002, 6 pages.
Blythe, S., et al., "Layout Reconstruction of Complex Silicon Chips," IEEE Journal of Solid-State Circuits, vol. 28, No. 2, Feb. 1993, pp. 138-145.
Kumagai, J., "Chip detectives," IEEE Spectrum, Nov. 2000, pp. 43-48.
Bourbakis, N. G. et al., "A Knowledge-Based System for Automatic Visual VLSI Reverse-Engineering: VLSI Layout Version," IEEE Transactions on Systems, Man, and Cybernetics-Part A: Systems and Humans, vol. 32, No. 3, May 2002, pp. 428-436.
Kim, W., et al., "Hierarchy Restructuring for Hierarchical LVS Comparison," VLSI Design 1999, vol. 10, No. 1, pp. 117-125.

(Continued)

*Primary Examiner* — Stacy A Whitmore
(74) *Attorney, Agent, or Firm* — Slater & Matsil, L.L.P.

(57) ABSTRACT

Systems and methods for integrated circuit planar netlist interpretation are disclosed. In one embodiment, higher abstraction level descriptions of an integrated circuit are generated from a planar netlist and layout data of the integrated circuit. Various embodiments may derive the higher abstraction levels through, for example, netlist compression and netlist partitioning. Other embodiments may derive the higher abstraction levels using, for example, device and module hypothesis search functions based on device properties and design constraints derived from netlist and layout data.

27 Claims, 33 Drawing Sheets

OTHER PUBLICATIONS

Yang, L., et al., "Frosty: A Fast Hierarchy Extractor for Industrial CMOS Circuits," International Conference on Computer Aided Design, Nov. 11-13, 2003, pp. 741-746.

Christmas, W.J., et al., "Structural Matching in Computer Vision Using Probalistic Relaxation," IEEE Transactions on Pattern Analysis and Machine Intelligence, vol. 17, No. 8, Aug. 1995, pp. 749-764.

Ullmann, J.R., "An Algorithm for Subgraph Isomorphism," Journal of the Association for Computing Machinery, vol. 23, No. 1, Jan. 1976, pp. 31-42.

Rubanov, N., "SubIslands: The Probabilistic Match Assignment Algorithm for Subcircuit Recognition," IEEE Transactions on Computer-Aided Design of Integrated Circuits and Systems, vol. 22, No. 1, Jan. 2003, pp. 26-38.

Richaud, N., "Netlist Abstraction Tool for Reverse-Engineering by Infineon," Diploma Thesis, Dec. 18, 2007, pp. 1-79.

Darbinyan, N., "Image Acquisition and Extraction for Reverse Engineering on Integrated Circuit," Diploma Thesis, Dec. 2005, pp. 1-55.

Velázquez, A.M., "Metodología de Ingeniería Inversa Para Circuitos Integrados y Aplicación Para Un Circuito RFID," Diploma Thesis, Mar. 2006, 184 pages.

Ohlrich, M., et al., "*SubGemini*: Indentifying SubCircuits using a Fast Subgraph Isomorphism Algorithm," In Proceedings of the $30^{th}$ IEEE/ACM Design Automation Conference, Jun. 1993, pp. 31-37.

Ebeling, C., et al., "Validating VLSI Circuit Layout by Wirelist Comparison," in Proceedings of the IEEE International Conference on Computer Aided Design, Sep. 1983, pp. 172-173.

Tan, K.H., "Exploring EDA Algorithms with the Boost Graph Library," http://www.ddj.com/cpp/184401676, Jul. 1, 2003, 5 pages.

Ebeling, C., "GeminiII: A Second Generation Layout Validation Program," in Proceedings of the IEEE International Conference on Computer Aided Design, Nov. 1988, pp. 322-325.

Masalskis, G., et al., "Reverse Engineering of CMOS Integrated Circuits," Electronics and Electrical Engineering, ISSN 1392-1215, 2008, pp. 25-28.

\* cited by examiner

250

XML NETLIST FILE PORTION – NAND ELEMENT

```xml
<?xml version="1.0" encoding="Windows-1252"?>
<MyRoot>
  <AtomicElements> <!-- This is the xml file of an NAND: /(A+B)=(/A).(/B)=Z --> <!-- A=id:5, B=id:6,
                       Z=id:11, net25=id:5, Vdd=id:20, Vss=id:5 -->
    <AtomicElement>
      <ObjectID>1</ObjectID>
      <ObjectName>ptrans37</ObjectName>
      <ObjectType>mp</ObjectType>
      <PinList> <!-- Modification. Need just ID!! -->
        <PIN1>11</PIN1> <!-- Drain --> <!-- Modification. Z is id11!! -->
        <PIN2>5</PIN2>  <!-- Gate  --> <!-- A -->
        <PIN3>20</PIN3> <!-- Source --> <!-- Modification. vdd! is id20!! -->
        <PIN4>20</PIN4> <!-- Bulk -->
      </PinList>
      <GeometricalInformation>
        <Layer />
        <BoundingBox_Lowerleft> <!-- Modification for x and y -->
          <X>0</X>
          <Y>0</Y>
        </BoundingBox_Lowerleft>
        <BoundingBox_UpperRight>
          <X>0</X>
          <Y>0</Y>
        </BoundingBox_UpperRight>
        <NextHigherAssembly />
      </GeometricalInformation>
      <Parameter>
        <SpiceModelParameterString>w=3u l=800n as=(3u)*0.7u+1.2u*1.2u
          \ad=(3u)*0.7u+1.2u*1.2u m=1 region=triode stacks=contact
          \stackd=contact</SpiceModelParameterString>
      </Parameter>
      <Remarks_Labels>
        <Label>remarks and labels section</Label>
        <TimeStamp>XX:XX:XX</TimeStamp>
        <DateStamp>XX.XX.XXXX</DateStamp>
      </Remarks_Labels>
    </AtomicElement>
```

*FIG. 11C*

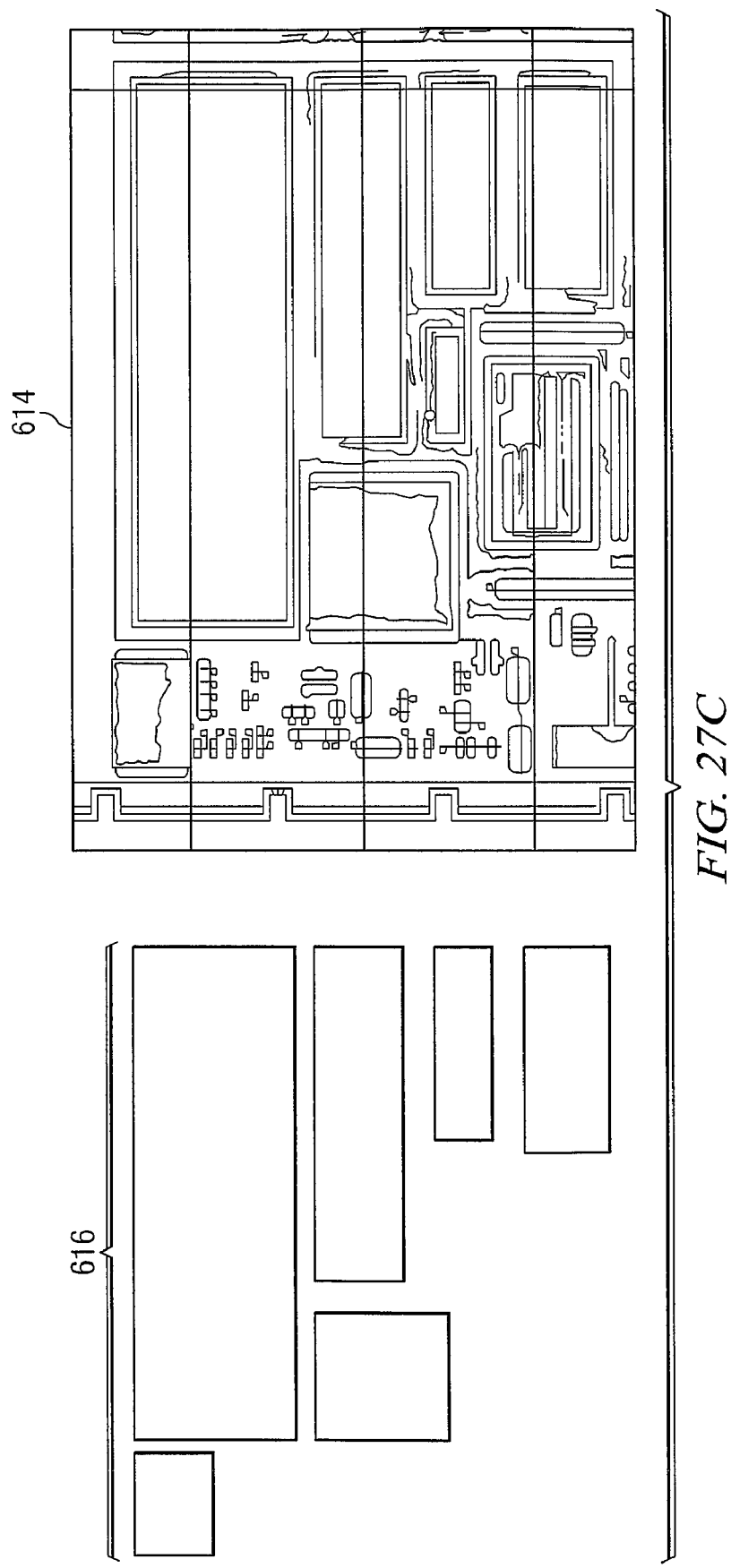

SYSTEM AND METHOD FOR INTEGRATED CIRCUIT PLANAR NETLIST INTERPRETATION

TECHNICAL FIELD

This invention relates generally to electronic devices and methods, and more particularly to systems and methods for planar netlist interpretation, as used in, for example, reverse engineering or design verification of integrated circuits.

BACKGROUND

Integrated circuits are widely used in many electronic and other applications. An integrated circuit typically comprises many interconnected semiconductor devices, such as transistors, that are formed on a semiconductor wafer by depositing various types of materials on the semiconductor wafer, and patterning the thin films of material to form the devices and their connections. The design of an integrated circuit may include determining its functionality, schematics, modeling, material selection, and layout.

After an integrated circuit has been designed, design verification may be performed to determine whether the circuit design meets its specifications and performs as intended. The design verification phase may utilize the information available from any stage of the design process. For example, design verification may extract information from a graphic data system (GDS) database, from a planar netlist, or from higher level descriptions of the design that are generated during the design process. For example, design verification may involve extracting circuit information from a GDS database and generating a netlist based on the extracted information. This netlist may be compared to the original netlist generated by the design process. Generally, design verification is performed on a chip for which substantial relevant information about the design generally is available and known from the design process.

In contrast to the design and verification of an integrated circuit, the reverse engineering of an integrated circuit generally involves analyzing an existing physical chip to determine one or more otherwise unknown aspects of the integrated circuit, such as its materials, layout, schematics, and functionality. Generally, to reconstruct the circuitry of a chip, the individual layers are opened up and displayed with suitable image-rendering processes. The components and their connections are then analyzed, generally with software support. The results of this analysis are stored in a netlist format (e.g., PSPICE), which generally is the starting point for further steps in the reverse engineering analysis, such as determining the integrated circuit's schematics and functionality.

Reverse engineering may be useful, for example, to determine the structures, processes, materials, and designs used by a competitor in manufacturing its integrated circuits. Furthermore, the information obtained from reverse engineering may be used by another entity to determine whether an integrated circuit potentially infringes one or more patents owned by the entity or a third party. Reverse engineering and patent infringement analysis, however, generally are very complex tasks that can take significant time and incur large costs. One factor that increases the complexity of the reverse engineering task is that detailed information about the integrated circuit is determined primarily from the physical chip, without access to the information generated by the design process. Thus, what are needed in the art are cost-effective systems and methods for determining different aspects or properties of an integrated circuit, such as its layout, netlists, schematics, and functionality, from the physical integrated circuit itself.

SUMMARY OF THE INVENTION

These and other problems are generally solved or circumvented, and technical advantages are generally achieved, by embodiments of the present invention.

In one embodiment, a method for planar netlist interpretation of an integrated circuit comprises reading the planar netlist of the integrated circuit from a first computer-readable medium, wherein the planar netlist comprises atomic elements of the integrated circuit and nodes between the atomic elements, converting the planar netlist into a graphical description, wherein graph vertices represent the atomic elements, the nodes, or both, and wherein graph edges represent the nodes, the atomic elements, or connections between the atomic elements and the nodes, respectively, identifying combinations of the vertices and edges that match library device elements, substituting the device elements for the respective combinations of the vertices and edges, generating a compressed netlist comprising the device elements and nodes between the device elements, and storing the compressed netlist in a second computer-readable medium.

In another embodiment, a method for planar netlist interpretation of an integrated circuit comprises reading the planar netlist of the integrated circuit from a first computer-readable medium, wherein the planar netlist comprises atomic elements of the integrated circuit and nodes between the atomic elements, converting the planar netlist into a graphical representation, wherein graph vertices represent the atomic elements, the nodes, or both, and wherein graph edges represent the nodes, the atomic elements, or connections between the atomic elements and the nodes, respectively, locating one or more popular nodes in the graphical representation, partitioning the graph into blocks at the one or more popular nodes, generating a hierarchical netlist comprising the blocks connected by the one or more popular nodes, and storing the hierarchical netlist in a second computer-readable medium.

In another embodiment, a method for planar netlist interpretation of an integrated circuit comprises reading images of successive layers of the integrated circuit from a first computer-readable medium, reading the planar netlist of the integrated circuit from the first computer-readable medium, wherein the planar netlist comprises atomic elements of the integrated circuit and nodes between the atomic elements, extracting layout information from the images, generating an extended parameter netlist from the planar netlist and the layout information, executing hypothesis searches of the extended parameter netlist to locate non-atomic devices, circuits and interconnections, generating a hierarchical netlist comprising the non-atomic devices, circuits and interconnections, and storing the hierarchical netlist in a second computer-readable medium.

In another embodiment, a computer program product for performing integrated circuit planar netlist interpretation, having a medium with a computer program embodied thereon, comprises computer program code for reading the planar netlist of the integrated circuit from a first computer-readable medium, wherein the planar netlist comprises atomic elements of the integrated circuit and nodes between the atomic elements, computer program code for converting the planar netlist into a graphical description, wherein graph vertices represent the atomic elements, the nodes, or both, and wherein graph edges represent the nodes, the atomic elements, or connections between the atomic elements and the nodes, respectively, computer program code for identifying combinations of the vertices and edges that match library device elements, computer program code for substituting the device elements for the respective combinations of the vertices and edges, computer program code for generating a compressed netlist comprising the device elements and nodes between the device elements, and computer program code for storing the compressed netlist in a second computer-readable medium.

In another embodiment, a computer system comprises memory for storing programs, the programs including sequences of instructions, a data processing unit for executing the programs stored in the memory, wherein one of the programs stored in the memory is an integrated circuit planar netlist interpretation program, the integrated circuit planar netlist interpretation program including instructions for reading the planar netlist of the integrated circuit from a first computer-readable medium, wherein the planar netlist comprises atomic elements of the integrated circuit and nodes between the atomic elements, instructions for converting the planar netlist into a graphical description, wherein graph vertices represent the atomic elements, the nodes, or both, and wherein graph edges represent the nodes, the atomic elements, or connections between the atomic elements and the nodes, respectively, instructions for identifying combinations of the vertices and edges that match library device elements, instructions for substituting the device elements for the respective combinations of the vertices and edges, instructions for generating a compressed netlist comprising the device elements and nodes between the device elements, and instructions for storing the compressed netlist in a second computer-readable medium.

In another embodiment, a computer program product for performing integrated circuit planar netlist interpretation, having a medium with a computer program embodied thereon, comprises computer program code for reading the planar netlist of the integrated circuit from a first computer-readable medium, wherein the planar netlist comprises atomic elements of the integrated circuit and nodes between the atomic elements, computer program code for converting the planar netlist into a graphical representation, wherein graph vertices represent the atomic elements, the nodes, or both, and wherein graph edges represent the nodes, the atomic elements, or connections between the atomic elements and the nodes, respectively, computer program code for locating one or more popular nodes in the graphical representation, computer program code for partitioning the graph into blocks at the one or more popular nodes, computer program code for generating a hierarchical netlist comprising the blocks connected by the one or more popular nodes, and computer program code for storing the hierarchical netlist in a second computer-readable medium.

In another embodiment, a computer system comprises memory for storing programs, the programs including sequences of instructions, a data processing unit for executing the programs stored in the memory, wherein one of the programs stored in the memory is an integrated circuit planar netlist interpretation program, the integrated circuit planar netlist interpretation program including instructions for reading the planar netlist of the integrated circuit from a first computer-readable medium, wherein the planar netlist comprises atomic elements of the integrated circuit and nodes between the atomic elements, instructions for converting the planar netlist into a graphical representation, wherein graph vertices represent the atomic elements, the nodes, or both, and wherein graph edges represent the nodes, the atomic elements, or connections between the atomic elements and the nodes, respectively, instructions for locating one or more popular nodes in the graphical representation, instructions for partitioning the graph into blocks at the one or more popular nodes, instructions for generating a hierarchical netlist comprising the blocks connected by the one or more popular nodes, and instructions for storing the hierarchical netlist in a second computer-readable medium.

In another embodiment, a computer program product for performing integrated circuit planar netlist interpretation, having a medium with a computer program embodied thereon, comprises computer program code for reading the planar netlist of the integrated circuit in a first computer-readable medium, wherein the planar netlist comprises atomic elements of the integrated circuit and nodes between the atomic elements, computer program code for extracting layout information from the images, generating an extended parameter netlist from the planar netlist and the layout information, computer program code for executing hypothesis searches of the extended parameter netlist to locate non-atomic devices, circuits and interconnections, computer program code for generating a hierarchical netlist comprising the non-atomic devices, circuits and interconnections, and computer program code for storing the hierarchical netlist in a second computer-readable medium.

In another embodiment, a computer system comprises memory for storing programs, the programs including sequences of instructions, a data processing unit for executing the programs stored in the memory, wherein one of the programs stored in the memory is an integrated circuit planar netlist interpretation program, the integrated circuit planar netlist interpretation program including instructions for reading the planar netlist of the integrated circuit from a first computer-readable medium, wherein the planar netlist comprises atomic elements of the integrated circuit and connections between the atomic elements, instructions for extracting layout information from the images, instructions for generating an extended parameter netlist from the planar netlist and the layout information, instructions for executing hypothesis searches of the extended parameter netlist to locate non-atomic devices, circuits and interconnections, instructions for generating a hierarchical netlist comprising the non-atomic devices, circuits and interconnections, and instructions for storing the hierarchical netlist in a second computer-readable medium.

The foregoing has outlined rather broadly an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 11A-11C are diagrams of portions of token-based object oriented netlist descriptions;

FIGS. 27A-27L are graphical representations of various circuit elements, connections and frames of integrated circuit elements;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely systems and methods for planar netlist interpretation in the reverse engineering of semiconductor-based integrated circuits (ICs). The invention also may be applied, however, to other types of integrated circuits and electronics, such as printed circuit boards, organic electronics, nanotechnology devices, microelectromechanical devices, and so forth. Furthermore, the invention also may be applied to other applications that may benefit from planar netlist interpretation, such as circuit design verification.

In conventional integrated circuit reverse engineering, the increasing complexity of integrated circuits is causing increased difficulty in interpreting the netlists derived from circuit extraction. Generally, an experienced circuit designer uses expert know-how to analyze a planar netlist to recognize a hierarchical structure, functional blocks and library elements, and to transform the netlist with these new elements to a high-level abstract language (for example, VHDL) or to generate a schematic view of the abstract netlist. This process may be performed completely manually or with limited tool support, all at significant cost.

In addition, the process also is prone to errors because of the extent of the manual effort involved. Thus, even after a significant expenditure of time and money, the functional interpretation of circuit blocks may not reflect the function in the actual chip. For example, related components may not be represented in positions corresponding to their actual relationship.

Various embodiments of the invention avoid the problems of the prior art by interpreting netlists extracted from a physical integrated circuit using a computational methodology to transform the initial data record to a higher abstraction level. The computational methodology may include graphical methods, artificial intelligence methods, or both. In various embodiments, netlists are automatically interpreted to group components into function blocks, determine a hierarchical structure between the function blocks, and compress data records in library elements. Furthermore, various embodiments may include comparison of the claims of a patent against the hierarchical netlist obtained from the circuit extraction to determine infringement potential.

Figure 1:
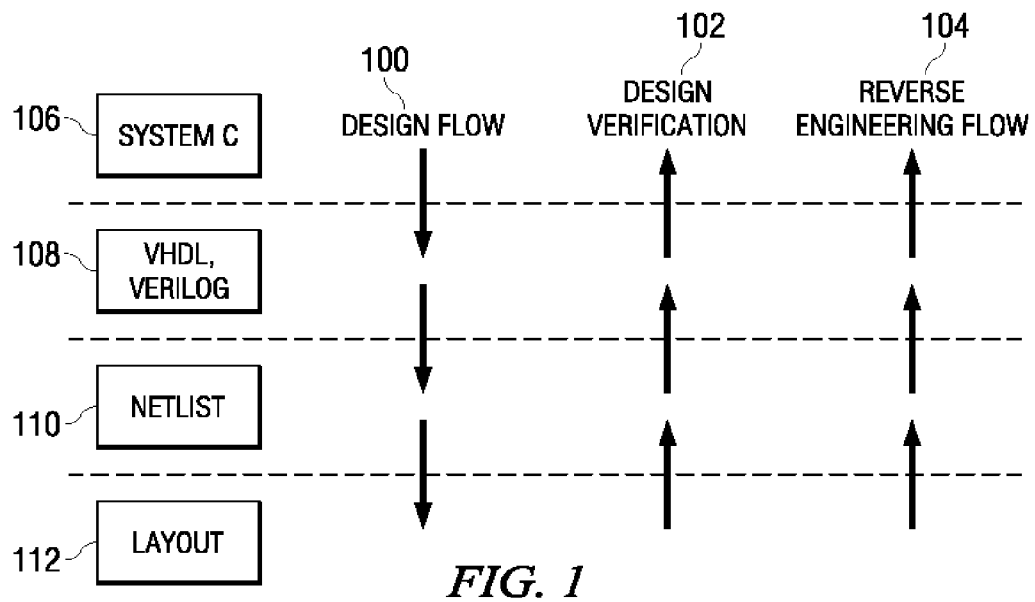
FIG. 1 is a flow diagram comparing integrated circuit reverse engineering with design and verification.

FIG. 1 illustrates a comparison of integrated circuit design flow 100, design verification flow 102 and reverse engineering flow 104. With integrated circuit design, a designer determines the high level functionality and architecture for an integrated circuit. The designer may then use one or more hardware description languages (HDLs) to formally describe the integrated circuit's design, organization and operation. An HDL generally describes the spatial organization and temporal behavior of an integrated circuit. By describing timing and spatial relationships, an HDL may model multiple independent parallel processes, which are typical of the functionality of electronic hardware.

As an example, the designer may generate a system-level functional description of the chip using a system HDL such as SpecC or SystemC 106. From this high level of abstraction, the designer may then generate a lower hierarchy description of the integrated circuit using a circuit modeling HDL or register-transfer level (RTL) HDL such as Verilog or VHSIC HDL (VHDL) 108. Based on this abstraction level, the designer may then generate a netlist description 110 of the integrated circuit, which describes the low level connectivity of each component or device in the integrated circuit. A netlist may be stored in a particular format such as a gate-level netlist in Electronic Design Interchange Format (EDIF) or as a transistor-level netlist. Definitions of the devices in the circuit describe the input/output pins or ports and properties of the devices. Each occurrence of a device in a circuit is an instance, and the devices are interconnected with nets. A netlist may be implemented with various levels of hierarchy. A planar netlist generally contains only atomic elements, primitives or low-level instances that do not themselves include instances. A hierarchical netlist generally has higher-level instances that include lower-level instances within their definitions.

In the integrated circuit design process, the connectivity and instance or net attribute information in a netlist may be used to generate a physical layout 112 of the integrated circuit. As an example, the layout may be stored in a graphic data system (GDS) database format such as GDSII. The GDS layout data generally describes the integrated circuit as planar geometric shapes, text labels, etc., in hierarchical form, assigned to layer, data and text types, suitable for manufacturing of the integrated circuit. The GDS layout information may be provided to an IC foundry for fabrication of the physical integrated circuit.

Design verification 102 generally flows in a path opposite to that of design 100. Design verification utilizes the information available from the design flow and may be performed during each step of a design or across multiple steps of the design process. For example, design verification may involve extracting circuit information from a layout 112 by determining the components and their interconnections implemented in the layout, and generating a netlist 110 based on the extracted information. This then may be compared to the netlist generated by the design process flow 100.

Design verification may involve converting a netlist back into a circuit model HDL 108, utilizing HDL library element information available from the design process. Similarly, design verification may involve converting a circuit model HDL 108 into a system HDL 106, again utilizing system HDL library element information available from the design process. In the various steps, design verification may include modeling and simulating the circuit, for example by executing a Simulation Program with Integrated Circuit Emphasis (SPICE) program based on the netlist description of the circuit.

Figure 2:
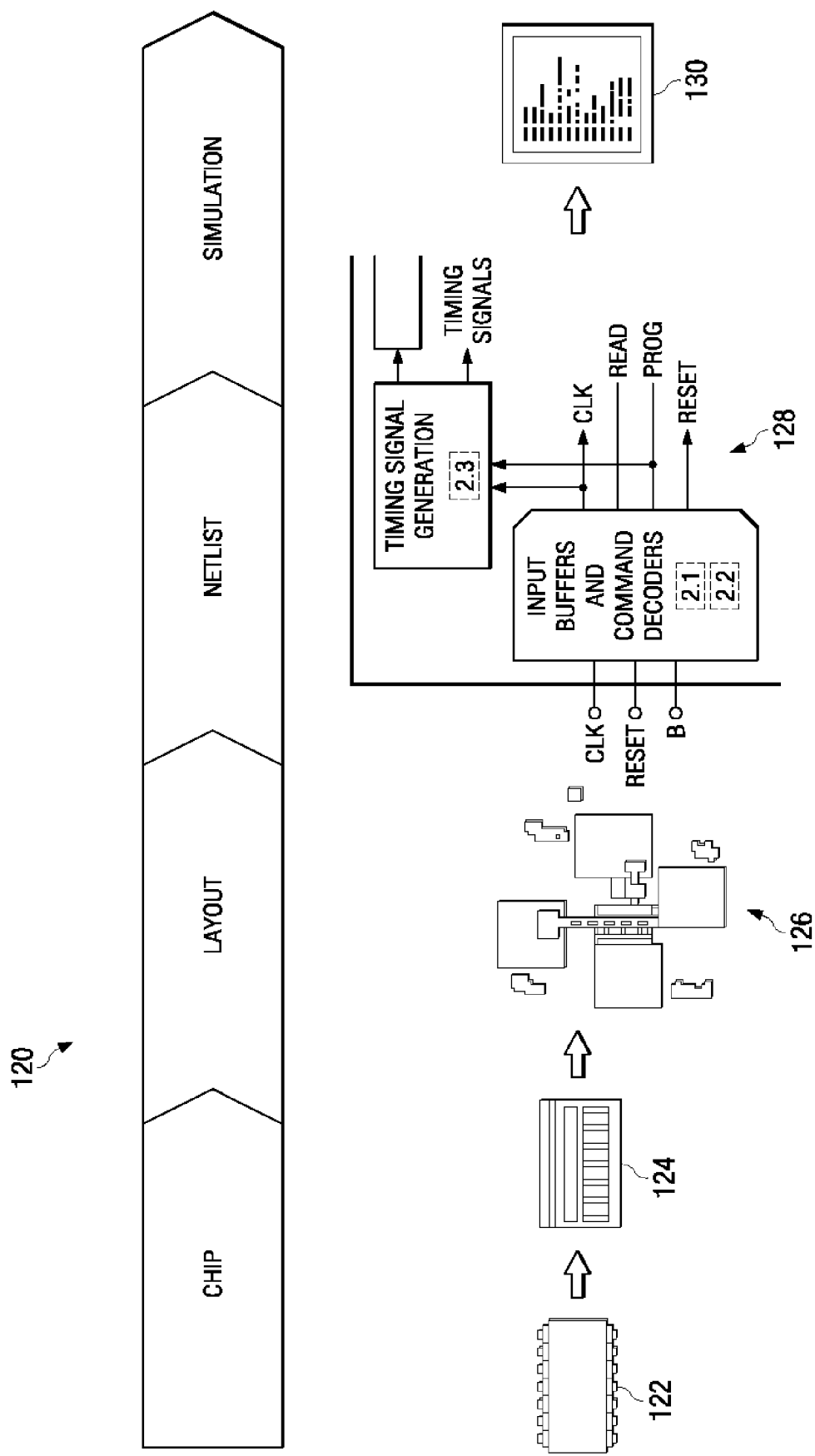
FIG. 2 is a flow diagram for integrated circuit reverse engineering.

Generally, design verification is performed on a chip for which substantial relevant information about the design generally is available and known from the design process. In contrast, reverse engineering flow 104 generally attempts to perform similar conversions to higher levels of abstraction, but without access to useful library information from the design process. This, of course, can significantly increase the difficulty of converting from a lower abstraction level description to a higher abstraction level description. FIG. 2 is a flow diagram illustrating an integrated circuit reverse engineering work flow 120. After an integrated circuit package is disassembled, the various layers 124 of the integrated circuit may be sequentially captured by an electron or optical microscope and then removed. The images of the circuit are processed to generate a physical layout 126 of the circuit. From the layout 126, a netlist 128 of the devices and nets in the circuit may be generated. Finally, the netlist 128 may be simulated in an HDL 130 at the circuit model level or functional system level.

Figure 3:
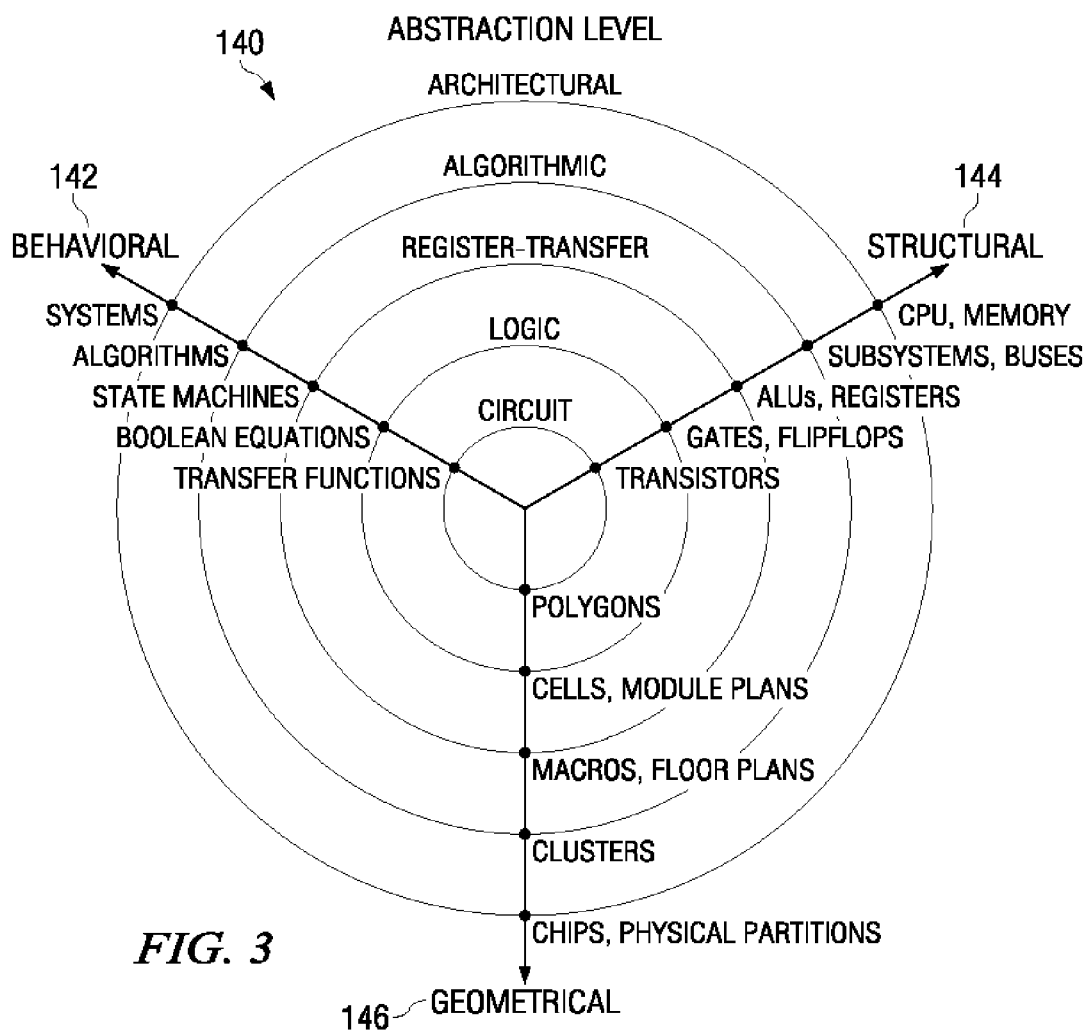
FIG. 3 is a chart of abstraction levels for integrated circuit descriptions.

FIG. 3 illustrates a version of a Gajski/Kuhn chart 140 showing different types of representation domains for modeling an integrated circuit, along with the abstraction levels for each. A circuit may be modeled or represented in the behavioral domain 142, the structural domain 144, or the geometrical domain 146. The center circle represents the lowest level of abstraction at the circuit level. The levels of abstraction increase from circuit to logic to register-transfer to algorithmic up to architectural. Each of the domains generally describes the integrated circuit using a different representation at each abstraction level. For example, in the structural domain, the lowest abstraction level is at the transistor level. Structurally, increasingly higher levels of abstraction are the gates/flipflops, ALUs/registers, subsystems/buses, and CPU/memory. In the physical or geometrical domain, the levels of abstraction start at the polygon level, and increase to cells/module plans, macros/floor plans, clusters, and finally physical partitions. In the behavioral domain, the modeling starts at the transfer function level, increasing to Boolean equations, state machines, algorithms, and finally systems In each domain, the circuit descriptions generated by a lower abstraction level generally are used as building blocks for each successive higher level of abstraction.

Figure 4:
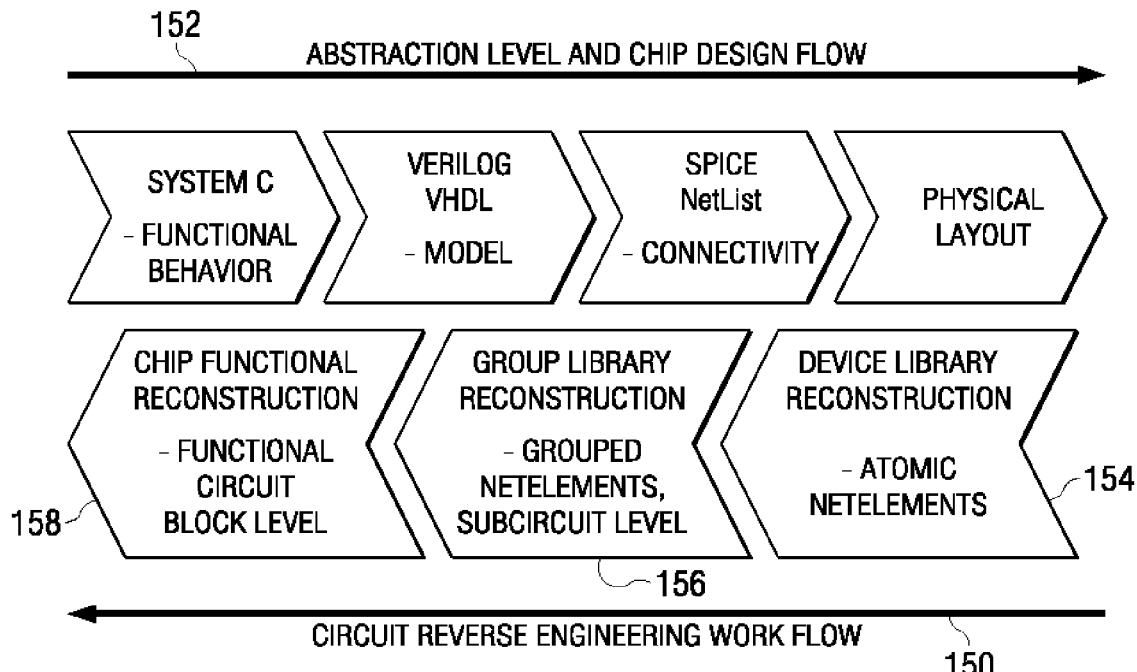
FIG. 4 is a flow diagram for integrated circuit reverse engineering.

FIG. 4 is a flow diagram illustrating further detail of the processes involved in an integrated circuit reverse engineering flow 150. For comparison, an integrated circuit design flow 152, as previously described, also is shown. Again, layout extraction extracts device and connection information from scanning electron microscope (SEM) images of the various silicon, dielectric and metal layers of a chip. At this level, the devices are atomic net elements, which are the lowest level electronic components implemented in the circuit, such as transistors, capacitors, resistors. The atomic net elements, along with their nets or interconnections, may be stored in a database as a planar netlist, for example in SPICE or SPECTRE format. The planar netlist generally represents the lowest level of abstraction of the chip. One problem with a planar netlist is that it is flat and has no hierarchical abstraction, and generally is difficult for a user to understand or analyze efficiently, especially for large, complicated circuits.

The reverse engineering work flow 150 in FIG. 4 illustrates a method of abstracting from the planar netlist up to an organized schematic view, a circuit model HDL, or a system functional description HDL. First, because descriptive libraries for the reverse-engineered chip generally are unavailable, the atomic net elements are analyzed and a device library reconstruction 154 is performed to generate a device library. Once this is done, the atomic net elements may be hierarchically grouped at the subcircuit level into grouped net elements at a higher level of abstraction. A group library reconstruction 156 may be performed to generate a group library. The groups may then be analyzed by chip functional reconstruction 148 to generate a functional circuit block level description of the integrated circuit.

Figure 5:
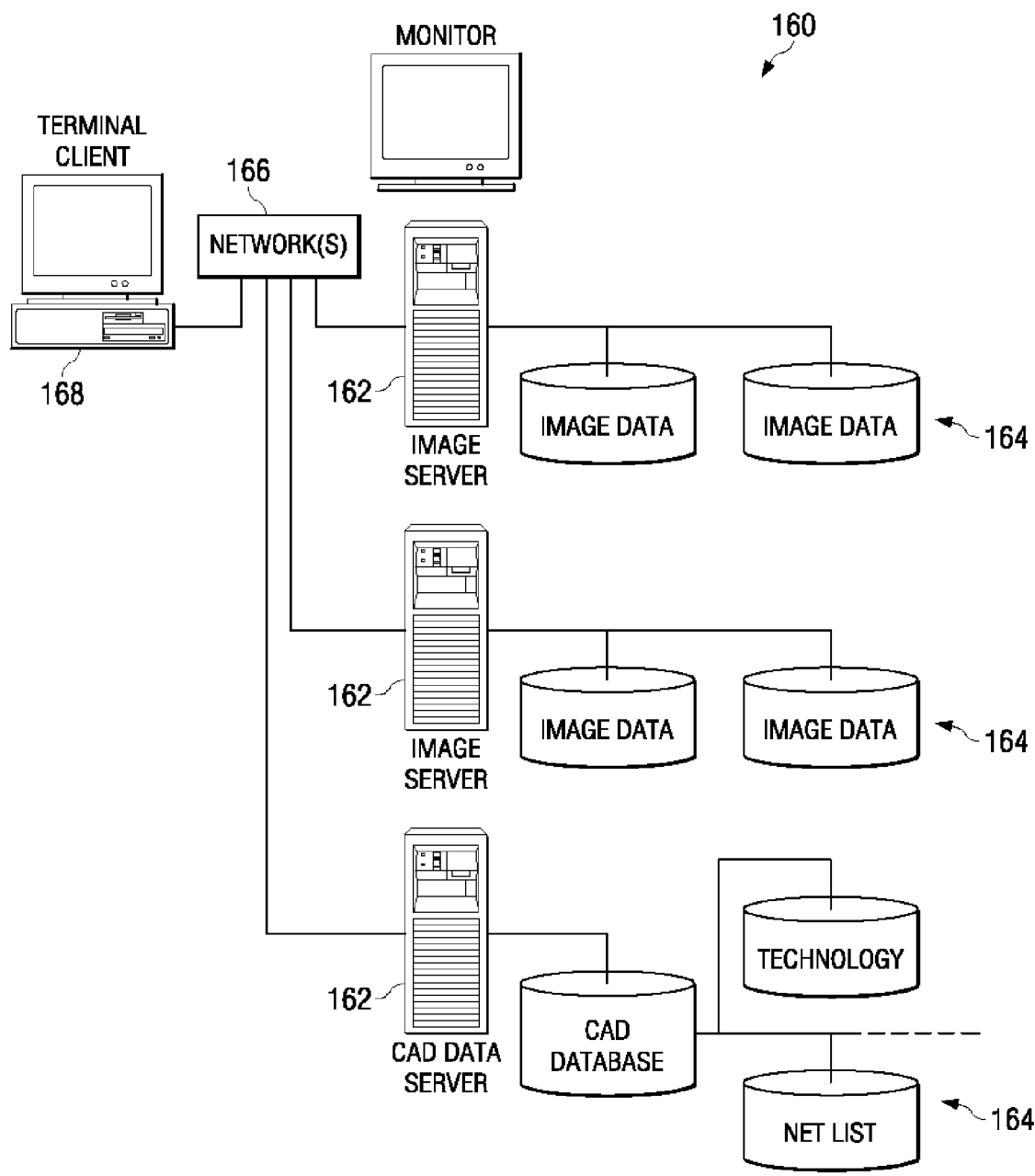
FIG. 5 is a block diagram of a computer system for performing integrated circuit reverse engineering.

The reverse engineering work flow, and other algorithms, flow charts, methods, etc. described herein may be implemented in software and executed on a data processing system such as computer system 160 depicted in FIG. 5. Servers 162 include processors (e.g., CPU, DSP) and working memory (e.g., DRAM), and are connected to permanent storage memory 164 (e.g., magnetic hard drive), which contains storage space for user data. The servers are interconnected by a network 166. Network 166 may include local area networks, wide area networks, or connections through the Internet. The servers may be directly accessed by a user via a user input devices, such as a keyboard and mouse, and user output devices, such as a monitor and printer. The servers also may be accessed over network 166 by a user via a client computer 168, which also includes a processor, working and storage memory, and user input and output devices. Executable programs may be stored in client computer 168, servers 162, or storage 164, and executed by one or more processors located in client computer 168 or servers 162. Alternatively, executable programs, data storage and working memory all may be located on a single computer such as client computer 168, and a program may be executed so as to operate on and store data within the single computer. The methods, flow charts and functions described herein may be implemented in software, firmware, hardware, or combinations thereof. Furthermore, they may be executed on a special purpose computer or a general purpose computer programmed to execute the various embodiments. The programmed code may be stored as source or executable code on computer readable media, such as optical media (e.g., CD, DVD), electronic media (e.g., semiconductor, flash, RAM, ROM) or magnetic storage (e.g., hard drive, magnetic tape), or on human readable media such as paper.

Figure 6A:
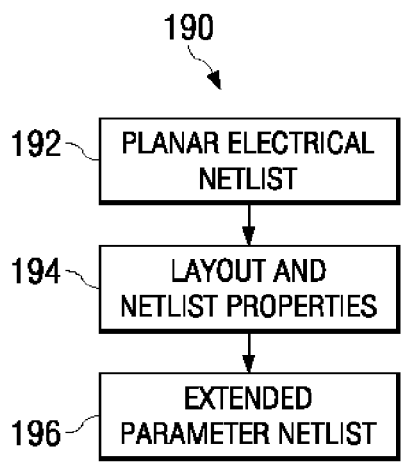
FIGS. 6A-6B are flow charts for generating extended parameter netlists.

With respect to the reverse engineering work flow, FIG. 6A illustrates a high level flow chart 190 for converting a planar electrical netlist into an extended parameter netlist. A planar electrical netlist is obtained in step 192, as described above, from an actual integrated circuit by layout extraction techniques. Layout and netlist properties are then analyzed and combined in step 194 to generate an extended parameter netlist in step 196. The netlist electrical and connectivity properties may be directly extracted from the planar netlist from step 192. An analysis of the integrated circuit layout generated by the layout extraction may be used to add various layout parameters to the netlist. For example, line widths of circuit traces may be readily measurable, and may indicate the type of signal for which they are designated. Specifically, a relatively thicker trace may carry a power signal such as $V_{DD}$ or $V_{SS}$. As another example, a set of extended parallel traces may indicate some form of bus, such as an address, control or data bus. Other parameters that may be measured or determined from the configuration of the physical chip include floorplan layout, module and block placement, signal routing and electrical connectivity.

Figure 6B:
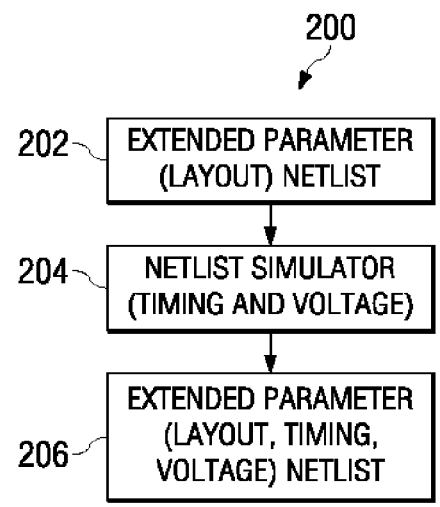

FIG. 6B illustrates a high level flow chart 200 for building on the extended parameter netlist generated in FIG. 6A and shown in FIG. 6B in step 202. In addition or alternatively to adding layout parameters to the netlist, the netlist may be input to a netlist simulator in step 204 to execute simulations such as timing analysis, delay propagation analysis (e.g., T sweep), sensitivity analysis (e.g., voltage sweep), etc., on the netlist. Any or all of these parameters may be added to the netlist in step 206 to generate a new extended parameter netlist.

Figure 7A:
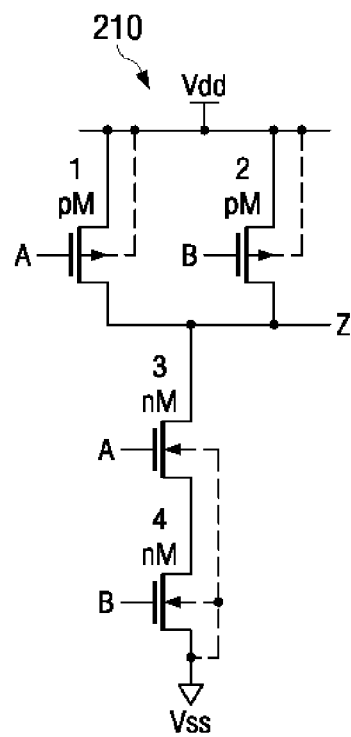
FIGS. 7A-7D are circuit diagrams of different methods for representing a NAND gate.
Figure 7B:
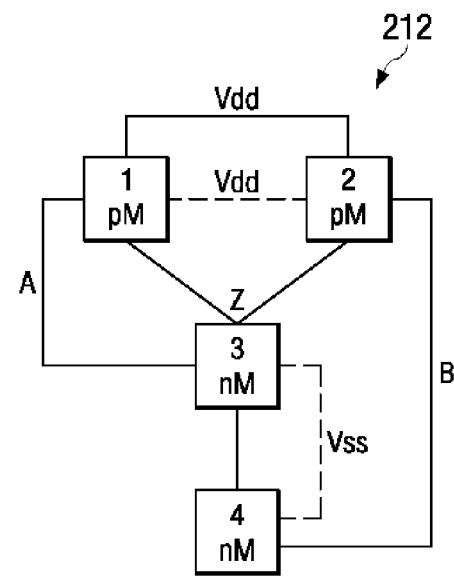
Figure 7C:
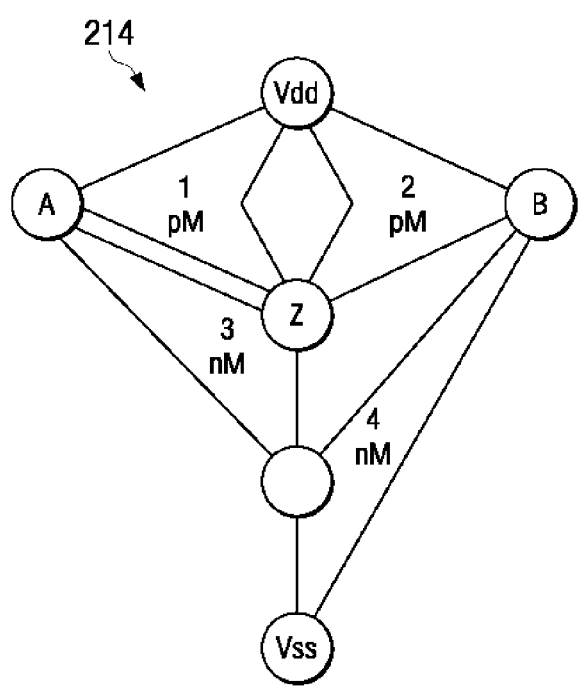
Figure 7D:
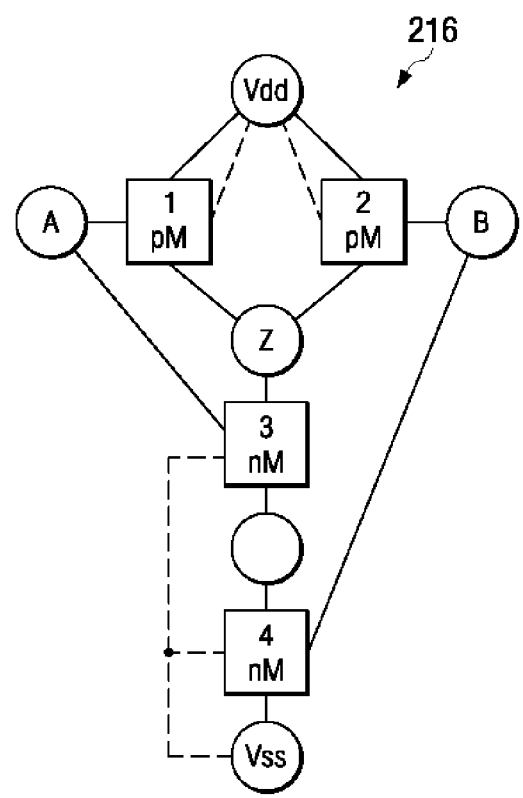

A graphical analysis of the planar netlist may be used to determine hierarchical properties of the circuit in order to extend the circuit to a higher level of abstraction. Various graphical representations of a NAND circuit are shown in FIG. 7. FIG. 7A illustrates a NAND gate 210 in schematic form, which is readily understandable by a user. FIG. 7B illustrates the same circuit expressed as a component graph 212. In this graph, the individual components (e.g., transistors) are represented as the vertices of the graph, and the nodes between components are represented as edges between the vertices. In a node graph 214, shown in FIG. 7C, the nodes between components are represented as the vertices of the graph, and the components are represented as edges between the vertices. A bipartite graph, depicted in FIG. 7D, represents both the components and the nodes are vertices in the graph, and the edges of the graph represent connections between the components and the nodes. Each of these representations may be used in different embodiments.

Figure 8A:
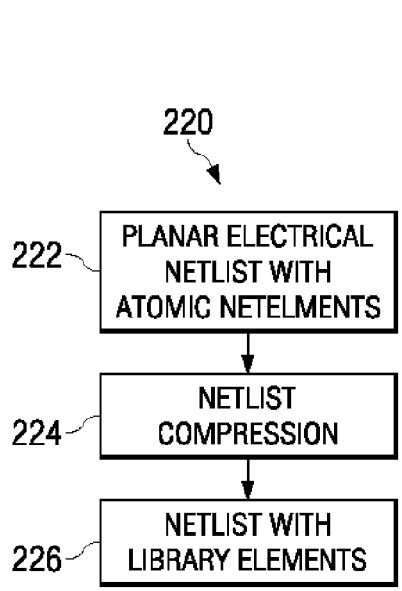
FIGS. 8A-8C are flow charts for compressing a netlist by using library elements.

By representing the circuit netlist as a graph, statistical processing may be performed on the graph to determine information about higher level blocks from the planar netlist. FIGS. 8A and 8B illustrate a high level graphical algorithm for reducing the size of a planar netlist. A graphical representation of a planar netlist containing atomic net elements is generated in step 222. As will be explained in further detail below, the netlist is then analyzed in step 224 to identify and classify frequently used elements, e.g., NAND, NOR, XOR gates, flipflops, buffers and the like, and to generate a library of these elements. The netlist is then compressed by replacing various atomic net elements with library elements that match those atomic elements and their connections. This results in a substantial reduction in the number of elements in the graph, and thus a reduction in the complexity of the netlist. Unlike design verification, preexisting or independent knowledge of the library elements circuit design generally is not needed to perform the graphical compression of the netlist.

Figure 8C:
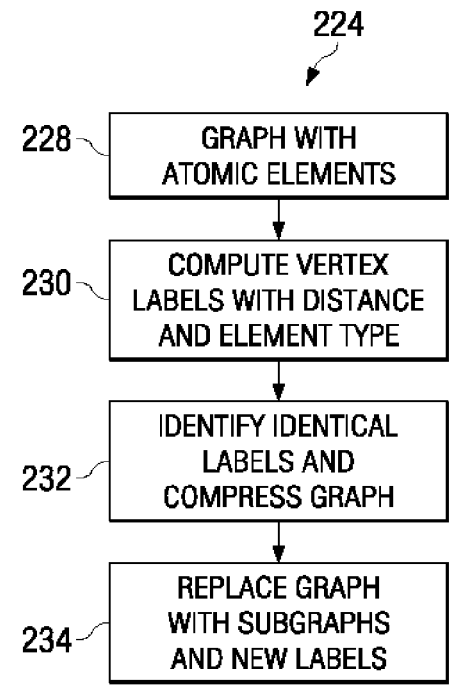
Figure 8B:
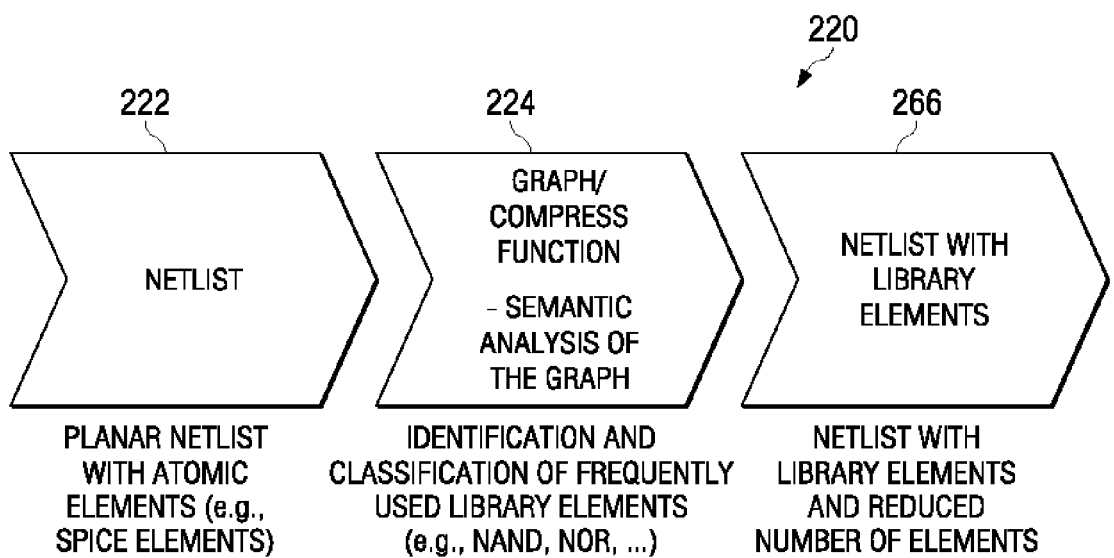
Figure 9A:
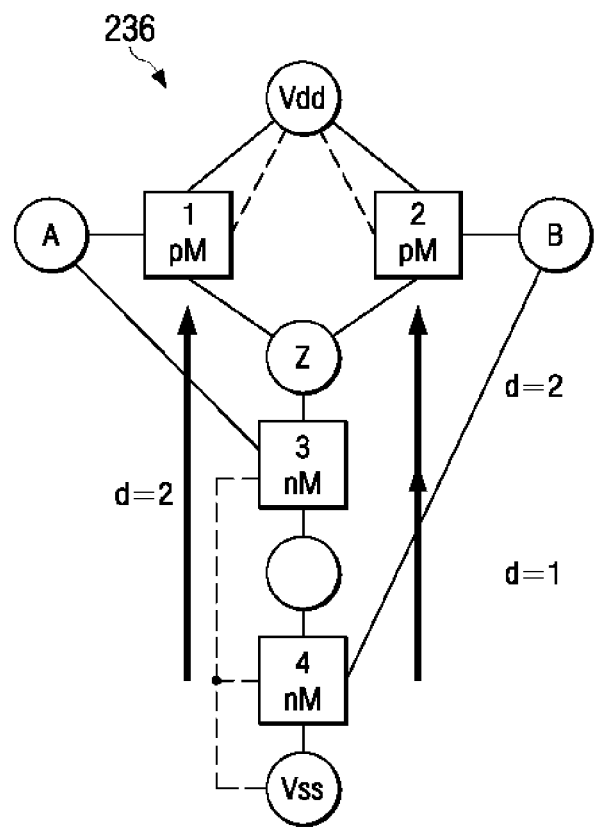
FIG. 9A is a circuit diagram showing distance calculations between elements.

FIG. 8C illustrates compression step 224 in more detail. Step 228 starts with the graph with atomic net elements derived from the flat netlist. Traversing the graph and finding the connected components may be accomplished with various methods, such as depth-first search (DFS) and breadth-first search (BFS) algorithms. The set of vertices and set of edges in the graph may be represented as G(V,E). In step 230, labels for the vertices are computed with distance and element type. The atomic element types are known from the planar netlist. Using the NAND circuit 236 as an example in FIG. 9A, there are four elements (transistors) in the graph. The distance between elements is set as d(g,h) equals the minimum path traversed in the graph between elements g and h. For example, in NAND circuit 236, transistor 4 has a distance of two to transistor 1, a distance of two to transistor 3, and a distance of 1 to transistor 3 in FIG. 9A. Each of the paths goes to or passes through transistor 3, and a set of atomic elements having this configuration of transistors, distances and paths may be recognized as a NAND gate and set as a NAND library element.

Figure 9B:
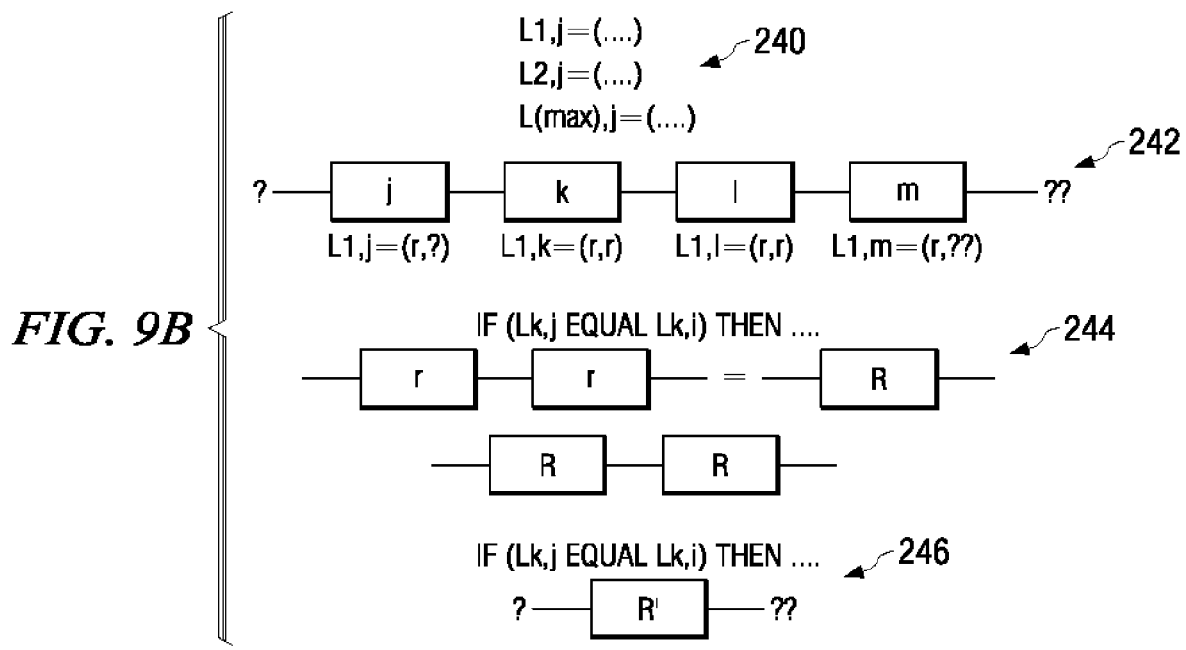
FIG. 9B is a diagram showing compression of netlist elements.

In steps 232 and 234, identical labels in the graph may be identified and the graph compressed as the separate labels are replaced with new labels, and sets of graph components are replaced with subgraphs representing standard cells comprising the selected components. Identical higher order labels L describe the library elements. The maximum number of elements (m) in a library may be found, e.g., during chip layout inspection. For example, m may be provided by (standard cell height*maximum cell width)/(single transistor size), or by (standard cell height*typical cell width*Δ width)/(single transistor size). FIG. 9B illustrates an example of the labeling, compressing, and relabeling process. As shown by labels 240, labels L1,j, L2,j, . . . , Lmax,j may be assigned to component j based on distances to other components, as well as element type. An upper limit may be imposed on the distance traversed between components to limit the library elements to a maximum desired level of complexity, for example to gate level complexity.

Graph 242 illustrates a sequence of connected components j, k, l and m, with unit distance labels L1,j=(r,?), L1,k=(r,r), L1,l=(r,r), L1,m=(r,??), respectively. Identical labels for two components are identified in graph 244 when Lk,j=Lk,i. When this is the case, two atomic elements r may be replaced with a single library element R. Multiple iterations of this process may be performed, again with an upper limit based on maximum desired library element complexity. As shown in graph 246, atomic elements j, k, l and m may be replaced with a single library element R'. Other serial and parallel components in the circuit may be found in a similar manner. This process thus results in a compressed graph with new library elements and new labels for the elements.

Figure 10A:
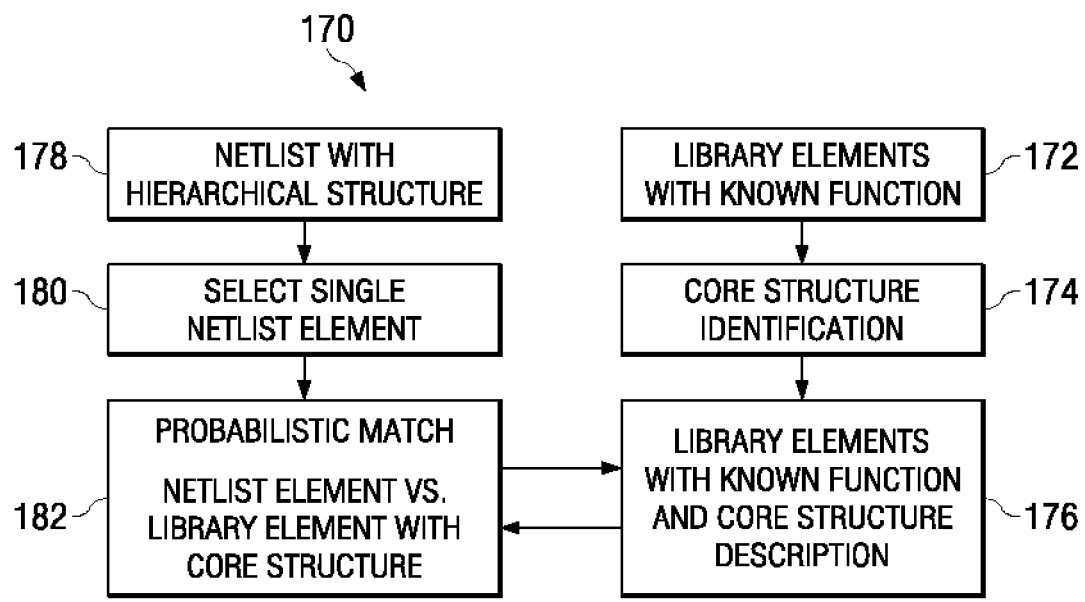
FIG. 10A is a flow chart for matching netlist elements with library elements.

Once a hierarchically organized netlist is generated, names may be assigned to the various circuit blocks that have been created in the netlist. A user of the circuit netlist generally prefers to view common and understandable names for circuit blocks, such as NAND4, ADDER, etc., regardless of whether the blocks represent lower hierarchy instances such as standard cell library elements or higher hierarchy complex circuits. Preferably, functional names are assigned to the circuit blocks. Flow chart 170 in FIG. 10A illustrates one method for assigning names to the circuit blocks. Starting with library elements with known library function names in step 172, core building blocks for some or all of the elements may be identified in step 174. An extended library of library elements with both known functions and known core structure descriptions then may be generated in step 176.

In step 178, a netlist with a hierarchical structure is generated, as previously described herein. A single netlist element from the hierarchical netlist may be selected in step 180. In step 182, the selected netlist element may be compared to the different library elements with known functions and core structure descriptions generated by step 176. A probabilistic match between the selected netlist element and one of the extended library elements indicates that there is a certain likelihood that the netlist element does have the core structure of the library element. If there is a match, then the netlist element is assigned or named with the associated function of the matching library element. Unlike a known isomorphic graph match, the implementation of a function is not known in detail. Therefore, the probabilistic match method may not be correct every time, but in many cases a correct interpretation of the netlist should be achieved. This process may be repeated, serially or in parallel, for the different netlist elements contained in the hierarchical netlist.

Figure 10B:
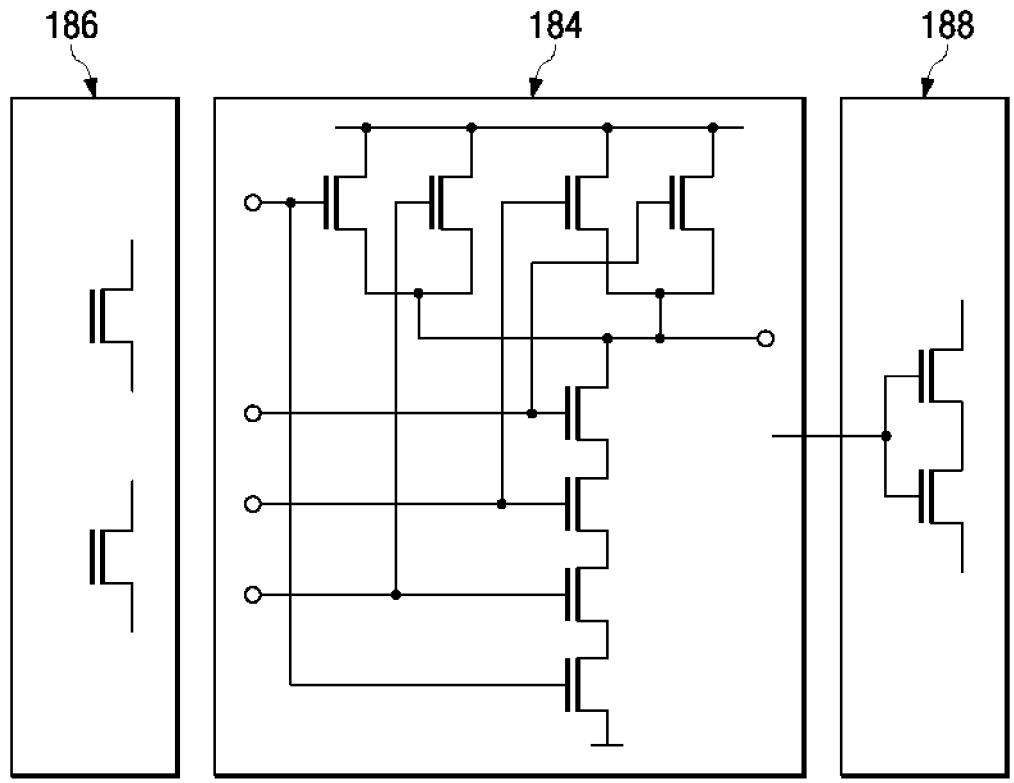
FIG. 10B is a diagram of a core structure for an element and supporting circuitry.

The core structure is identified in step 174 for a given library element because generally there are many additional elements surrounding the core structure that do not influence the primary function of the core circuit. Therefore, the core structure is identified in the library elements so that the netlist elements may be compared with and assigned the names of the primary functions of the core circuits. For example, FIG. 10B illustrates a core structure of a NAND standard cell 184. The NAND core circuit 184 has a number of parallel and serial MOS transistors of different types. Surrounding the core 184 are additional input circuits 186 and output circuits 188 that generally do not affect the central logic function of the NAND core circuit 184. For example, input circuit 186 may contain input inverters, clock gates, latches, pass gates, etc., and output circuit 188 may contain inverter structures, for example, for driver strength adjustment. Again, these input and output structures generally do not affect the function of the NAND standard cell. Therefore, separating out these structures from the core structure before performing the comparison with the netlist elements may both simplify the comparison calculations and increase the probability of a successful match.

An additional aspect in the reverse engineering of an integrated circuit and in building a hierarchical netlist is the computer language used to represent the circuit. As discussed above, netlists may be stored in various formats such as SPICE, and higher level descriptions may use HDLs such as VHDL. However, netlist formats are at such a low level as to be difficult for a user to readily understand, and existing HDLs, while understandable by a user, are difficult to generate from netlists in reverse engineering. Thus, various embodiments of the invention utilize a token-based, object oriented netlist description to represent the integrated circuit.

Figure 11A:
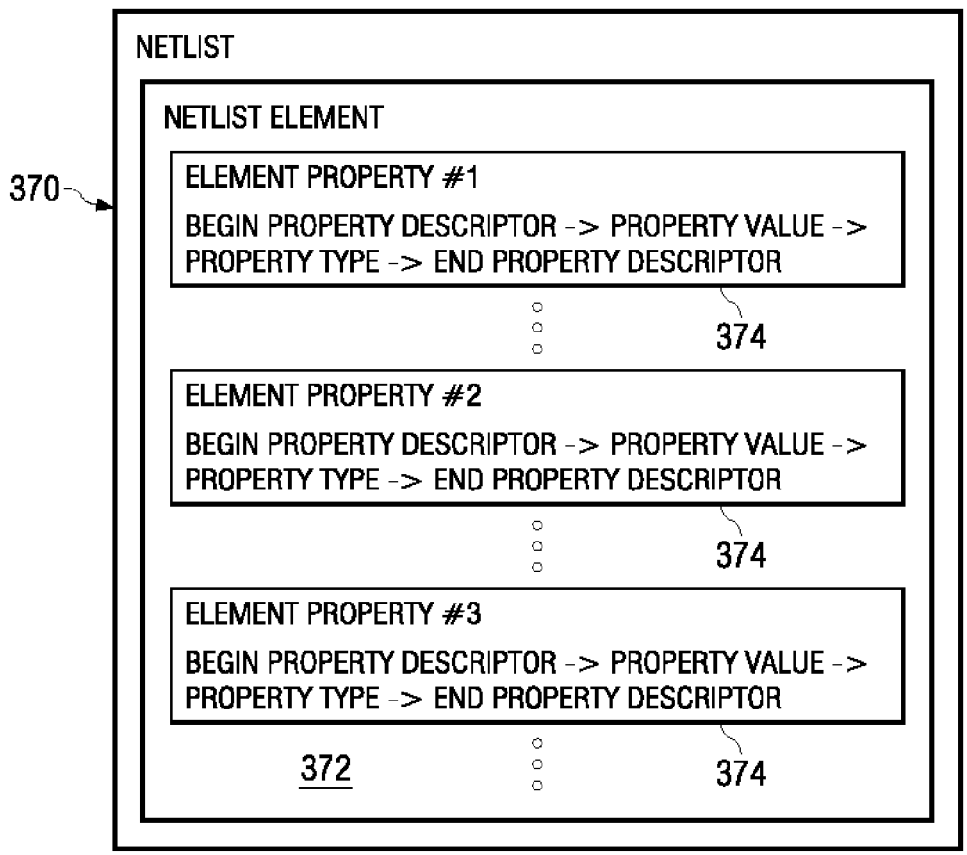

A generic format for a token-based object oriented netlist 370 is shown in FIG. 11A. Netlist 370 generally contains a netlist element 372 for each element of the described circuit, at the appropriate level of hierarchy. Each netlist element 372 contains identifying tokens and the corresponding values or lexemes for each token for that specific netlist element. In addition, each netlist element 372 comprises one or more element properties 374 describing various properties of the netlist element 372. Each netlist element property 374 contains the appropriate tokens for that property and the corresponding values or lexemes for each token in the specific netlist element property. In addition to including the information from a planar netlist, the netlist element properties 372 may include additional data discussed herein throughout, such as geometrical data, label data, tag data, etc. The flexible generic token-based object oriented format of netlist 370 allows as few or as many element properties 374 to be used for each netlist element 372.

Figure 11B:
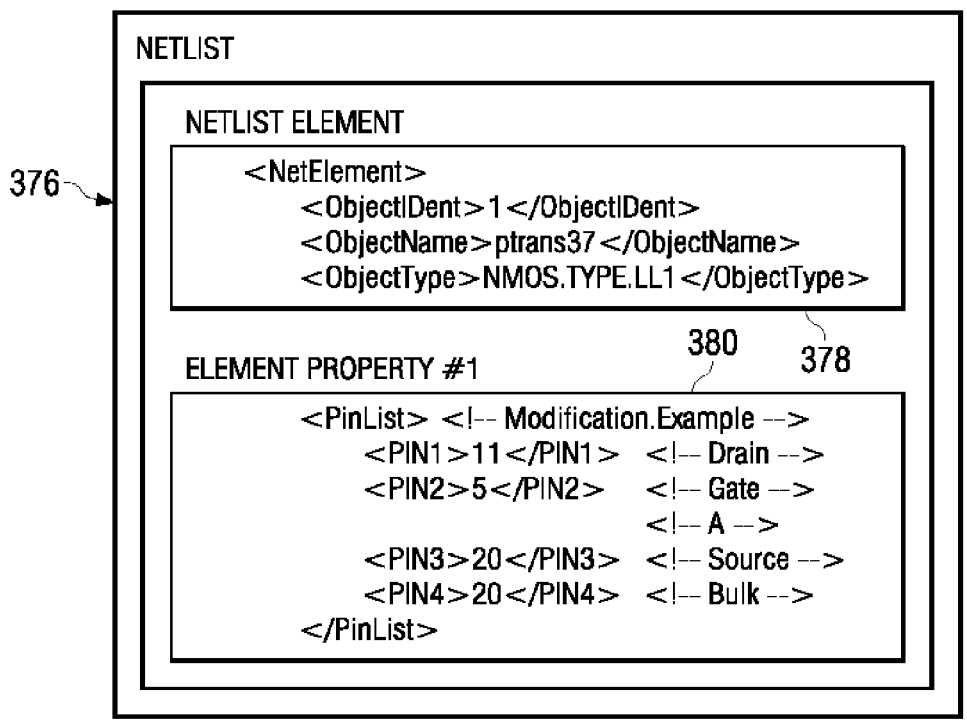

An example of a portion of a token-based object oriented netlist 376 is shown in FIG. 11B. Netlist 376 comprises a netlist element 378, which is an NMOS transistor named ptrans37. As a netlist element property example, pinlist element property 380 is shown for NMOS transistor netlist element 378. As shown in FIG. 11B, pinlist element property 380 lists the pin tokens and corresponding values for each pin token. A full netlist would contain many such netlist elements and their associated netlist element properties.

Specific embodiments of a netlist may implement a markup language, such as extensible markup language (XML). An example of a portion of an XML description of a NAND gate is shown in FIG. 11C. In addition to including the information from a planar netlist, the XML file 250 may include additional reverse engineering data such as geometrical data, label data, tag data, etc. Compared to a standard netlist, a token-based, object oriented netlist generally is easier to understand and is more flexible both in allowing additional data to be included and in being adaptable to describe the circuit at various levels of abstraction. Furthermore, as discussed below, utilizing a token-based object oriented language facilitates computer-implemented comparison of an integrated circuit netlist description with the claims of a patent, the content of which also may be expressed in the same token-based object oriented language.

The statistical analysis of the netlist for the integrated circuit may continue with the identification of popular nodes in the netlist, such as power supply voltages (e.g., $V_{DD}$, $V_{CC}$, $V_{SS}$), clocks (e.g., CLK, CLK/), bus signals, reset signals, other control signals, etc. Generally, in an integrated circuit the most popular nodes will be the power supply voltages. In addition, even though the higher abstraction level blocks in the circuit are not yet known, the nodes between these modules generally will be popular nodes. This is because signals that are sent between modules in a circuit generally must travel through the few nodes that are on the boundaries between the modules.

Figure 12:
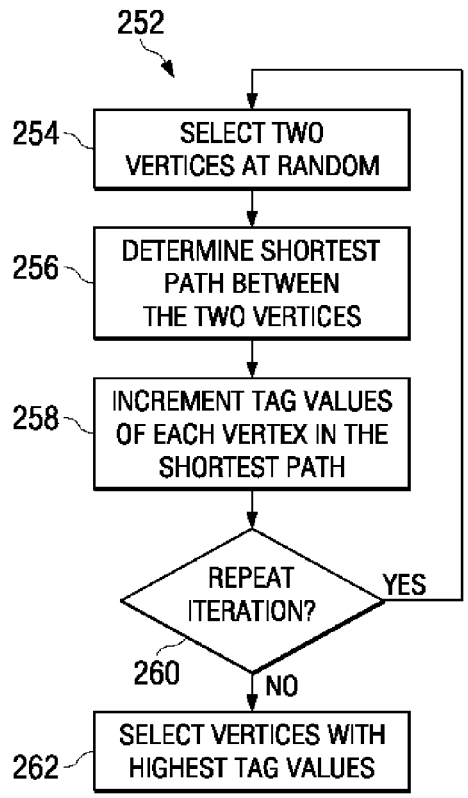
FIG. 12 is a flow chart of a shortest path method of determining popular nodes in a circuit.

As illustrated in FIG. 12, a netlist partitioning algorithm 252 may be executed to determine the most popular nodes in the graph representing integrated circuit. The vertices in the graph are assigned tag values that indicating the number of times the respective vertex is traversed. Preferably the graph is traversed a sufficient number of times to determine statistically significant values for the tags. In each iteration, two vertices in the graph are selected at random in step 254. Alternatively, the vertices may be selected pseudorandomly, or according to a predetermined order that approximates a random selection, both of which approaches are interpreted herein as being encompassed by the random approach. Then the shortest path between the two selected vertices is determined by any of a number of graph theory shortest path algorithms (e.g., A*search algorithm, Djikstra's algorithm, Bellman-Ford algorithm, etc.) in step 256. If there are multiple equally-short paths, then one may be selected, or a portion of them or all of them may be selected. For each vertex in the shortest path, the respective tag value is increased by one in step 258. Step 260 determines whether the number of iterations is sufficient, or whether the graph traversal needs to be repeated with new vertices. After the multiple iterations are completed, the most popular nodes, generally those having the highest tag values, are selected in step 262. The tags with the highest values represent a set of hierarchical nodes. In addition, other types of graph partitioning algorithms may be used to confirm these most popular nodes for partitioning of the graph, such as a minimum cost cutting algorithm.

Figure 13A:
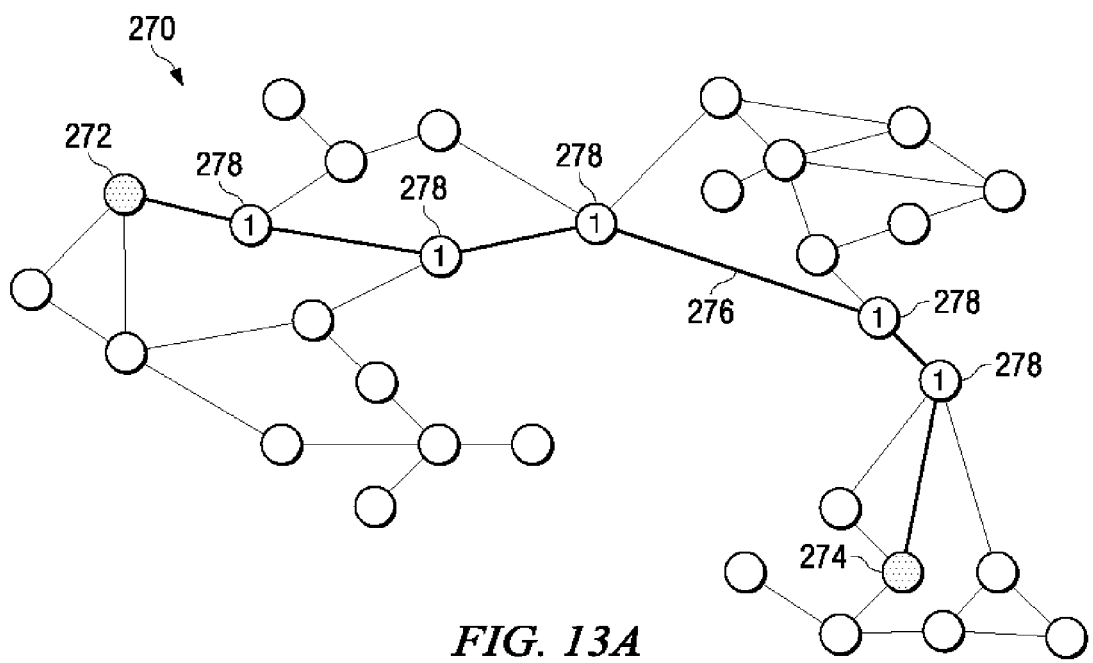
FIGS. 13A-13E are graphical representations of a circuit showing example steps of a shortest path method for locating popular nodes.
Figure 13B:
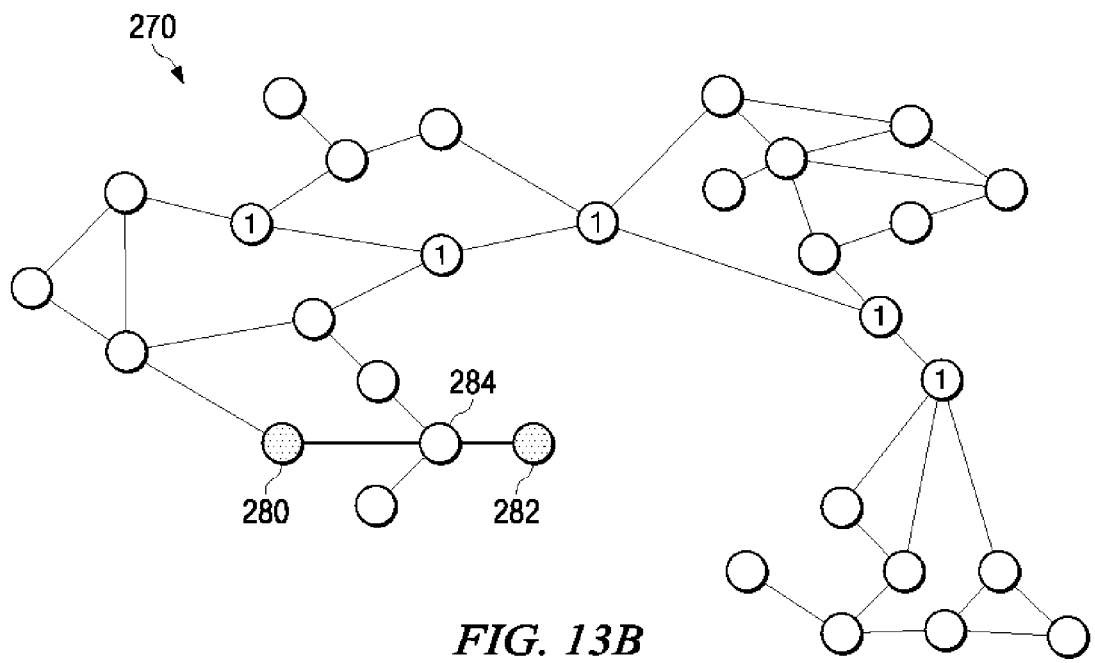

A simple example of popular node location is shown in the sequence of FIGS. 13A-13E. Graph 270 represents the elements and interconnections in an integrated circuit. In FIG. 13A, two vertices, vertex 272 and vertex 274, are selected at random. A shortest path 276 between the two vertices is found, and the tag values of the vertices 278 in the shortest path are incremented to one. Repeating this procedure, vertices 280 and 282 are selected at random. The shortest path between these vertices is found, however the shortest path only traverses through one vertex 284. This does not meet a minimum path length parameter, which is used to ensure that the randomly selected vertices are not the same or nearby neighbors. That is, the randomly selected vertices should be a minimum distance apart so as to locate the nodes that are globally popular in the circuit. Because the minimum path length is not met, no tag values are incremented.

Figure 13C:
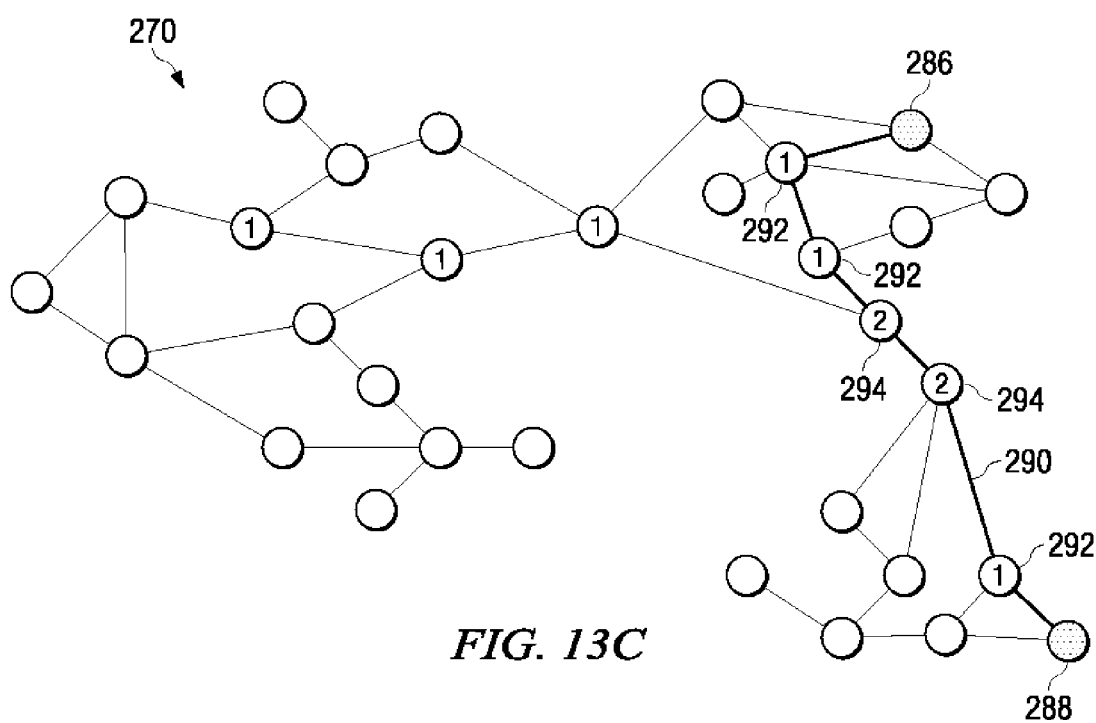
Figure 13D:
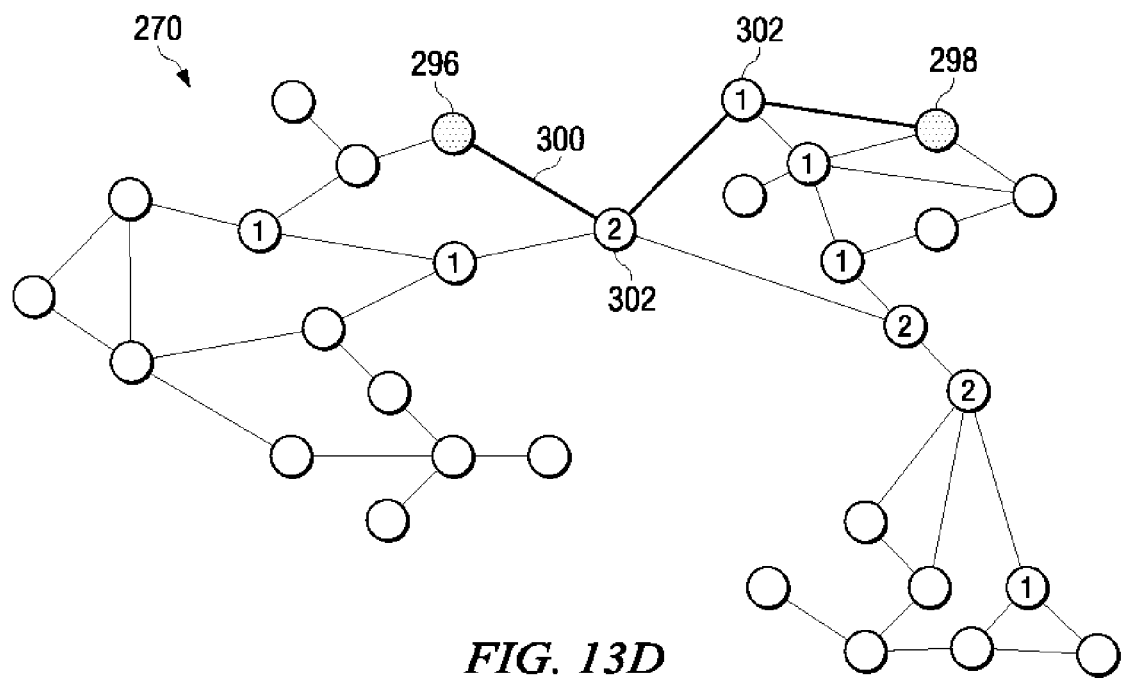
Figure 13E:
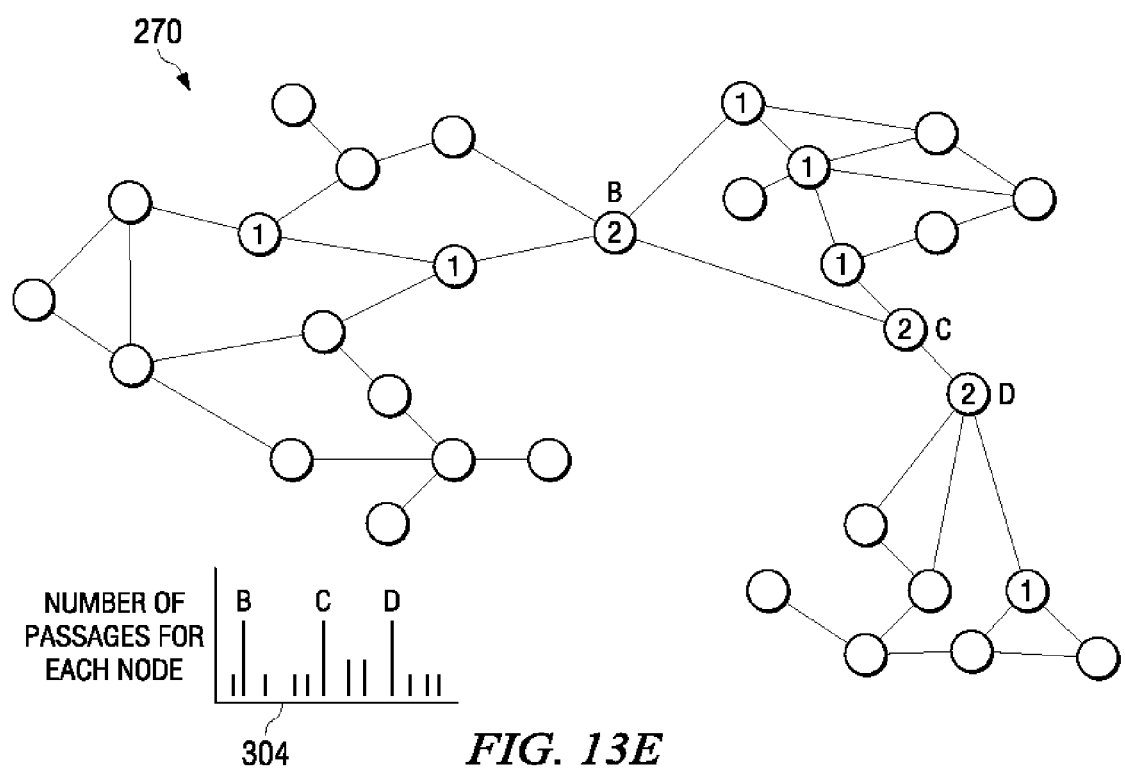

In FIG. 13C, vertices 286 and 288 are selected, and shortest path 290 is found. The minimum path length in this iteration is met, so the vertices 292 and 294 in the shortest path are incremented. Because vertices 294 were in the path found in FIG. 13A, their tag values already had a value of one, so their tags are incremented to have a value of two. The process is repeated again in FIG. 13D, with vertices 296 and 298 being selected at random. The shortest path 300 is found, and the tag values for vertices 302 are incremented. Although not shown in FIG. 13, the process is repeated a statistically significant number of times for graph 270. The nodes with the highest tag values then are selected as the most popular nodes. In FIG. 13E, nodes B, C and D have the highest tag values, so these are the globally popular nodes in the circuit. A chart 304 of the nodes versus their tag values indicates that nodes B, C and D have the highest values.

Figure 14:
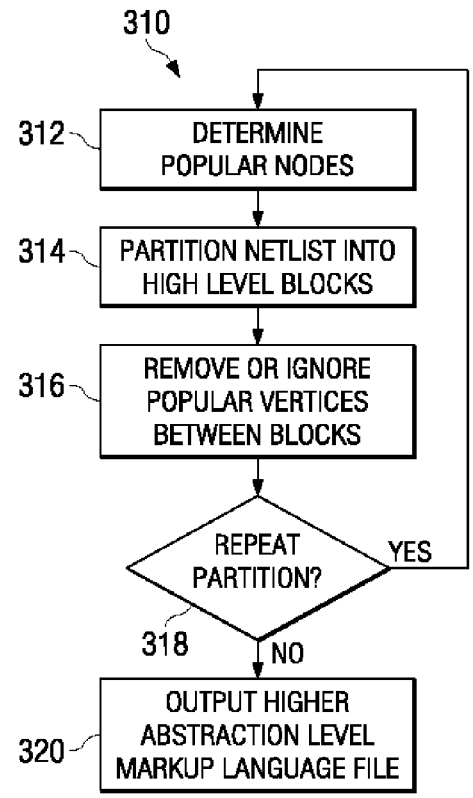
FIG. 14 is a flow chart of a netlist partitioning method.

The entire process may be repeated multiple times, first, as the most popular nodes such as power are found, and then, as the circuit is partitioned into high level blocks. Successive executions of the process would partition the high level blocks into successively lower level blocks. The flow chart 310 in FIG. 14 illustrates this method. The popular nodes are determined in step 312 using the technique described above. The graph or circuit may be partitioned in step 314 into high level blocks, with the popular nodes at the boundaries of the blocks. In step 31, the popular nodes between the blocks may be removed. Note that if this is the first iteration, the power signal nodes may be located and removed, and then highest level blocks may be determined in that or the subsequent iteration. If a next lower level of blocks or modules is desired, the process may be repeated in step 318, albeit without the most popular nodes from the previous iteration, so that new nodes become the most popular nodes, and subblocks within the higher level blocks may be partitioned. After a selected number of iterations, the process may output a token-based object oriented language file containing the hierarchical, partitioned netlist.

Figure 15:
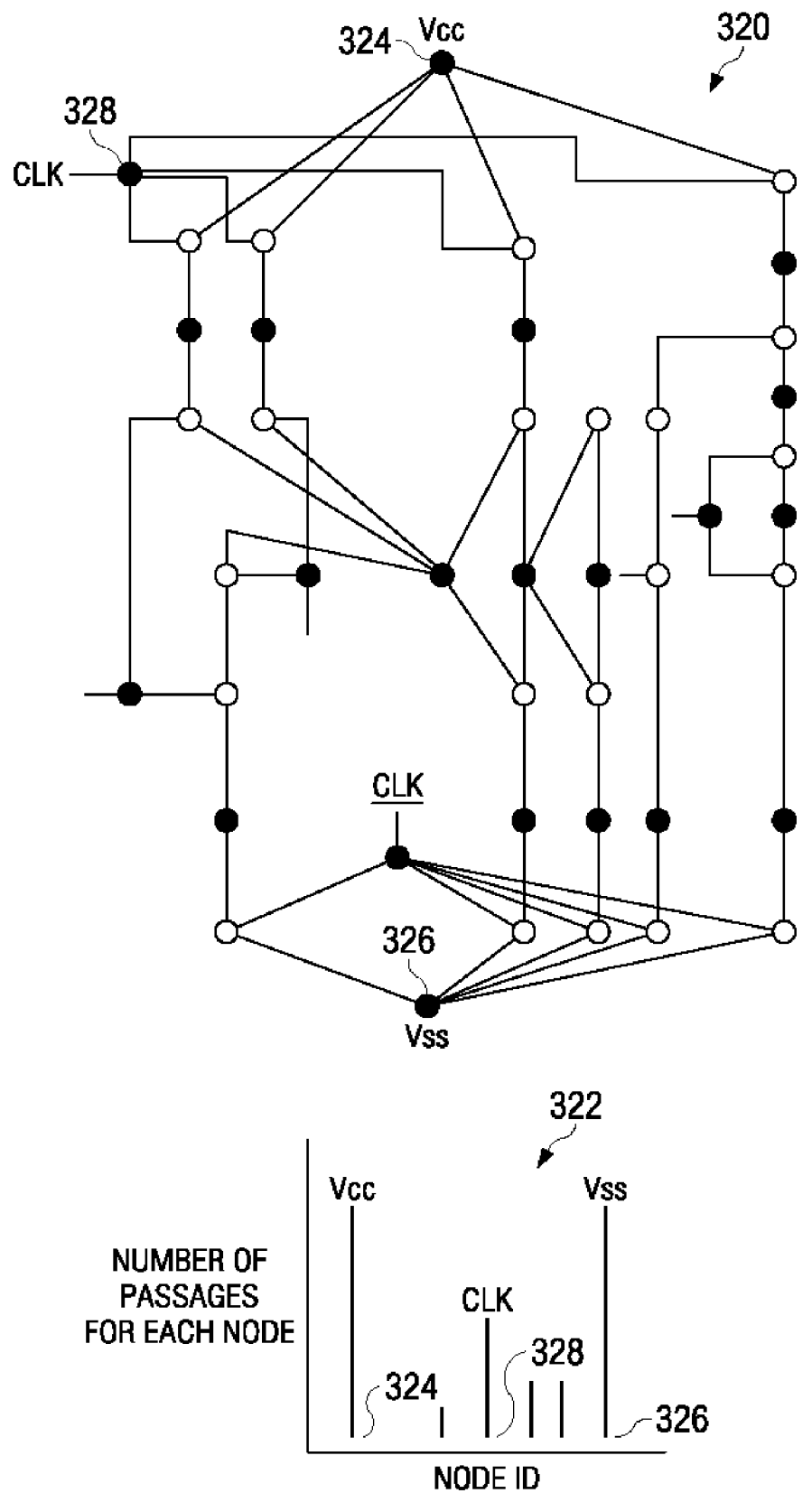
FIG. 15 is a graphical representation of a circuit showing an example of a shortest path method for locating popular nodes.

As another example, FIG. 15 illustrates a graph 320 upon which the popular node algorithm has been executed. As shown in chart 322, the three most popular nodes with the highest tag values are nodes 324, 326 and 328. These nodes are determined to be $V_{CC}$, $V_{SS}$ and CLK, respectively, and their nodes in graph 320 are labeled accordingly.

Figure 16:
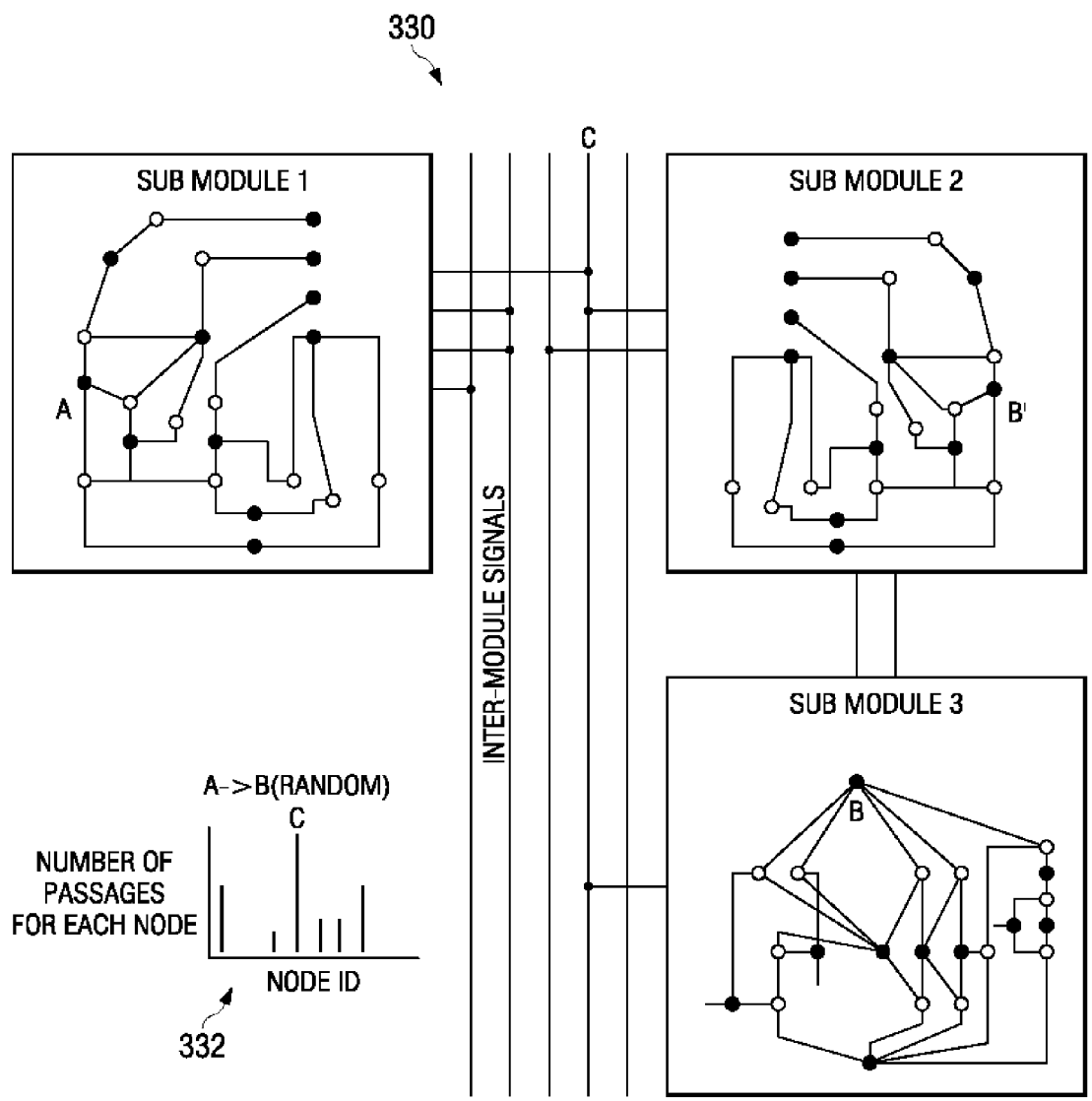
FIG. 16 is a graphical representation of a circuit showing an example of a shortest path method for locating modules and inter-module signals.

Similarly, FIG. 16 illustrates a general overall process of netlist partitioning. Graph 330 contains inter-module signals such as C that have been found through the netlist partitioning algorithm. Chart 332 shows that node C has a high tag value, and thus is most likely to be an inter-module signal. After other inter-module signals are identified, the circuit may be partitioned into submodules with the inter-module signals indicating the borders of the modules. This process may be repeated a number times to further partition the sub-modules into smaller modules, etc.

Figure 17A:
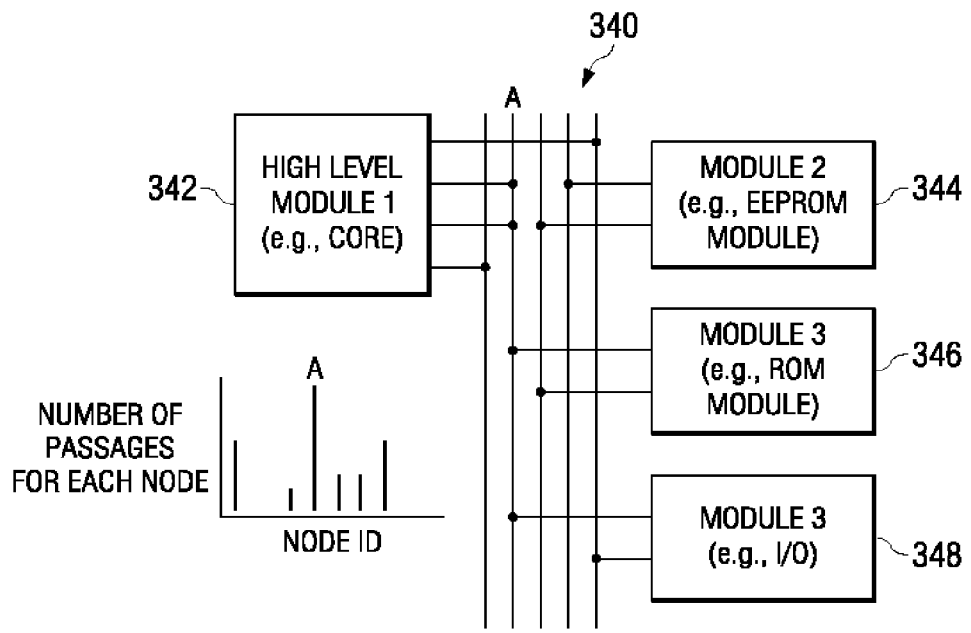
FIGS. 17A-17C are block diagram/graphical representations of a circuit showing an example of a shortest path method for locating intra-module sub-block circuits and signals.

FIG. 17A illustrates the methods of FIG. 16 applied to a specific system on a chip integrated circuit. Generally, only control signals, such as a system bus, are exchanged between the higher level modules in the chip. These signals generally may be identified from a planar netlist representation of the circuit as the most popular nodes in the circuit. Specifically, in FIG. 17A, graph 340 has been partitioned at a first level into high level module 342, high level module 344, high level module 346 and high level module 348.

Figure 17B:
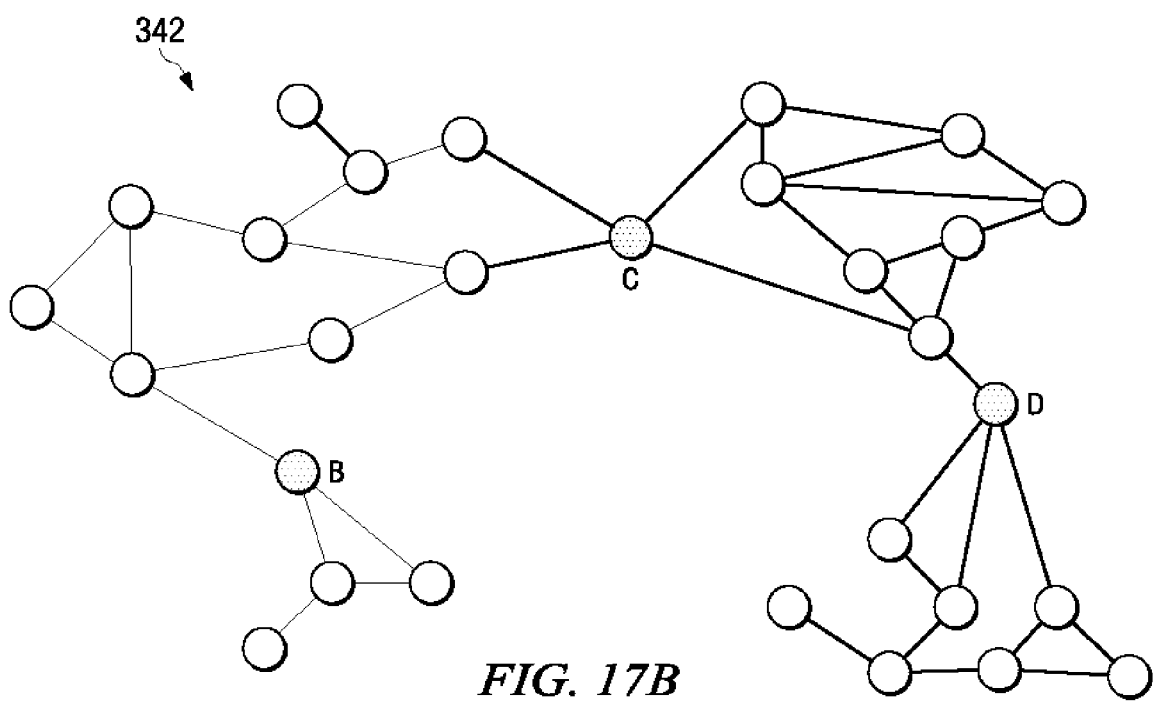
Figure 17C:
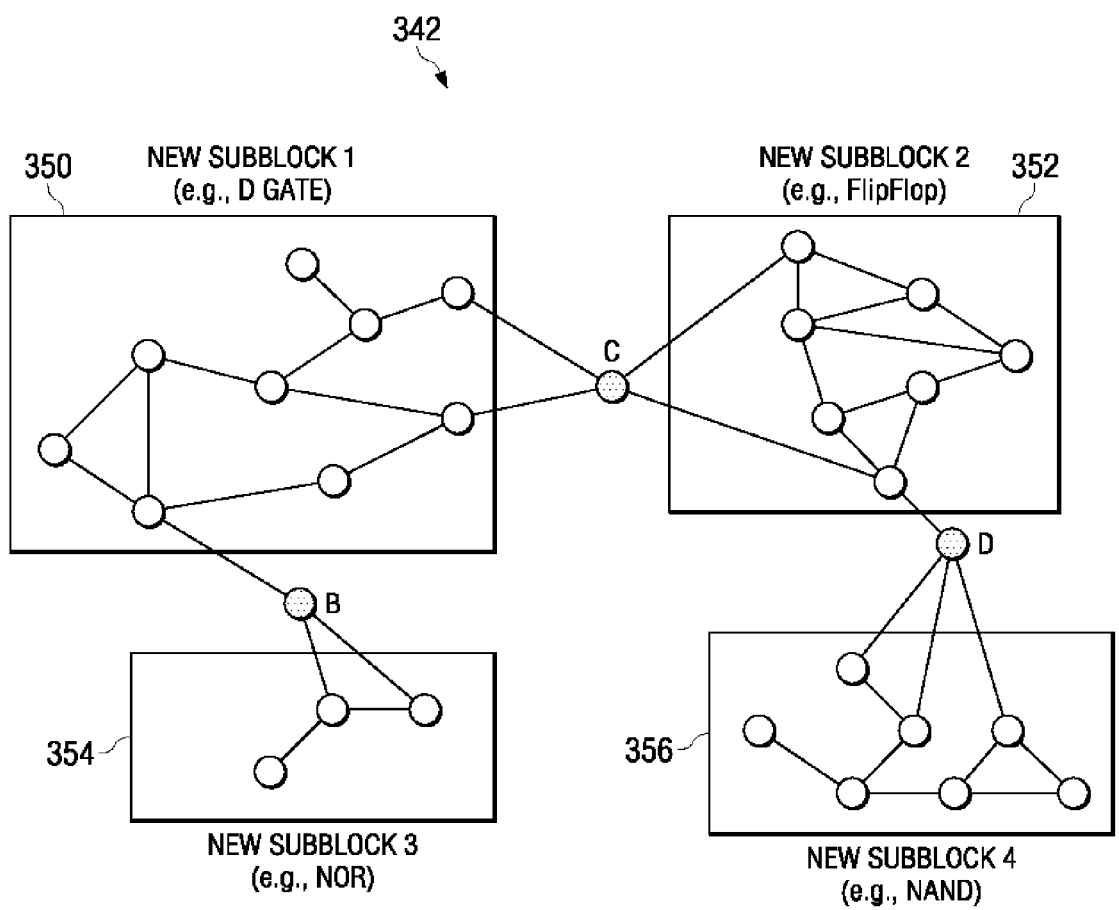

Removing the inter-module signals, such as bus signal A, from the graph, and focusing in on high level module 342, FIG. 17B illustrates the start of a second level of partitioning. Executing the partitioning algorithm a second time, but without node A, locates nodes B, C and D as being the most popular nodes within high level module 342. Using nodes B, C and D as boundaries, high level module 342 is partitioned in FIG. 17C into four new subblocks 350-356.

Thus, in accordance with the above algorithms and methods, modules and blocks in the integrated circuit netlist may be identified, and the planar netlist may be transformed to a higher level of abstraction. These methods may be applied to digital circuits, such as for converting elements from single gates to multiple-gate elements, and to analog circuits, such as for converting single transistors to multiple-transistor elements. The methods also may be applied to other types of devices, such as mixed signal devices, power circuit devices and microelectromechanical system devices, where the interpretation of the device elements may be focused on selected primary physical or electrical structures.

Figure 18:
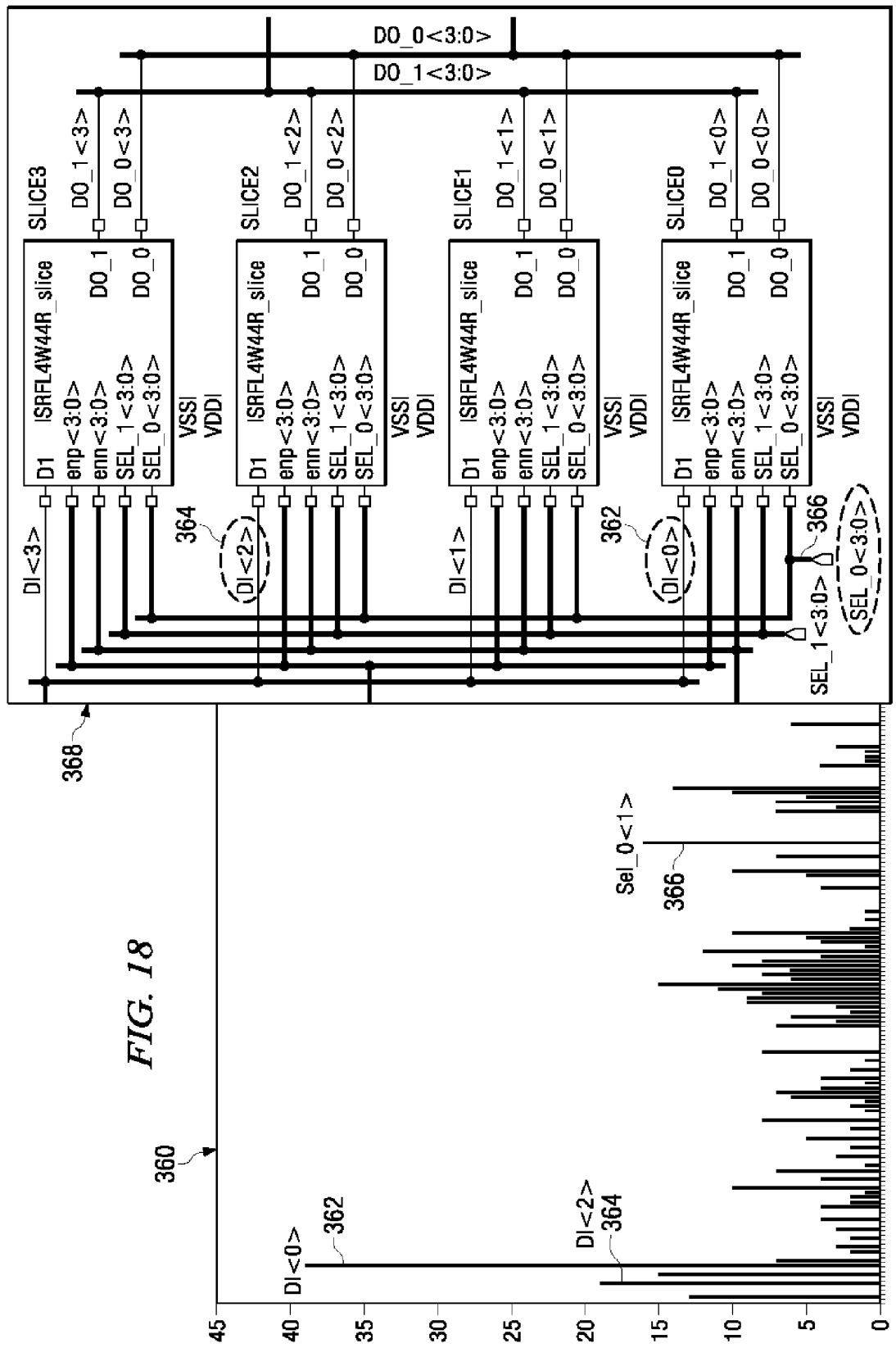
FIG. 18 is a histogram of popular nodes and the respective signals in a schematic diagram.

FIG. 18 illustrates the results of a netlist partition simulation for locating popular nodes in a circuit. Circuit 368 is partial schematic of an actual circuit with about 10K atomic elements represented in a planar netlist for testing a shortest path algorithm. Based on the planar netlist data, numerous shortest-path graph traversals are performed and tag value data is accumulated. Graph 360 illustrates a histogram of tag values for several nodes in the circuit. As can be seen in the graph, certain vertices, e.g., 362, 364 and 366, have higher tag values than other vertices. In the actual circuit 368 from which the netlist was derived, these vertices correspond to hierarchical nodes, in this case data bus and control signals. Again, it should be pointed out that the actual circuit 368 has been used in a planar netlist format so that nodes in the hierarchical representation of the circuit could be identified.

Figure 19:
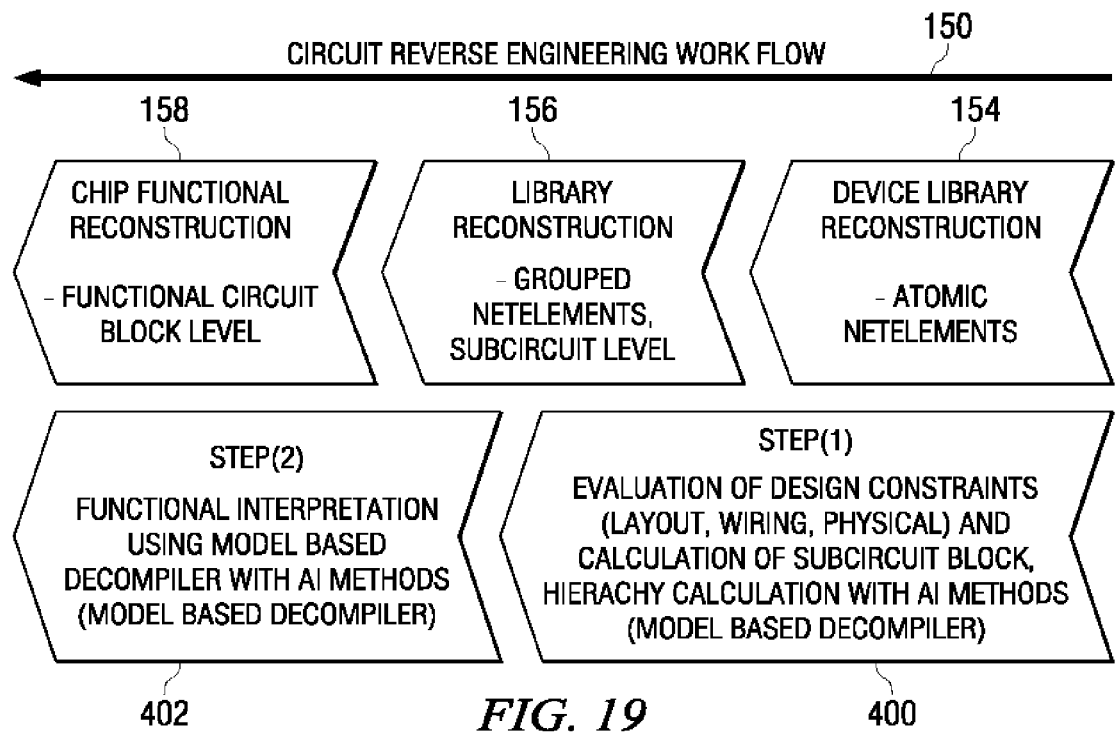
FIG. 19 is a flow chart of a circuit hierarchy and functional interpretation method.

In addition to directly analyzing the netlist, other aspects of the integrated circuit may be evaluated using artificial intelligence design constraint analysis to interpret the integrated circuit. In particular, various properties of the integrated circuit may be evaluated and used to determine levels of hierarchy and functions in the circuit using model-based decompilers. FIG. 19 again illustrates reverse engineering work flow 150, which starts with the low level layout extraction data and performs device library construction 154, then uses this information to perform grouped element library reconstruction 156, and then performs chip functional reconstruction 158. Artificial intelligence methods utilizing library search functions may be used in addition or alternatively to the graph compression methods. FIG. 19 also illustrates an embodiment comprising steps using artificial intelligence methods to evaluate and interpret the integrated circuit. The methods may include using a model-based decompiler to perform the evaluation and interpretation of the integrated circuit. In a first step 400, various design constraints of the integrated circuit are evaluated to determine a higher hierarchy description of the integrated circuit. In particular, layout, wiring, simulation and similar parameters of the integrated circuit may be evaluated to determine the structure and arrangement of subcircuit blocks and other components in the integrated circuit. In a second step 402, a model-based decompiler may be used to derive a functional interpretation of the subcircuit blocks and other hierarchy levels that were generated by the first step 400. These steps are discussed in further detail below.

Figures 20, 22:
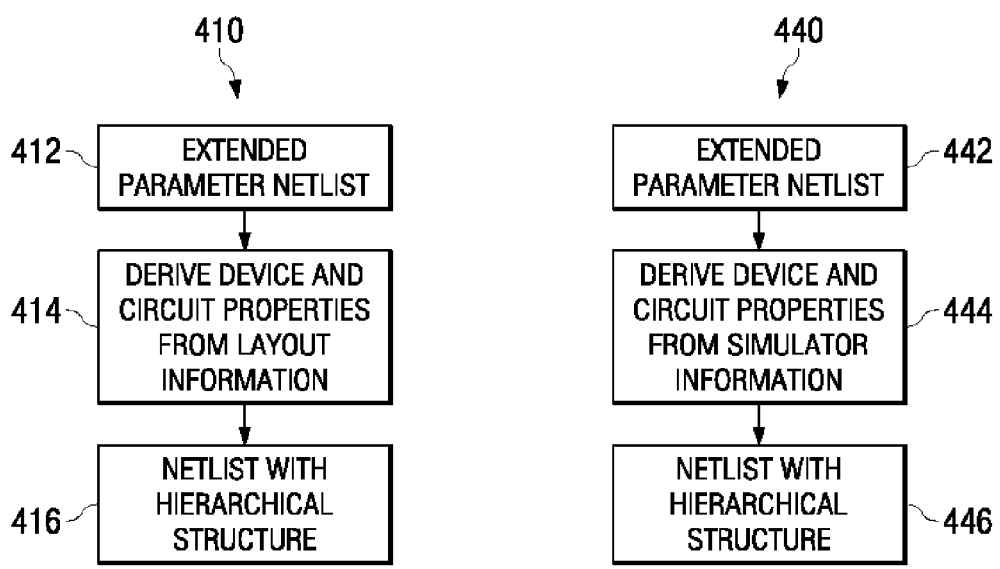
FIGS. 20-23 are flow charts of methods for generating netlists with hierarchical structures.

FIG. 20 illustrates a flow chart 410 for analyzing and expanding upon an extended parameter netlist. In step 412, the extended parameter netlist may be generated, for example, as previously described herein with respect to FIGS. 6A-6B. In step 414, the layout parameters of the circuit are analyzed based on parameters in the netlist and on additional parameters further derived from layout information from the physical chip. In step 416, the extended parameter netlist and the derived device and circuit information are used to transform the extended parameter netlist into a hierarchical netlist, representing the circuit at a higher level of abstraction.

There are many default values for the various properties of the devices that may be utilized in analyzing the integrated circuit. For example, during chip design, designers, for example, attempt to minimize long paths for critical signals; minimize chip area; minimize wires and spaces; place the same device types, e.g., minimal critical dimension metal oxide semiconductor (MOS) devices, close together on the silicon; lay out higher drive MOS devices as separate devices. Actual values for parameters for devices that can be determined, e.g., from the netlist or layout may be used, default values may be assumed for other devices, or a combination of the two may be used.

If the parameters or properties to be analyzed are represented as $X_i$, where i=1, 2 ..., N, then heuristic measurement functions may be used to determine hierarchical information about the circuit, for example, the probability that an element belongs to a subcircuit or module. That is, a heuristic function $h_i(e)=f_i(e)$ may be applied to the $X_i$ properties, where e is an element in the circuit and f(e) represents various probability functions. As an example, a hypothesis $h_i(e)$ may be set to 1 if the element is determined to belong to a subcircuit block, or to 0 if the element is determined to not belong to the subcircuit block. Other functions include f(geometrical distance between devices), f(routing distance), f(metal layer used for a signal) f(timing simulation properties) f(voltage simulation properties), f(cone structure properties), and the like. In addition to the above discrete function types, many other functions may be applied.

Each function generally has a cost or weight value that may be used in determining hierarchical characteristics of the integrated circuit. A closeness measure $d(h,E_i)=f(\alpha*h_1, \beta*h_2, \ldots)$ may be used to estimate how likely a candidate element $E_i$ is part of a hypothesis h. The closeness measure function $d(h,E_i)$ may be different for each module: M1 [$\alpha=\alpha_1, \beta=\beta_1, \ldots$]; M2 [$\alpha=\alpha_2, \beta=\beta_2, \ldots$]. Hypothesis generation thus may focus on elements with the best closeness measures among all external elements that are not part of the hypothesis, or, alternatively, exclude bad elements. In performing module or block identification, devices generally are placed close together by factors such as signal quality constraints, area optimization constraints, process parameter control constraints, chip production process constraints, and the like. Examples of different hypotheses that may be determined from the integrated circuit netlist, layout, or a combination thereof are:

h(1):=physical distance between two SPICE elements. This parameter may measure the direct Euclidean distance between the elements, and may be expressed in units of, e.g., micrometers;

h(2):=wire length at M1 between two SPICE elements. This parameter may measure the direct connection length, and may be expressed in units of, e.g., micrometers;

h(3):=wire length at M2+M3+M4. This parameter may measure the indirect connection length, and may be expressed in units of, e.g., micrometers. For this and the previous parameter, the rectilinear distance may be used if it is difficult to calculate the Euclidean wire distance;

h(4):=position of element E inside same bonding box at substrate-area. This parameter may be expressed in a true/false unit, and generally is not applicable if the relevant information is not available;

h(5):=element e is electrically needed for a circuit block. For example, an NMOS device generally needs a PMOS device for logic function definition;

h(6):=Element E is connected to same $V_{SS}$ or $V_{CC}$ branch. This parameter may be expressed in a true/false unit;

h(7):=Element E is connected to same clock tree branch. This parameter may be expressed in a true/false unit;

h(8):=drives between blocks indicate a module output;

h(9):=elements between registers/flip flops indicate a module output;

h(8):=stage inverters to minimize capacitance indicate a module input;

h(9):=wiring gravity of a module. When most of the connections of a module's elements are to other elements within the same module, then the external connections generally are input/output/power source/clock.

Figure 21:
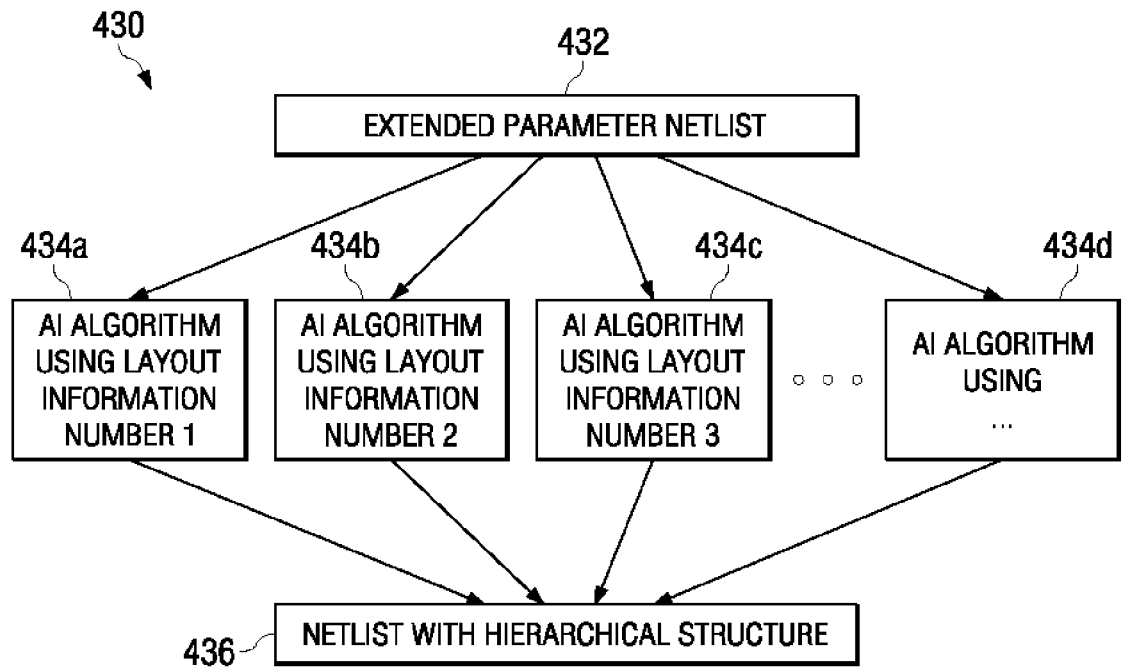

FIG. 21 illustrates a flow chart of another embodiment for generating a hierarchical netlist 431 from an extended parameter netlist 432. In this embodiment, various different algorithms 434, each operating on a subset of the device and circuit properties, may be executed. One, more than one, or all of the algorithms 434 may be selected in generating the hierarchical netlist. Thus, only a subset of the integrated circuit properties may be selected and used. For example, a hypothesis search may include h=f (physical distance between two devices; M1 wire length; M2 . . . MX wire length; connection to ($V_{CC}$, $V_{SS}$); device type, connected device types), such that only a subset of the device and circuit properties are utilized.

In another embodiment, FIG. 22 illustrates flow chart 440 for analyzing and expanding upon an extended parameter netlist. In step 442, the extended parameter netlist may be generated, for example, as previously described herein with respect to FIGS. 6A-6B. In step 444, simulation-related parameters of the circuit are analyzed based on parameters in the netlist and on additional parameters further derived from simulation of the chip's circuitry. Simulation parameters may include those generated by timing analysis, delay propagation analysis (e.g., T sweep), sensitivity analysis (e.g., voltage sweep), and the like. In step 446, the extended parameter netlist and the derived behavioral device and circuit information are used to transform the extended parameter netlist into a hierarchical netlist, representing the circuit at a higher level of abstraction.

Figure 23:
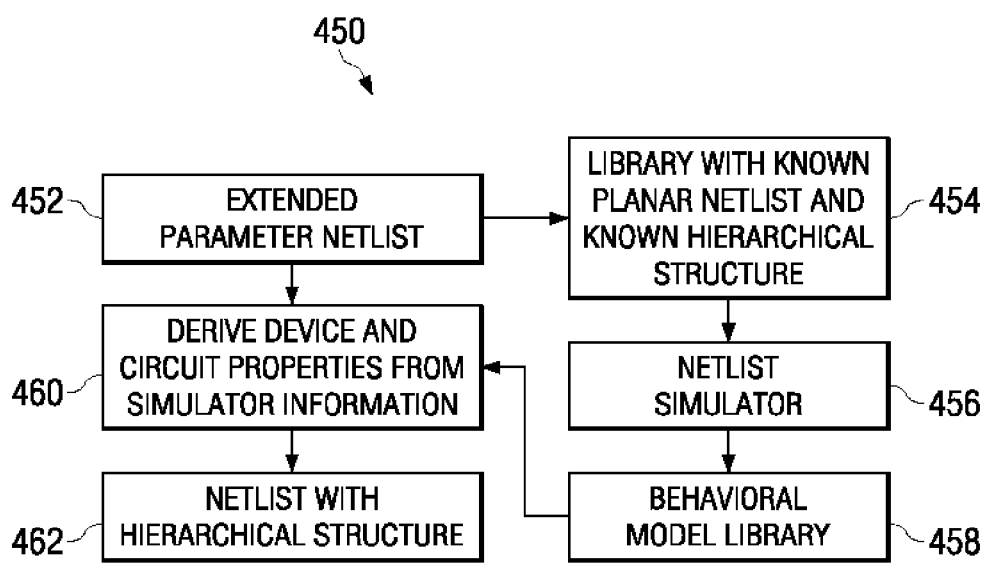

FIG. 23 illustrates another embodiment flow chart 450 utilizing simulator information to generate a hierarchical netlist from an extended parameter netlist. In step 452, the extended parameter netlist may be generated, for example, as previously described herein with respect to FIGS. 6A-6B. As discussed previously, the extended parameter netlist is used in step 454 to derive a library of elements at a higher level of abstraction, thus generating a description of the integrated circuit with a known planar netlist and a known hierarchical structure. The higher abstraction level description is provided in step 456 to a netlist simulator that determines behavioral aspects of the devices and circuits in the description. Simulation parameters may include those generated by timing analysis, delay propagation analysis (e.g., T sweep), sensitivity analysis (e.g., voltage sweep), and the like. In step 460, simulation-related parameters of the circuit are analyzed based on parameters in the netlist and on the behavioral model library parameters generated in step 458. In step 462, the extended parameter netlist and the derived behavioral device and circuit information are used to transform the extended parameter netlist into a hierarchical netlist, representing the circuit at a higher level of abstraction.

Figure 24:
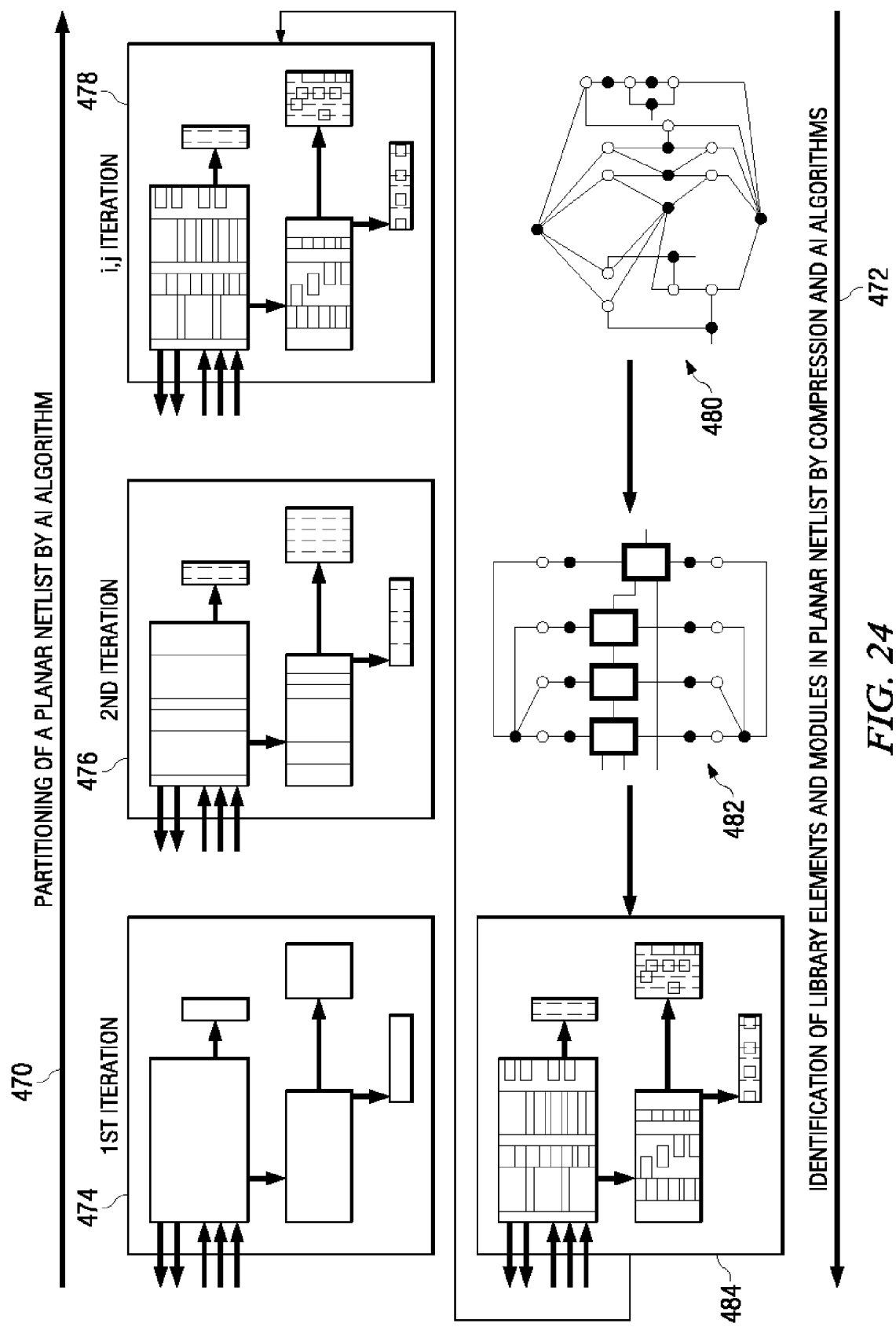
FIG. 24 is a graphical representation of a combination of netlist compression and netlist partition methods.

The various embodiments disclosed herein may be combined when performing reverse engineering analysis of an integrated circuit. For example, as shown in FIG. 24, netlist partitioning 470 and netlist compression 472 may be synergistically combined to determine the higher level functionality of an integrated circuit. As previously discussed, netlist partitioning 470 may utilize a shortest path algorithm to determine power signals and high level inter-module signals, and thus determine the boundaries between high level modules, as shown in step 474. Once the high level modules are located, nodes within each module may be analyzed with the shortest path algorithm, as shown in step 476 to determine circuit blocks within each module. This process may be repeated as many times as desired, as shown in step 478, to locate and delineate smaller subcircuit blocks within the circuit blocks, etc.

In conjunction with performing netlist partitioning 470, netlist compression 472 also be performed as previously discussed. In netlist compression 472, the netlist of step 480 may be analyzed to determine and locate similar higher-level components in the netlist. For similar element configurations, distances and paths, higher-level library elements may be created and replaced with the library components, as shown in step 482. This process may be repeated for higher levels of library components, as shown in step 484. In addition or alternatively, the hypothesis search method may be used to derive the higher hierarchy level description of step 484 from the library component-level description shown in step 482. Once the circuit representations of the netlist partition algorithm 470 and the netlist compression/hypothesis search algorithms 472 are generated, they may be reconciled and a combined with each other to generate a high-level hierarchy representation of the integrated circuit.

Figure 25:
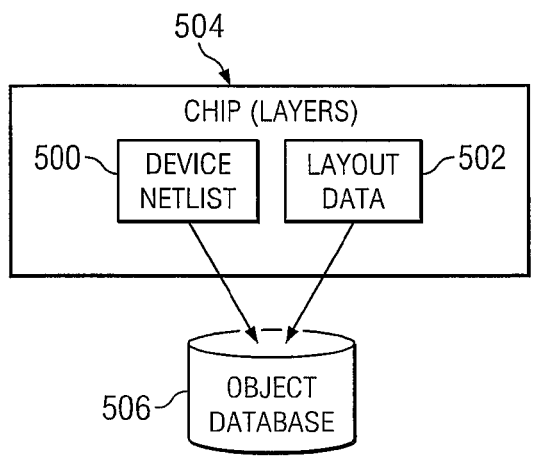
FIG. 25 is a block diagram showing object database generation from a chip netlist and layout data.

FIG. 25 illustrates the generation of a planar netlist 500 and layout-related data 502 derived from chip layer images 504. The planar netlist 500 and the layout-derived data 502 are both combined to generate an object database 506 for a simplified netlist of the integrated circuit. Again, the simplifications are introduced by using default parameters for the devices found in the physical images. In assigning parameter values, various physical constraints may be simplified or ignored. For example, metal wires may be represented by simple lines. While the data generated generally will not be sufficiently detailed for fabricating an integrated circuit (i.e., the data generally will not be a full GDSII data file), the data generally is sufficient for abstracting the circuit to a higher level of hierarchy.

The data extracted from the layout images and stored in the object database may contain various types of parameters and fields. Certain parameters may be defined during initialization of the database, such as default values for the different objects in the database. Default values for objects such as an NMOS transistor may include layer name, drawing color, Spice parameter set, etc. The fabrication technology also may be defined during initialization. Technology parameters may include, for example, the number of layers, layout dimensions, routing options (e.g., an electrical contact will be given by an overlay M1 & VIA 1). Other data stored in the database may include, for example, position of Spice and wiring objects, data fields for signals names and pins and other supporting object data. For modules that are created, for example, through the circuit hierarchy model algorithm, data stored in the database may include the hierarchical information describing the modules, submodules, and subcircuits.

Preferably, to extract circuit object data from the layout images, the method differentiates between Spice (active, passive) components and objects used for wiring or other purposes (e.g., metal-lines, pads, guard rings, etc.). Generally, a simplified version of the layout data is sufficient. Therefore, for example, the exact transistor shape generally is not necessary, nor is the exact number of vias needed. The Spice device type and other object types may be determined during the digitizing process. Automatic line tracking also may be performed by the image recognition software. Examples of the digitizing process for various elements in the captured image layout data are provided below.

Figure 26B:
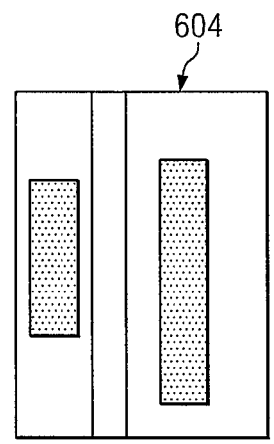
FIGS. 26A-26B are graphical representations of different active circuit elements.
Figure 26A:
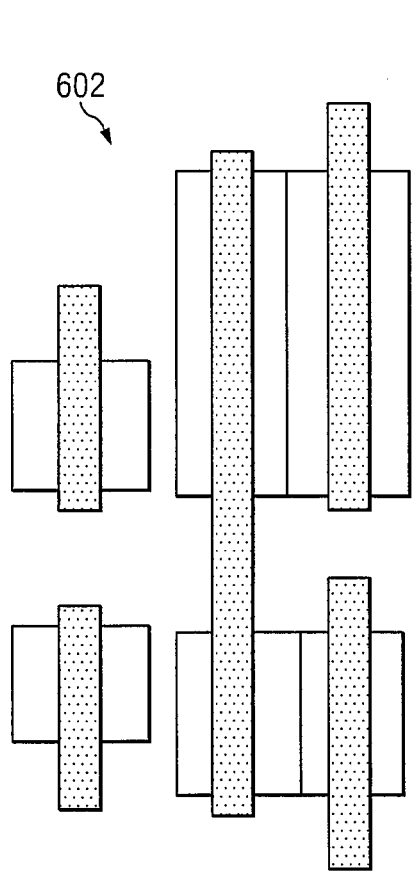
Figure 26A:
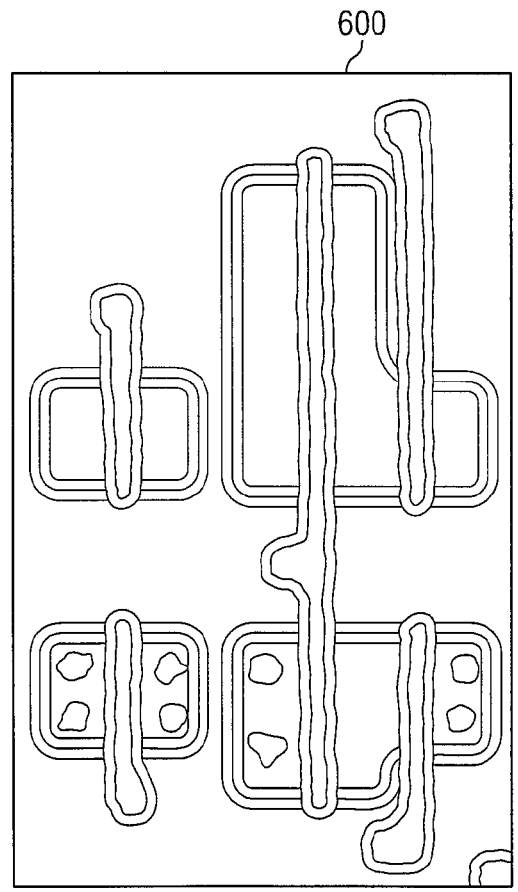

FIG. 26A illustrates a digitizing process for active devices such as complementary MOS (CMOS) transistors. The plan view of the elements 600 from one or more captured layout images are digitized to create the simplified element objects 602 representing the actual elements 600. Parameters that may be extracted from the layout include gate length L and gate width W, which are useful for evaluating the function of the circuit in subsequent steps the reverse engineering process. Other useful parameters that may be assigned default values include model name, drain diffusion area (AD), source diffusion area (AS), drain diffusion periphery (PD), and source diffusion periphery (PS).

FIG. 26B illustrates a digitizing process for other active devices such as bipolar transistors. A bipolar transistor found in the captured layout images is digitized to create the simplified element objects 604 representing the actual bipolar transistor. Parameters that may be extracted from the layout include dimensions of the base, collector and emitter regions.

Other useful parameters that may be assigned default values include the model name.

Figure 27A:
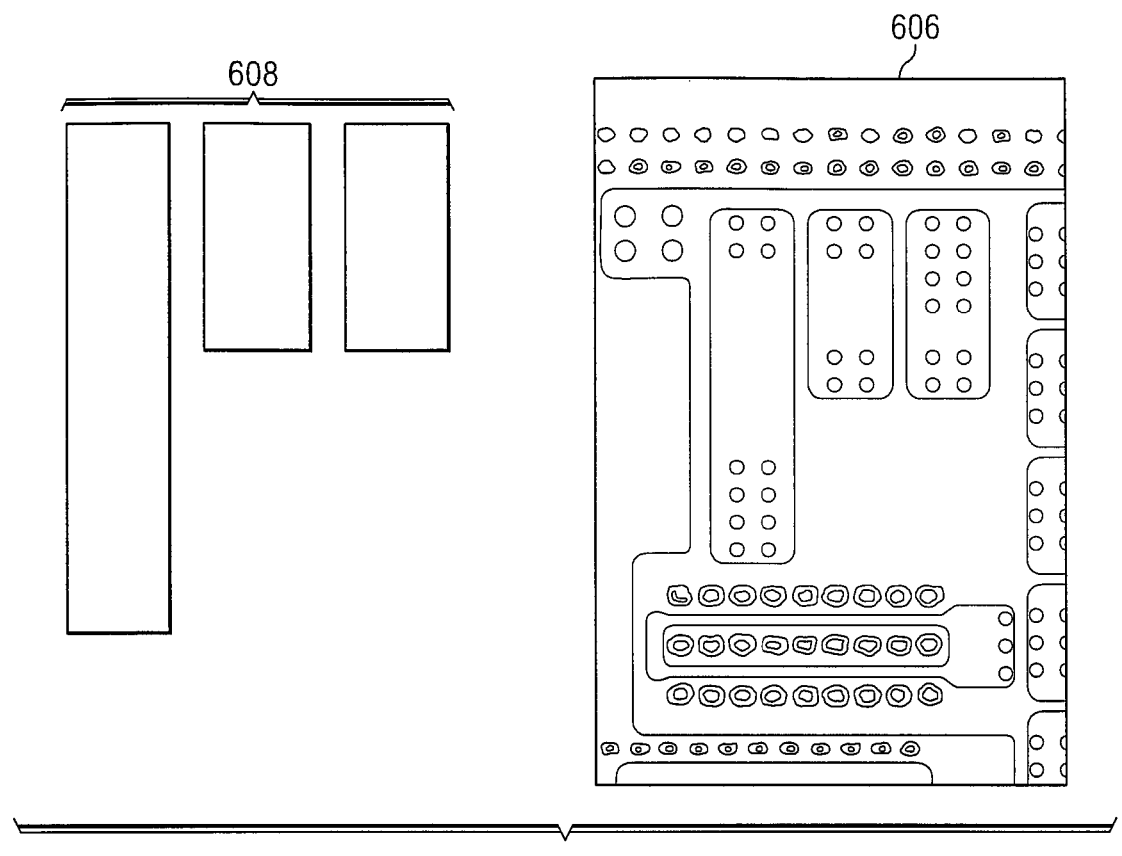

FIG. 27A illustrates a digitizing process for passive devices such as resistors. The plan view of the elements 606 from one or more captured layout images are digitized to create the simplified element objects 608 representing the actual elements 606. The lower left and upper right object boundaries may be used to define a rectangular object. More complex object shapes may be represented by several boxes. Parameters that may be extracted from the layout include length L, width W and depth D. Other useful parameters that may be assigned default values include model name, and resistance value (R). The resistance value may be derived from layer thickness, sheet resistance defaults or a doping evaluation.

Figure 27B:
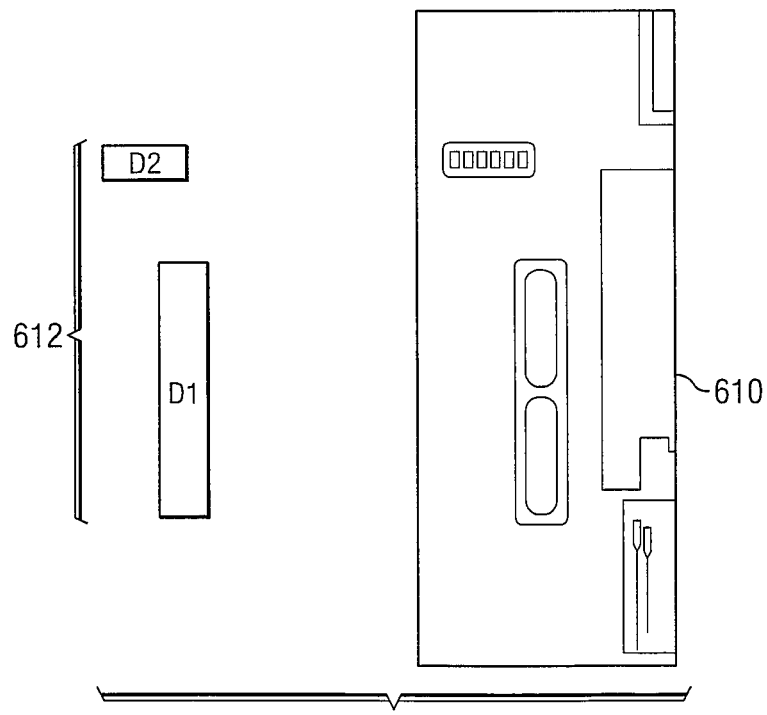

FIG. 27B illustrates a digitizing process for passive devices such as diodes. The plan view of the elements 610 from one or more captured layout images are digitized to create the simplified element objects 612 representing the actual elements 610. The lower left and upper right object boundaries may be used to define a rectangular object. Parameters that may be extracted from the layout include dimensions of the anode and cathode regions. Other useful parameters that may be assigned default values include the model name.

FIG. 27C illustrates a digitizing process for passive devices such as capacitors. The plan view of the elements 614 from one or more captured layout images are digitized to create the simplified element objects 616 representing the actual elements 614. The lower left and upper right object boundaries may be used to define a rectangular object. More complex object shapes may be represented by several boxes. Parameters that may be extracted from the layout include length L, width W and dielectric thickness. Other useful parameters that may be assigned default values include model name, and capacitance value. The plate distance may be derived from an SEM cross section during technology evaluation. Generally, in contrast to layout verification software, metal-insulator-metal capacitor structures are not identified by the layout properties themselves; instead, a capacitor element is added to the database. Furthermore, parasitic elements generally are ignored for simplification.

Figure 27D:
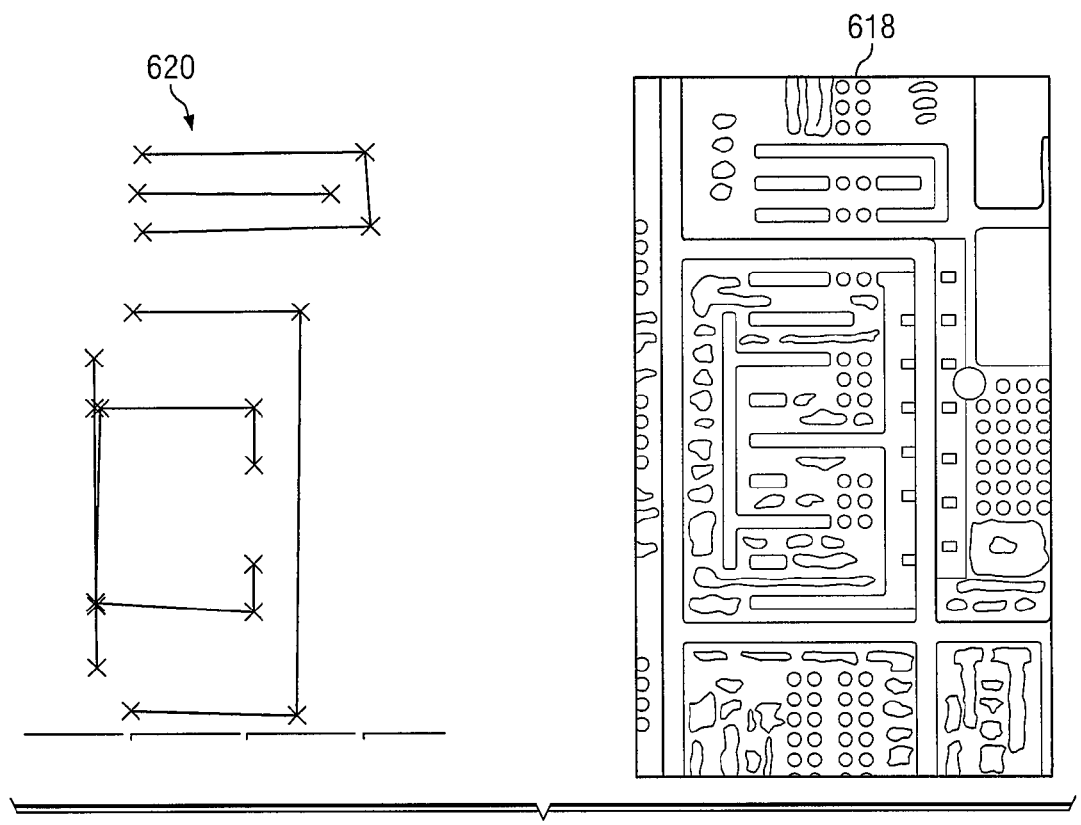
Figure 27E:
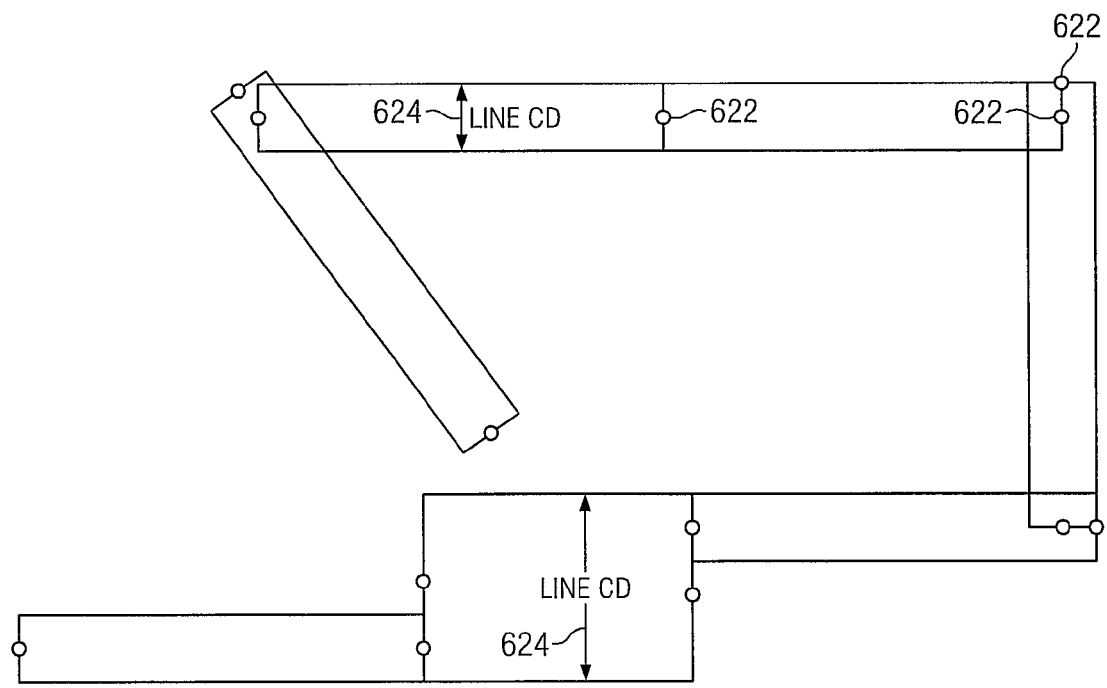

FIG. 27D illustrates a digitizing process for circuit wiring. The plan view of the elements 618 from one or more captured layout images are digitized to create the simplified element objects 620 representing the actual elements 618. The starting and ending points of a line may be represented by center of line lower left and upper right object boundaries. Parameters that may be extracted from the layout include line size, which generally is derived from the CD value of the line. FIG. 27E illustrates the parameters for wiring in more detail, where the starting and ending points 622 are shown for various line segments, while different line size values are shown by different line CDs 624. Generally, for wires, and for vias described below, the resistance is assumed to be zero, the maximum current density j=I/A, and parasitic capacitance is assumed to be zero for simplification.

Figure 27F:
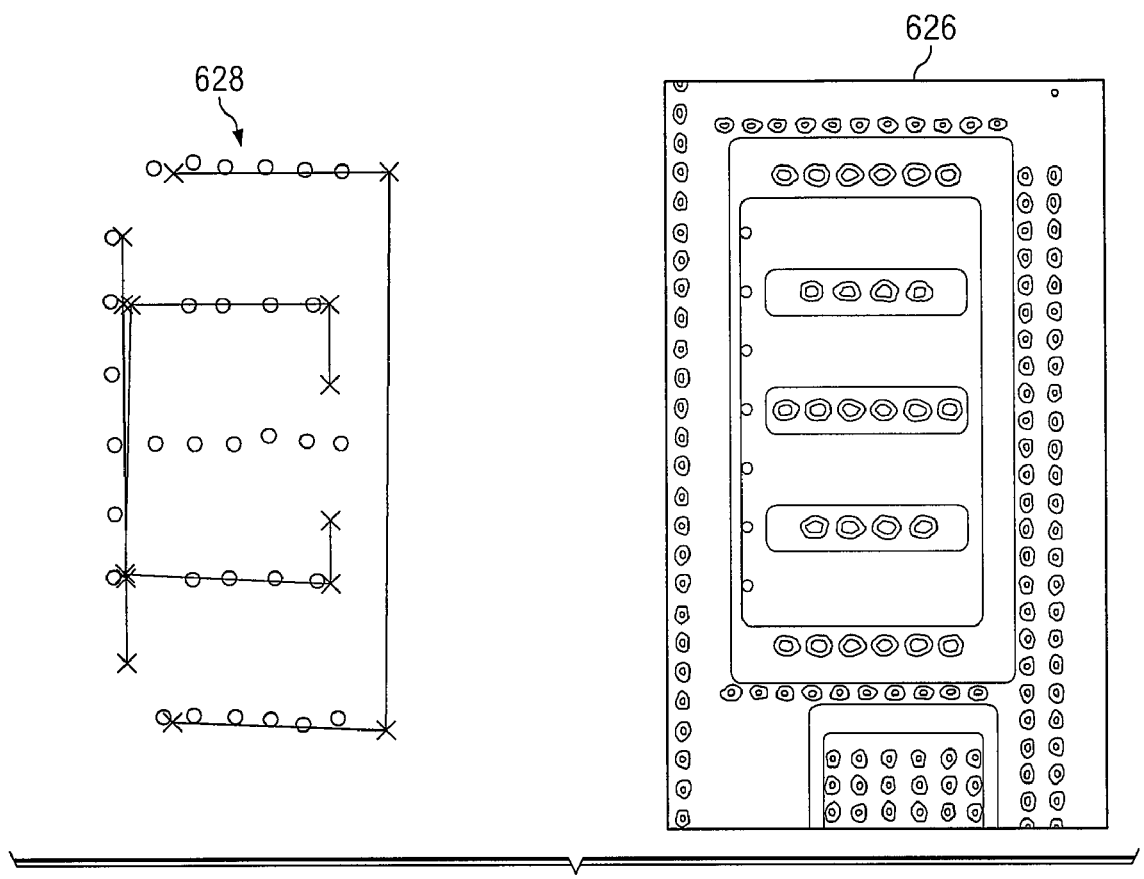
Figure 27G:
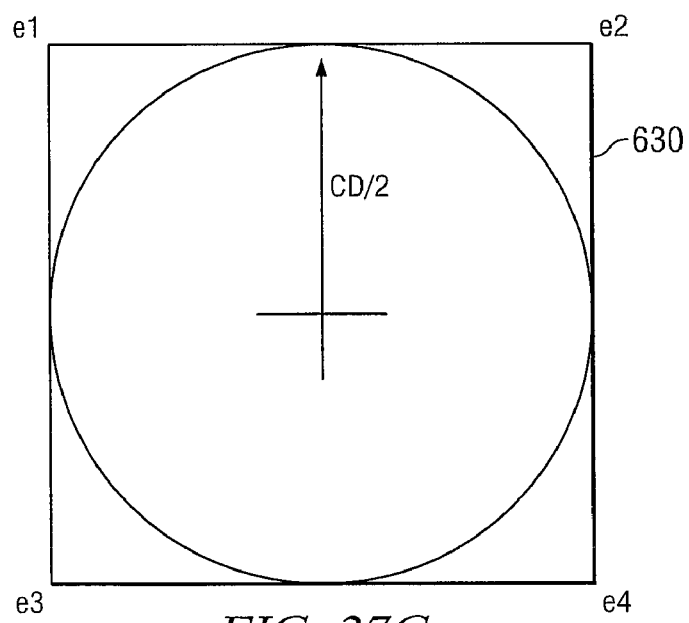
Figure 27H:
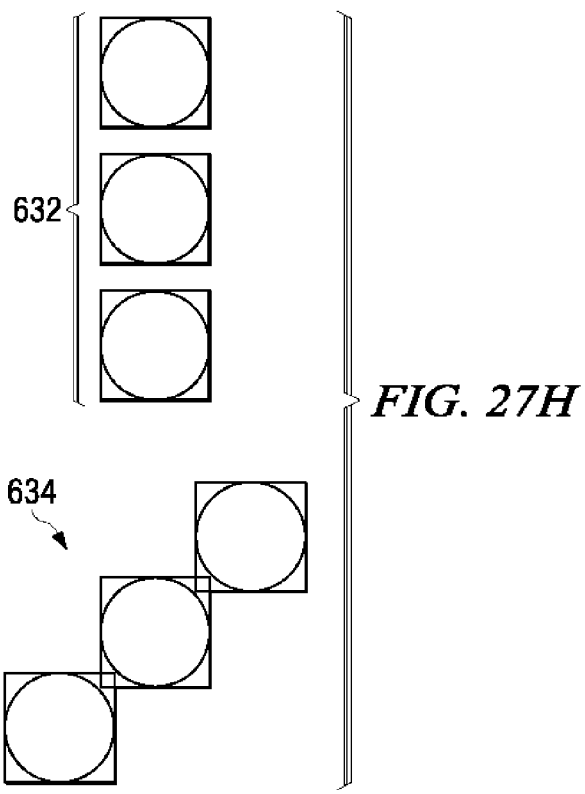

FIG. 27F illustrates a digitizing process for vias. The plan view of the elements 626 from one or more captured layout images are digitized to create the simplified element objects 628 representing the actual elements 626. The contacts may be represented by a single center point. Parameters that may be extracted from the layout include contact size, which generally is derived from the CD value of the contact. In some embodiments, only one contact out of a multi-contact structure may need to be digitized. FIG. 27G illustrates the radius for a contact 630 is CD/2, which assists in determining the contact area. Different definitions generally are used for pass and fail contacts to properly represent their respective functionality. As shown in FIG. 27H, the contacts 632 in different layers are overlying each other, and thus would be described with pass contact definitions. On the other, the contacts 634 in different layers are not sufficiently overlying each other, and thus would be described with fail contact definitions.

Figure 27I:
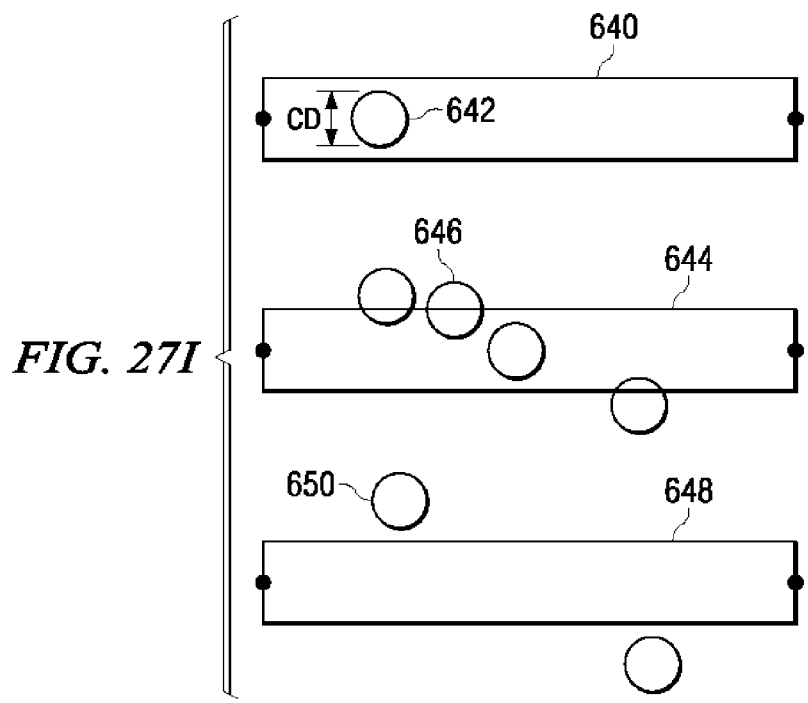
Figure 27J:
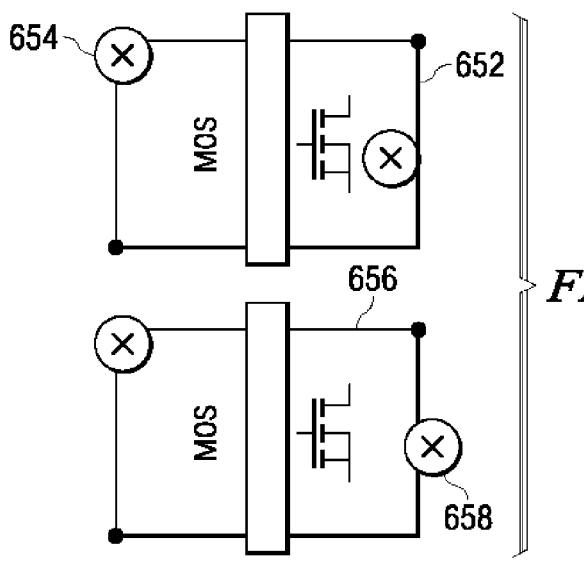

FIG. 27I illustrates the layout relationship between contacts and wires. After the elements are located and positioned with respect to each other, the elements may be compared to determine whether the contacts are defined as pass or fail contacts. Wire 640 and contact 642 illustrate optimal alignment. For wire 644, the contacts 646 are at least partially overlapping the line, so the contacts are defined as pass contacts. For wire 648, the contacts 650 do not overlap the line at all, so the contacts 652 are defined as fail contacts. FIG. 27J illustrates the layout relationship between contacts and Spice objects. After the elements are located and positioned with respect to each other, the elements may be compared to determine whether the contacts are defined as pass or fail contacts. For object 652, the center of contacts 654 are overlapping the appropriate regions of the object 652, so the contacts are defined as pass contacts. For object 656, the center of contacts 658 do not overlap the appropriate regions of object 656, so the contacts 658 are defined as fail contacts. Note that the pass/fail condition is different from the pass/fail condition utilized during the wafer fabrication process.

Figure 27K:
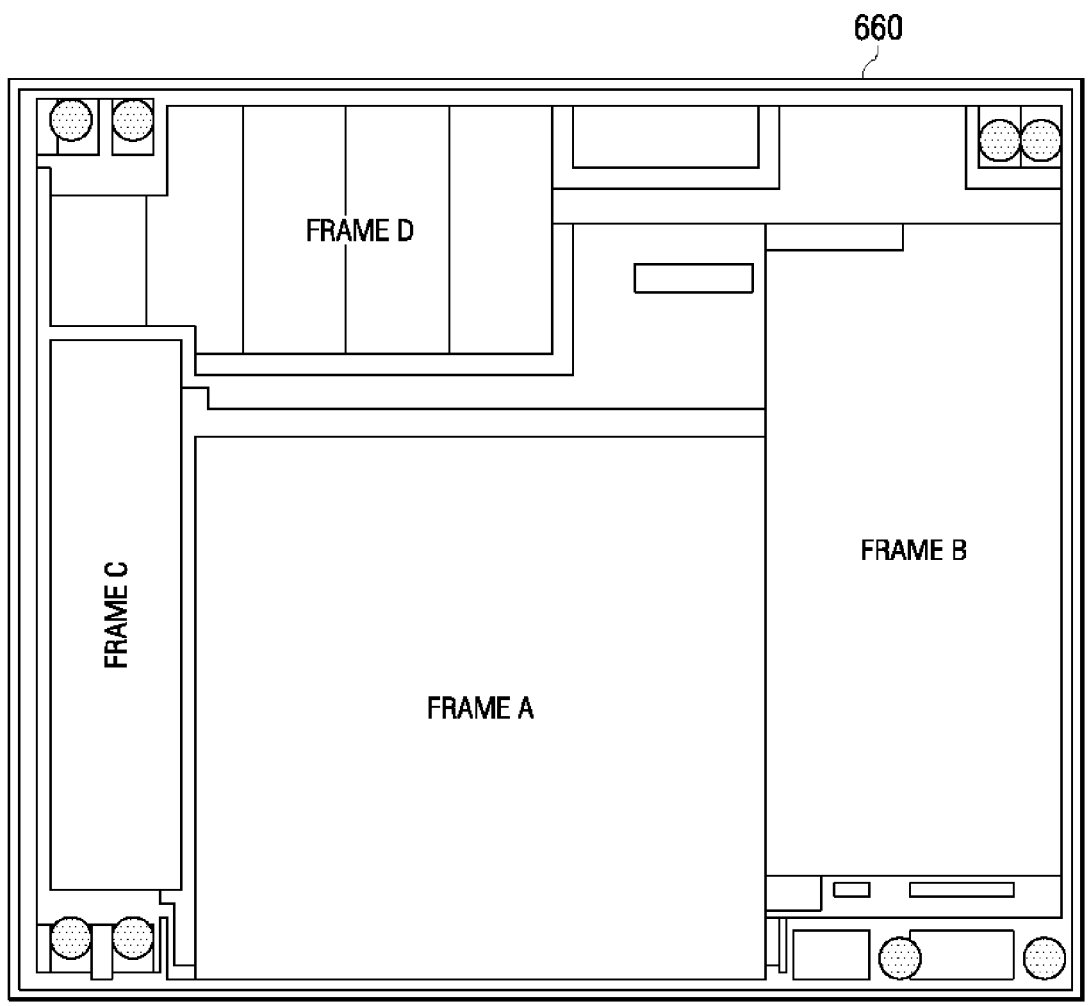
Figure 27L:
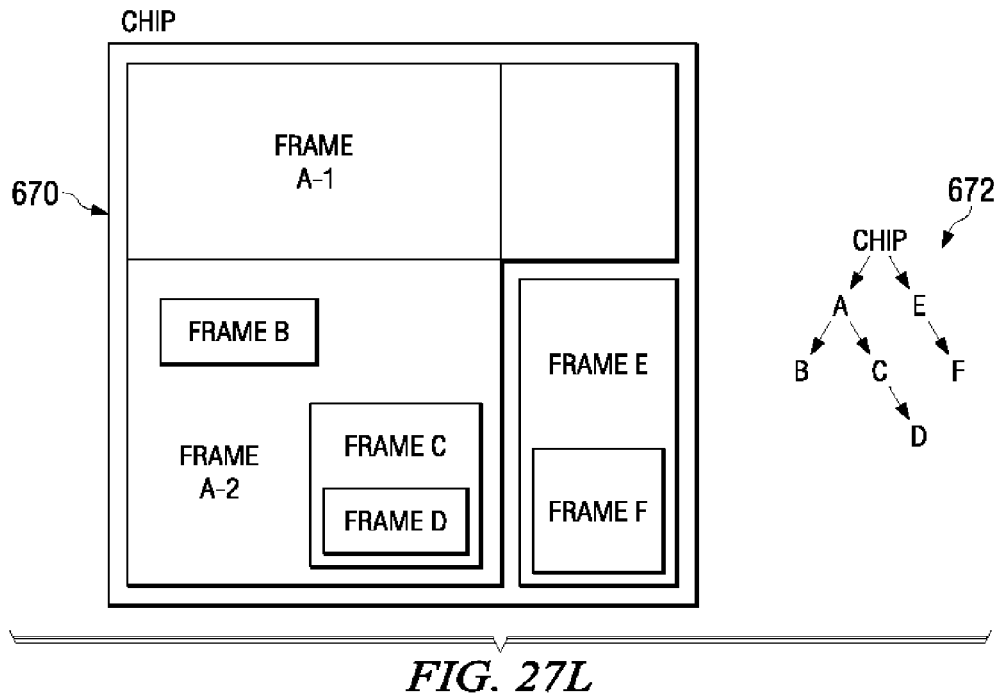

FIG. 27K illustrates a digitizing process for frames in the integrated circuit. The frames describe the silicon surface area usage of the different blocks of the integrated circuit. The plan view of the integrated circuit 660 shows that there are several frames, A, B, C and D, readily extractable from the integrated circuit layout. In FIG. 27L, various frames of an example integrated circuit 670 have been digitized. The lower left and upper right object boundaries may be used to define each rectangular object. More complex object shapes may be represented by several boxes. In the Figure, Frame A consists of two frames, Frame A-1 and Frame A-2. Frames B and C are located inside Frame A, Frame D is located inside Frame C, and Frame F is located inside Frame E. For Frames B and C, the Next Higher Assembly is defined as Frame A. For Frame D, the Next Higher Assembly is defined as Frame C. For Frame F, the Next Higher Assembly is defined as Frame E. This hierarchical structure is shown by the tree 672 in FIG. 27L.

Figure 28:
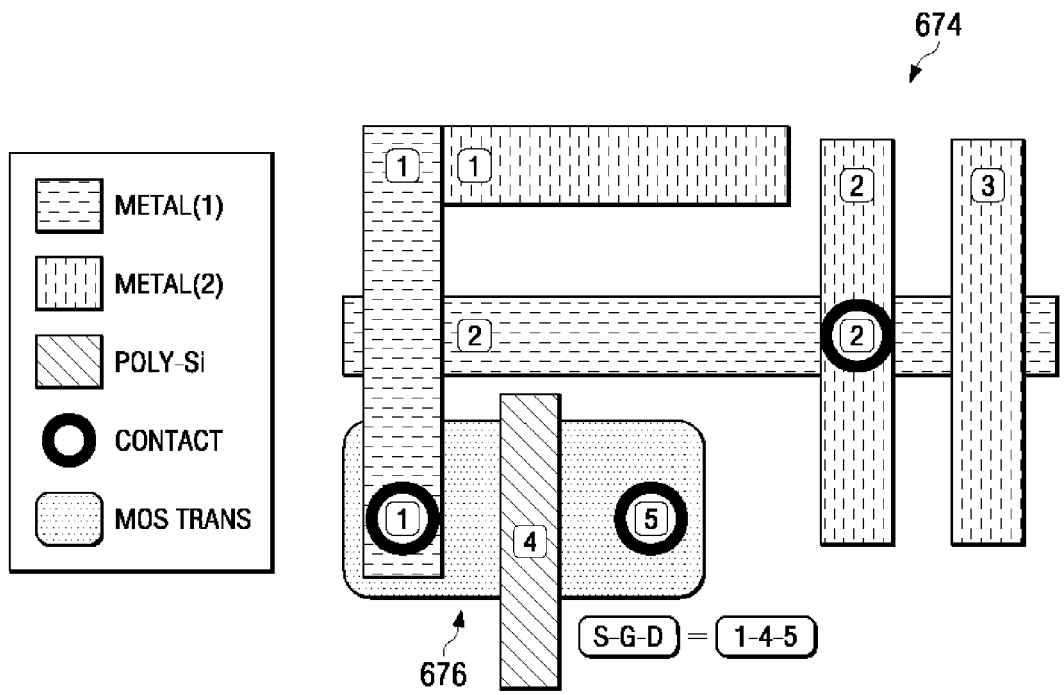
FIG. 28 is a graphical representation of a circuit element and wiring.

FIG. 28 illustrates a process for signal generation for the integrated circuit based on netlist and layout data. Generally, all of the wire and contact data is tracked, and signal names are assigned for connected lines, and to the signals are assigned to elements in the circuit, such as transistors, resistors, capacitors, etc. Specifically, a different signal number is assigned for independent non-spice objects, such as wires and vias. As shown for the circuit portion 674 in FIG. 28, each wire, contact, and other connections, such as a gate, that are connected together are assigned the same signal number (e.g., 1, 2, 3, 4, 5). In addition, signal numbers are assigned to the pins of Spice objects in the circuit, and overlap between the Spice and non-Spice objects is checked. As shown in FIG. 28, the source, gate and drain of transistor 676 overlap with signals 1, 4 and 5, respectively, and thus may be assigned the same signal numbers. In the object data base, a Spice object may represented by one record. A maximum number of pins may be set, e.g., to four, where each defined pin has a signal, while the device itself does not have a signal. For wiring objects in the database, they also may be represented by one record. A wiring object has one signal, and does not have any pins or any Spice parameter. A frame object also may be represented by one record in the database. The frame objects provide information about possible subcircuit block, module and other hierarchy information.

Figure 29:
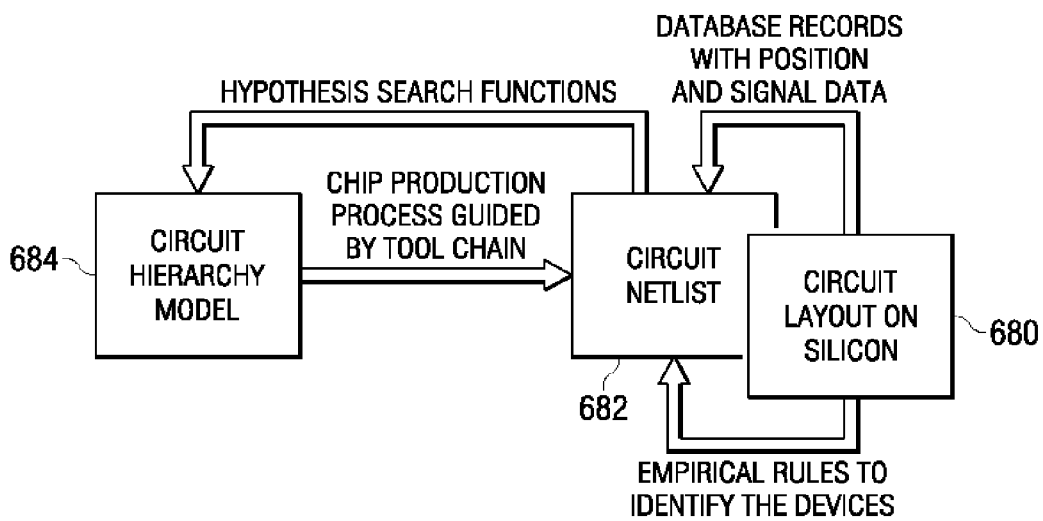
FIG. 29 is a flow diagram of a circuit hierarchy model generated from netlist and layout data.

With respect to circuit hierarchy modeling, FIG. 29 shows the relationship between the circuit layout 680, the circuit netlist 682 and the circuit hierarchy model 684. Starting with the circuit layout 680, database records with element position and signal data, as well as empirical rules for identifying devices, are both used to generate the circuit netlist 682. Hypotheses search functions are then used on the circuit netlist 682 to generate an initial pass of the circuit hierarchy model 684. Information about the chip production process, guided by the tool chain for the specific technology, may be used, along with other information derived from the initial hierarchy model, such as simulation information, may be used to reiterate the process. Generally, the more hypotheses search functions used, the better the combined results of the overall process. In addition, the result of any single function for a single element may be incorrect, but the search functions for most of the elements should be correct.

Figure 30A:
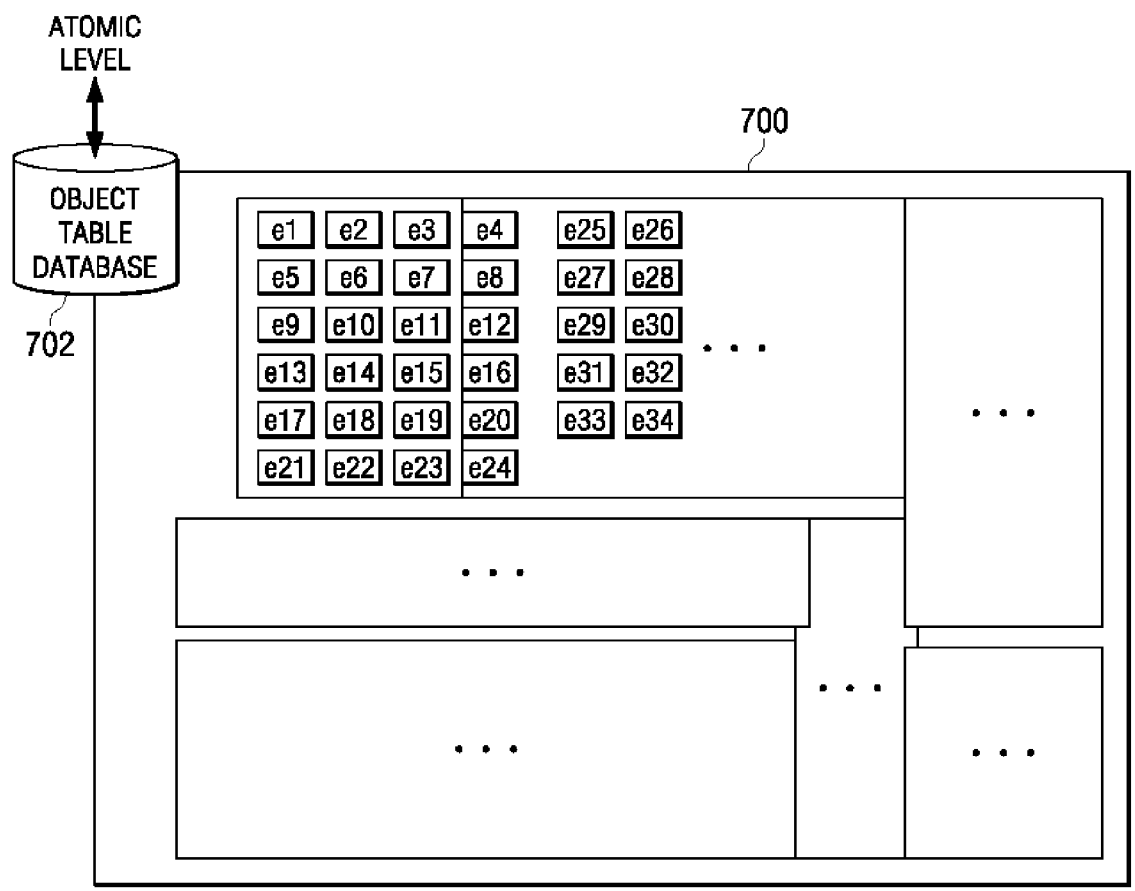
FIGS. 30A-30C are block diagrams of an integrated circuit showing device, module and library generation for an integrated circuit.
Figure 30B:
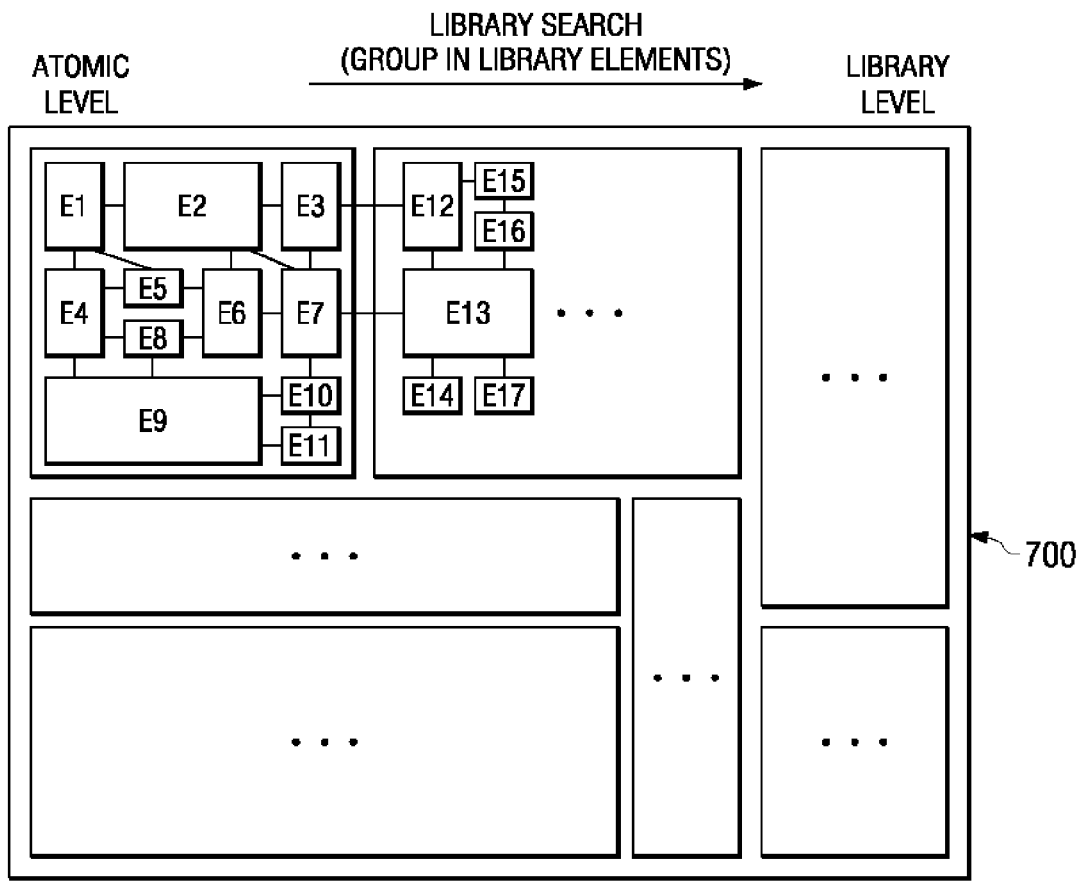
Figure 30C:
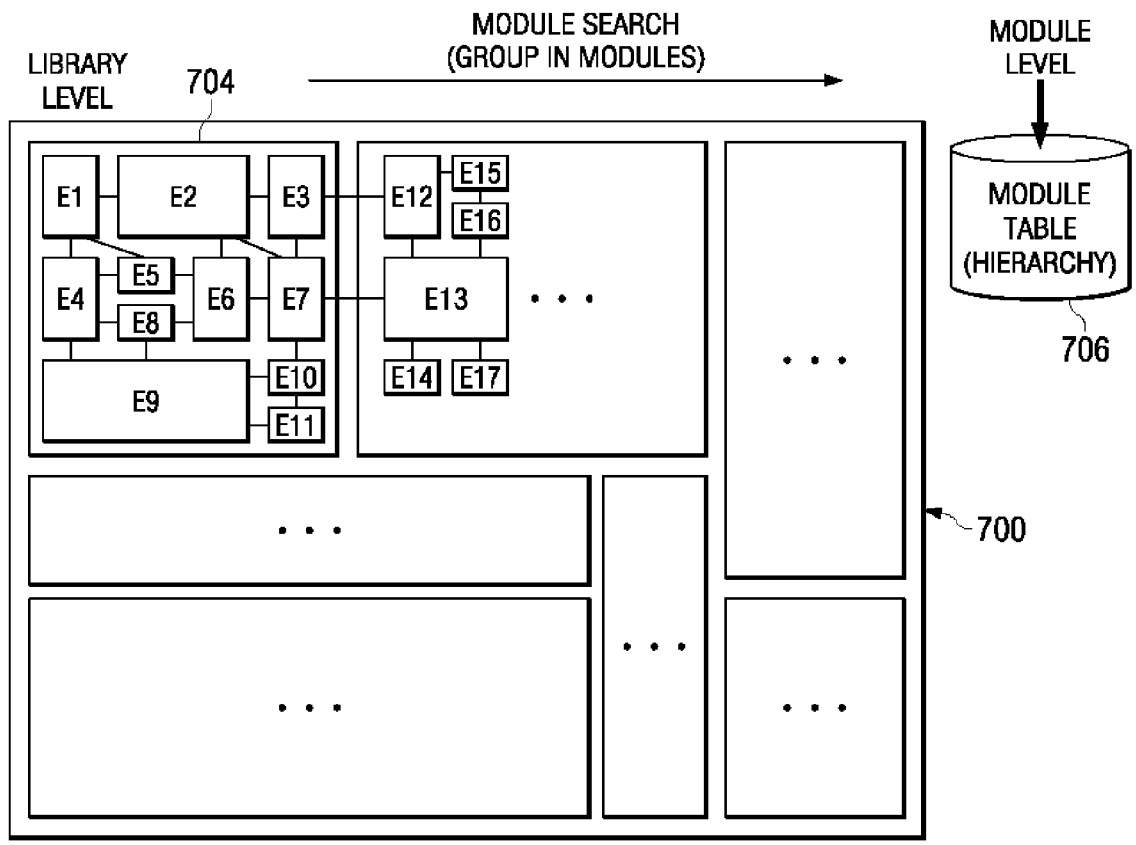

FIGS. 30A-30C illustrate the process of generating a module hierarchy table database from an object table database using hypotheses searching. FIG. 30A illustrates the atomic level elements, e1, e2, etc., identified from layout extraction information of integrated circuit 700. The atomic level elements are stored in an object table database 702.

In FIG. 30B, a first set of hypotheses search functions are executed to locate groups of atomic elements that may be combined to form higher level group library elements. In performing these searches, various hypotheses may be used to locate higher level elements. For example, single elements may be compared to a list of known standard element or circuit patterns, such as series and parallel transistor connections, logic gate patterns, diodes (e.g., gate and drain connected), parallel & serial capacitors, parallel & serial resistors, parallel transistors (L, W1+W2), inverters, buffers, etc. One of the goals of this level of search is to place the data in better format for the subsequent module search to increase the probability of obtaining a valid module hypothesis. That is, the data complexity or the graph size may be reduced, resulting in reduced calculation time. For example, the mid-level search may attempt to minimize the number of elements, add information useful for the module search (e.g., describing, when possible, the known elements). Once the groups, E1, E2, etc., are obtained, they are stored in a mid-level library table database.

A module search then is performed, as shown in FIG. 30C. Similar techniques may be used to locate a valid module hypothesis for each potential module in the integrated circuit 700. New elements may be added or removed from the hypothesis depending on their closeness to the module. Once a module 704 is found, the hierarchical data for it may be stored in a module hierarchy table database 706. This process may be repeated for other potential modules in the integrated circuit 700. The data may be stored in token-based object oriented language format, such as XML, as shown below.

Figure 31A:
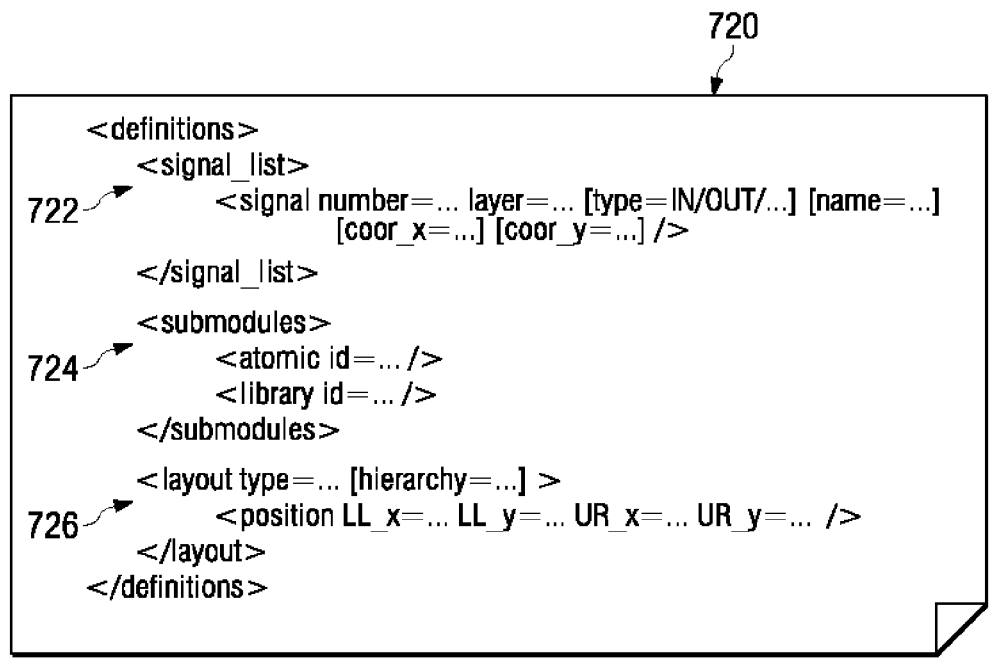
FIGS. 31A-31C are diagrams of portions of XML netlist descriptions.
Figure 31B:
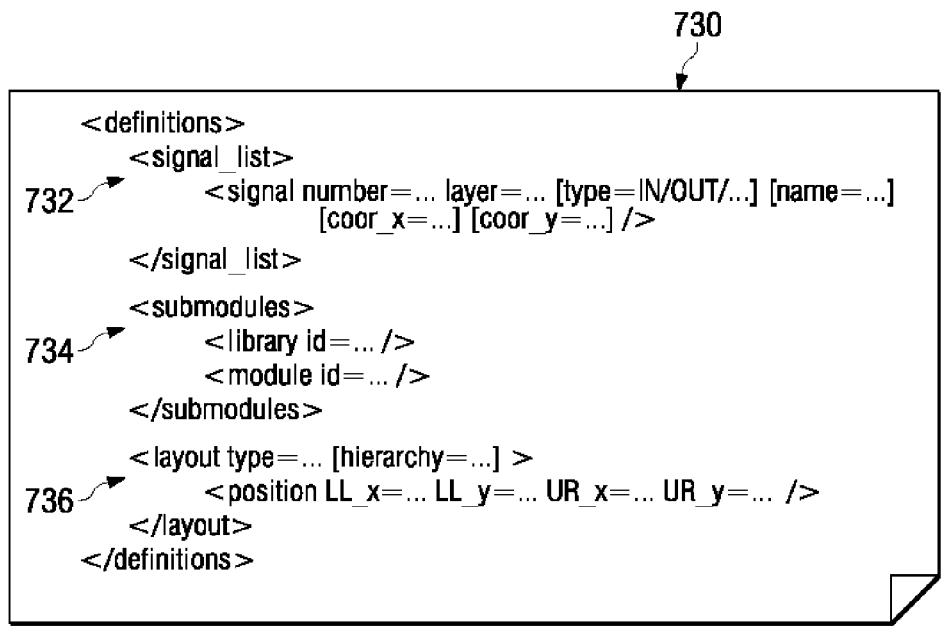

An example library device level object definition 720 in XML format is shown in FIG. 31A. Each library device object found in the integrated circuit may be represented by one record in the device library table. Standard fields may be used for the index, device name and comments. In library device definition 720, signal descriptions 722 provide information about the signals connected to the device, included elements 724 provide information about atomic level and device level objects included in the device, and layout properties 726 provide information about layout-related features for the device. At a higher level of hierarchy, an example module level object definition 730 in XML format is shown in FIG. 31B. Each module object found in the integrated circuit may be represented by one record in the module table. Standard fields may be used for the index, module name and comments. In module definition 730, signal descriptions 732 provide information about the signals connected to the module, included devices 734 provide information about device level and module level objects included in the module, and layout properties 736 provide information about layout-related features for the module.

Figure 31C:
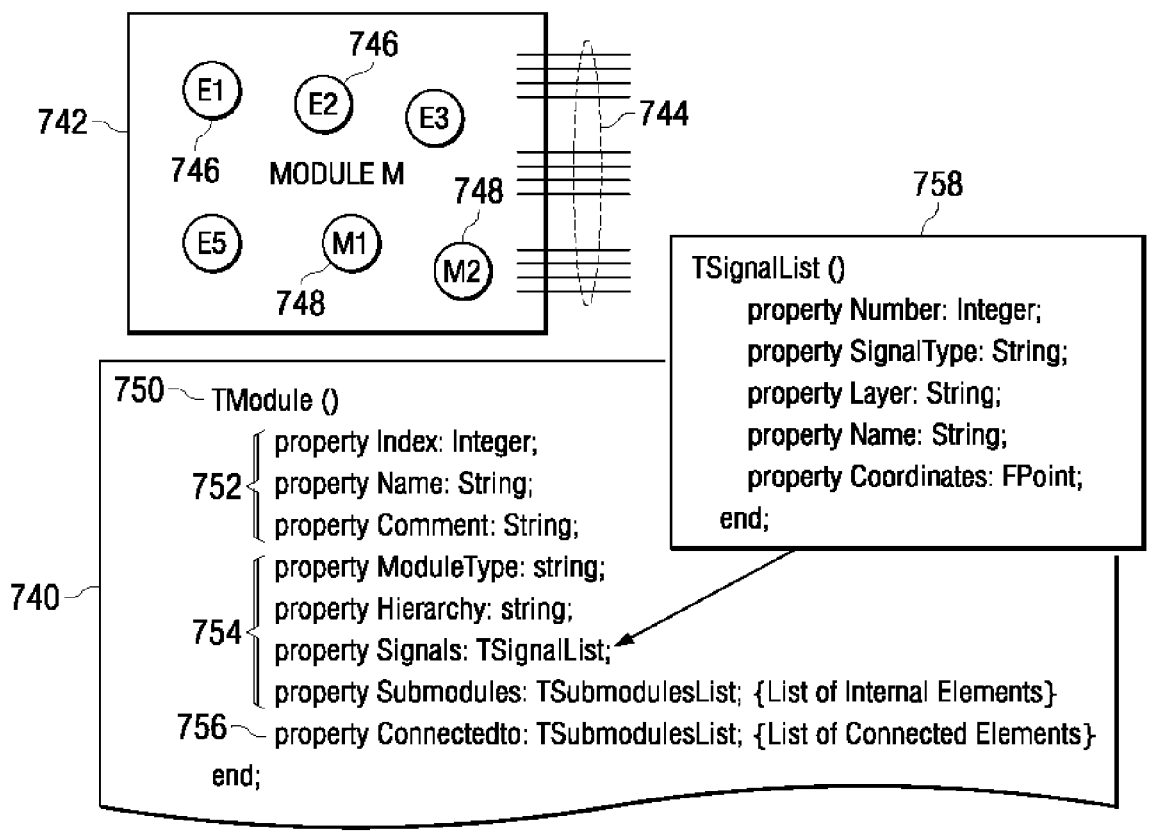

FIG. 31C illustrates a software implementation 740 comprising the module and device library objects of the integrated circuit, based on data extracted from the library tables. In particular, a module 742 of the integrated circuit comprises intermodule signals 744, device library objects 746 and other modules or subblocks 748. As the device library elements 'E' are created for the module, information about them, such as element type, is added to the module description, depending on which hypothesis search or empirical rule was used to create them.

As an example, the software implementation 740 comprises a module description 750 for module 742. Module description 750 contains standard data 752 extracted from standard fields in the module library table, including properties such as index, element name, comments, and the like. Module description 750 also comprises additional data 754 extracted from non-standard XML fields in the module library table, including properties such as module type, hierarchy, signals, internal elements, and the like. Module description 750 also comprises other calculated data 756, including properties such as elements to which the module is connected, and the like. As an example of one of the module properties, the module type property may indicate whether the module is an atomic element, a library element, a logic module, an analog module, or the like. As another example, the signals property comprises a signal list 758, including its own properties such as number, signal type, layer, name, coordinates, and the like.

Figure 32:
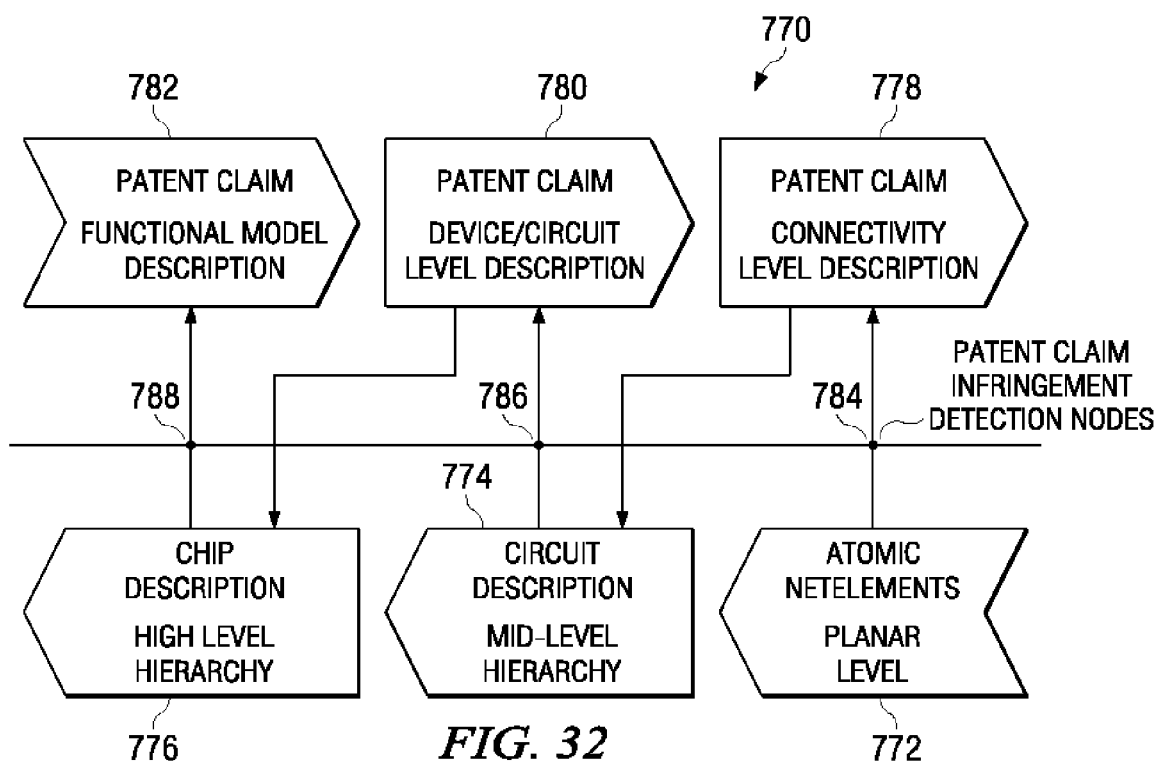
FIG. 32 is a flow chart of a method of comparing a patent claim to various hierarchy level descriptions of an integrated circuit.

FIG. 32 illustrates a flow chart 770 for comparing the planar, extended parameter or mid- or high-level hierarchical netlist descriptions to the claims of a patent or a patent portfolio. Methods of generating a planar netlist containing atomic elements and associated connectivity, as shown in step 772, a mid-level hierarchical netlist or extended parameter netlist, as shown in step 774, and a high-level hierarchical netlist or functional netlist 776 have been previously described hereinabove. Preferably, these netlists are implemented in or converted to a common software language, such as a token-based object oriented language (e.g., a markup language such as XML or the like). Alternatively, a netlist may be obtained from another source, such as a third party, and converted to the common software language.

The claims of a patent may be related to various properties of integrated circuits, such as function, behavior, device structure, circuit structure, connectivity, method of manufacturing, and the like. These claims may be infringed or not infringed by a particular integrated circuit. Because the claims of a patent are written in human language (e.g., English), it can be very time consuming and expensive to compare the human language claims to human-readable but differently formatted materials, such as schematic, block diagram, product description, or other representations of the integrated circuit, let alone to non-human readable objects. The claims of a patent, however, may relate to the same properties of an integrated circuit and at the same hierarchical level as those of a particular software description of the integrated circuit. Accordingly, the properties described by a patent claim in human language may be converted to the same common software language, such as a token-based object oriented language (e.g., a markup language such as XML), as that used by the particular software description.

For example, with reference to FIG. 32, a patent claim written at a low-level, atomic element and connectivity type description may be converted to a connectivity level description in the common software language, as shown in step 778. For example, a patent claim may relate to a specific combination and connectivity of transistors or other atomic elements in a circuit, and this configuration can be expressed and stored in an XML format. A patent claim written at a mid-level, device or circuit type description may be converted to a device/circuit level description in the common software language, as shown in step 780. For example, a patent claim may relate to a specific combination and connectivity of gate-level elements (e.g., NAND gates, NOR gates, etc.), and this configuration can be expressed and stored in an XML format. Similarly, a patent claim written at a high-level, functional type description may be converted to a functional level description in the common software language, as shown in step 782. For example, a patent claim may relate to a specific combination and connectivity of module elements (e.g., ALU, register, etc.) and this configuration can be expressed and stored in an XML format.

Once the patent claim has been converted to the common software language, a computer-implemented algorithm or method may compare the patent claim description to the netlist description of the integrated circuit. For example, the method may search to netlist description for any exact or close, or approximate matches to the patent claim description. For example, with reference to FIG. 32, a comparison may be performed between a patent claim connectivity level description and the planar level netlist of the integrated circuit, as shown in step 786. For another patent claim written at a higher hierarchy level, a comparison may be performed between a patent claim device/circuit level description and the mid-level hierarchy netlist of the integrated circuit, as shown in step 786. For yet another patent claim written at a still higher hierarchy level, a comparison may be performed between a patent claim functional level description and the high-level hierarchy netlist of the integrated circuit, as shown in step 788.

If a match is found at one of the comparison steps, there is a potential infringement of the claim by the integrated circuit, and the method may store the claim description and the relevant portion of the netlist description in a database. A single claim may be compared to a single integrated circuit netlist. Alternatively, the claim may be compared to multiple integrated circuit netlists, or multiple claims from a single or multiple patents may be compared to a single or multiple integrated circuit netlist. A report may be generated illustrating the hits by one or more patent claims of one or more patents, on one or more netlists for one or more integrated circuits. The report may be stored in computer memory, displayed on a monitor, printed on paper, or the like. The automated comparison may provide significant savings of time and expense with respect to manual comparisons of patent claims to integrated circuit representations.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for planar netlist interpretation of an integrated circuit, the method comprising:
   reading the planar netlist of the integrated circuit from a first computer-readable medium, wherein the planar netlist comprises atomic elements of the integrated circuit and nodes between the atomic elements;
   converting, using a computer system, the planar netlist into a graphical description, wherein graph vertices represent the atomic elements, the nodes, or both, and wherein graph edges represent the nodes, the atomic elements, or connections between the atomic elements and the nodes, respectively;
   identifying, using the computer system, combinations of the vertices and edges that match library device elements;
   substituting, using the computer system, the device elements for the respective combinations of the vertices and edges;
   generating, using the computer system, a compressed netlist comprising the device elements and nodes between the device elements; and
   storing the compressed netlist in a second computer-readable medium.

2. The method of claim 1, wherein:
   the identifying further comprises
      determining vertex labels for the atomic elements, wherein the vertex labels comprise element type and distance to nearby atomic elements, and
      identifying identical vertex labels in the graphical description; and
   the substituting further comprises combining the identical vertex labels into combined vertices and assigning new labels to the combined vertices.

3. The method of claim 2, wherein the steps of determining vertex labels, identifying identical vertex labels, and combining the identical vertex labels are repeated for the combined vertices with the new labels.

4. The method of claim 1, further comprising, before the reading the planar netlist:
   generating the planar netlist from layout information extracted from images of successive layers of the integrated circuit; and
   storing the planar netlist on the first computer-readable medium.

5. The method of claim 1, wherein the device elements comprise gate-level elements.

6. The method of claim 1, wherein the compressed netlist is stored in a token-based object oriented language format.

7. The method of claim 6, further comprising, after the storing the compressed netlist:

comparing a patent claim stored in the token-based object oriented language format to elements in the compressed netlist; and generating an indication if there is a match between the patent claim and any of the elements in the compressed netlist.

8. The method of claim 1, wherein the second computer-readable medium is the first computer-readable medium.

9. The method of claim 1, further comprising using one or more of netlist partitioning and hypothesis search functions to generate a hierarchical netlist from the compressed netlist.

10. A computer program product for performing integrated circuit planar netlist interpretation, the computer program product having a non-transitory computer-readable medium with a computer program embodied thereon, the computer program comprising:

computer program code for reading the planar netlist of the integrated circuit from a first computer-readable medium, wherein the planar netlist comprises atomic elements of the integrated circuit and nodes between the atomic elements;

computer program code for converting the planar netlist into a graphical description, wherein graph vertices represent the atomic elements, the nodes, or both, and wherein graph edges represent the nodes, the atomic elements, or connections between the atomic elements and the nodes, respectively;

computer program code for identifying combinations of the vertices and edges that match library device elements;

computer program code for substituting the device elements for the respective combinations of the vertices and edges;

computer program code for generating a compressed netlist comprising the device elements and nodes between the device elements; and computer program code for storing the compressed netlist in a second computer-readable medium.

11. The computer program product of claim 10, wherein:
the computer program code for identifying further comprises
computer program code for determining vertex labels for the atomic elements, wherein the vertex labels comprise element type and distance to nearby atomic elements, and
computer program code for identifying identical vertex labels in the graphical description; and
the computer program code for substituting further comprises computer program code for combining the identical vertex labels into combined vertices and assigning new labels to the combined vertices.

12. The computer program product of claim 11, further comprising computer program code for repeating the computer program code for determining vertex labels, the computer program code for identifying identical vertex labels, and the computer program code for combining the identical vertex labels, for the combined vertices with the new labels.

13. The computer program product of claim 10, further comprising:
computer program code for generating the planar netlist from layout information extracted from images of successive layers of the integrated circuit; and
computer program code for storing the planar netlist on the first computer-readable medium from which the computer program code for reading the planar netlist reads the planar netlist.

14. The computer program product of claim 10, wherein the device elements comprise gate-level elements.

15. The computer program product of claim 10, further comprising computer program code for storing the compressed netlist in a token-based object oriented language format.

16. The computer program product of claim 15, further comprising:
computer program code for comparing a patent claim stored in the token-based object oriented language format to elements in the compressed netlist; and
computer program code for generating an indication if there is a match between the patent claim and any of the elements in the compressed netlist.

17. The computer program product of claim 10, wherein the second computer-readable medium is the first computer-readable medium.

18. The computer program product of claim 10, further comprising computer program code for using one or more of netlist partitioning and hypothesis search functions to generate a hierarchical netlist from the compressed netlist.

19. A computer system comprising:
memory for storing programs, the programs including sequences of instructions;
a data processing unit for executing the programs stored in the memory;
wherein one of the programs stored in the memory is an integrated circuit planar netlist interpretation program, the integrated circuit planar netlist interpretation program including
instructions for reading the planar netlist of the integrated circuit from a first computer-readable medium, wherein the planar netlist comprises atomic elements of the integrated circuit and nodes between the atomic elements;
instructions for converting the planar netlist into a graphical description, wherein graph vertices represent the atomic elements, the nodes, or both, and wherein graph edges represent the nodes, the atomic elements, or connections between the atomic elements and the nodes, respectively;
instructions for identifying combinations of the vertices and edges that match library device elements;
instructions for substituting the device elements for the respective combinations of the vertices and edges;
instructions for generating a compressed netlist comprising the device elements and nodes between the device elements; and
instructions for storing the compressed netlist in a second computer-readable medium.

20. The computer system of claim 19, wherein:
the instructions for identifying further comprises
instructions for determining vertex labels for the atomic elements, wherein the vertex labels comprise element type and distance to nearby atomic elements, and
instructions for identifying identical vertex labels in the graphical description; and
the instructions for substituting further comprises instructions for combining the identical vertex labels into combined vertices and assigning new labels to the combined vertices.

21. The computer system of claim 20, further comprising instructions for repeating the instructions for determining vertex labels, the instructions for identifying identical vertex labels, and the instructions for combining the identical vertex labels, for the combined vertices with the new labels.

22. The computer system of claim 19, further comprising:

instructions for generating the planar netlist from layout information extracted from images of successive layers of the integrated circuit; and instructions for storing the planar netlist on the first computer-readable medium from which the instructions for reading the planar netlist reads the planar netlist.

23. The computer system of claim 19, wherein the device elements comprise gate-level elements.

24. The computer system of claim 19, further comprising instructions for storing the compressed netlist in a token-based object oriented language format.

25. The computer system of claim 24, further comprising:

instructions for comparing a patent claim stored in the token-based object oriented language format to elements in the compressed netlist; and instructions for generating an indication if there is a match between the patent claim and any of the elements in the compressed netlist.

26. The computer system of claim 19, wherein the second computer-readable medium is the first computer-readable medium.

27. The computer system of claim 19, further comprising instructions for using one or more of netlist partitioning and hypothesis search functions to generate a hierarchical netlist from the compressed netlist.

\* \* \* \* \*